United States Patent [19]
Nishiyama et al.

[11] Patent Number: 5,519,630
[45] Date of Patent: May 21, 1996

[54] LSI AUTOMATED DESIGN SYSTEM

[75] Inventors: Tamotsu Nishiyama, Osaka; Noriko Matsumoto, Kyoto, both of Japan

[73] Assignee: Matsushita Electric Industrial Co., Ltd., Osaka, Japan

[21] Appl. No.: 210,468

[22] Filed: Mar. 21, 1994

Related U.S. Application Data

[63] Continuation-in-part of Ser. No. 112,122, Aug. 26, 1993.

[30] Foreign Application Priority Data

Mar. 22, 1993 [JP] Japan ................................ 5-061628

[51] Int. Cl.⁶ .................................................. G06F 17/50
[52] U.S. Cl. .................................... 364/490; 364/489
[58] Field of Search ................................ 364/488, 489, 364/490

[56] References Cited

U.S. PATENT DOCUMENTS

| | | | |
|---|---|---|---|
| 4,638,442 | 1/1987 | Bryant et al. | 364/489 |
| 4,964,056 | 10/1990 | Bekki et al. | 364/488 |
| 5,038,294 | 8/1991 | Arakawa et al. | 364/491 |
| 5,164,908 | 11/1992 | Igarashi | 364/491 |
| 5,212,650 | 5/1993 | Hooper et al. | 364/489 |
| 5,222,029 | 6/1993 | Hooper et al. | 364/489 |
| 5,359,539 | 10/1994 | Matsumoto et al. | 364/489 |
| 5,371,683 | 12/1994 | Fukazawa et al. | 364/489 |

FOREIGN PATENT DOCUMENTS

4-40564  2/1992  Japan .

*Primary Examiner*—Vincent N. Trans
*Attorney, Agent, or Firm*—Willian Brinks Hofer Gilson & Lione

[57] ABSTRACT

Together with circuit data of circuit elements, there is stored, in a memory device, external specification information of each of the circuit elements, the information including (i) function information of each of the terminals of the circuit elements and (ii) selection information representing a wiring condition for each of the terminals. When the element arrangement and external specification information of a circuit to be designed, are entered, pieces of external specification information are compared with one another to obtain pairs of wiring candidates of a circuit which connects, to one another, the circuit elements of the circuit to be designed. Based on the pairs of wiring candidates, there is generated wiring information which satisfies each wiring condition. Based on the pieces of wiring information thus generated, there are automatically generated circuit data of the circuit to be designed.

9 Claims, 48 Drawing Sheets

F I G. 3
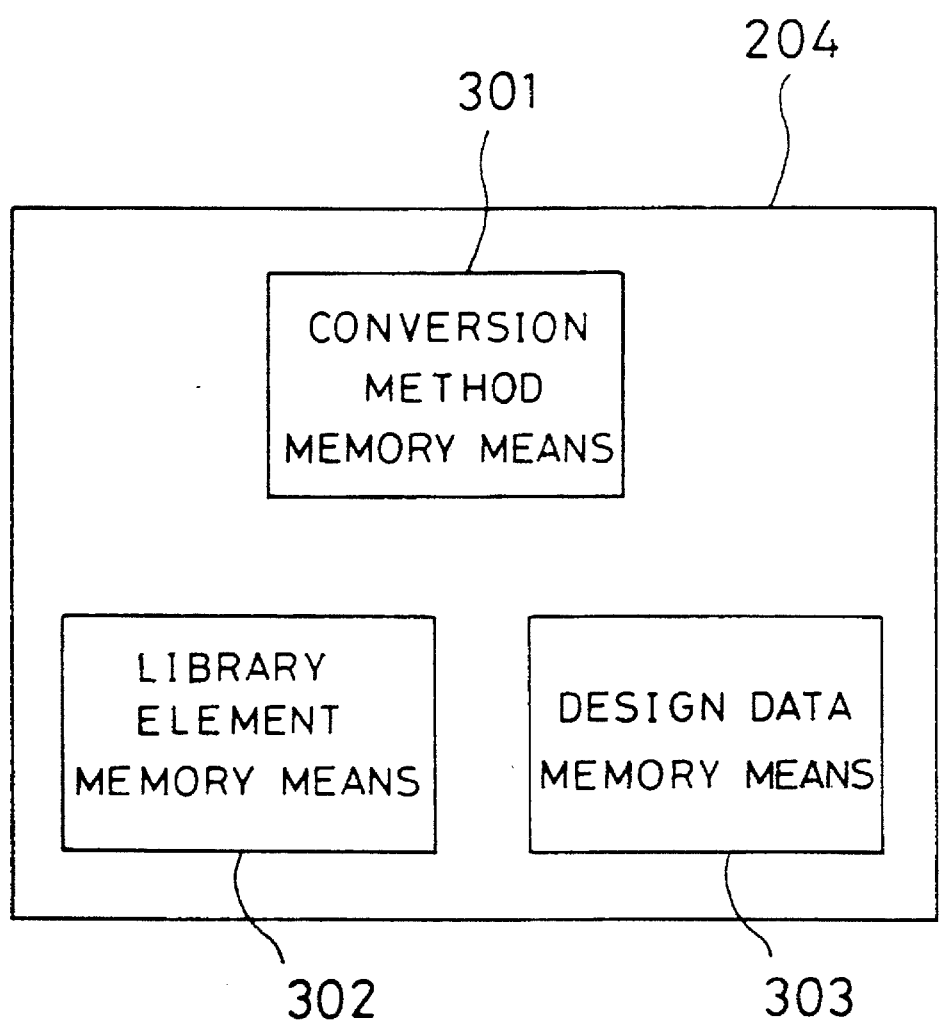

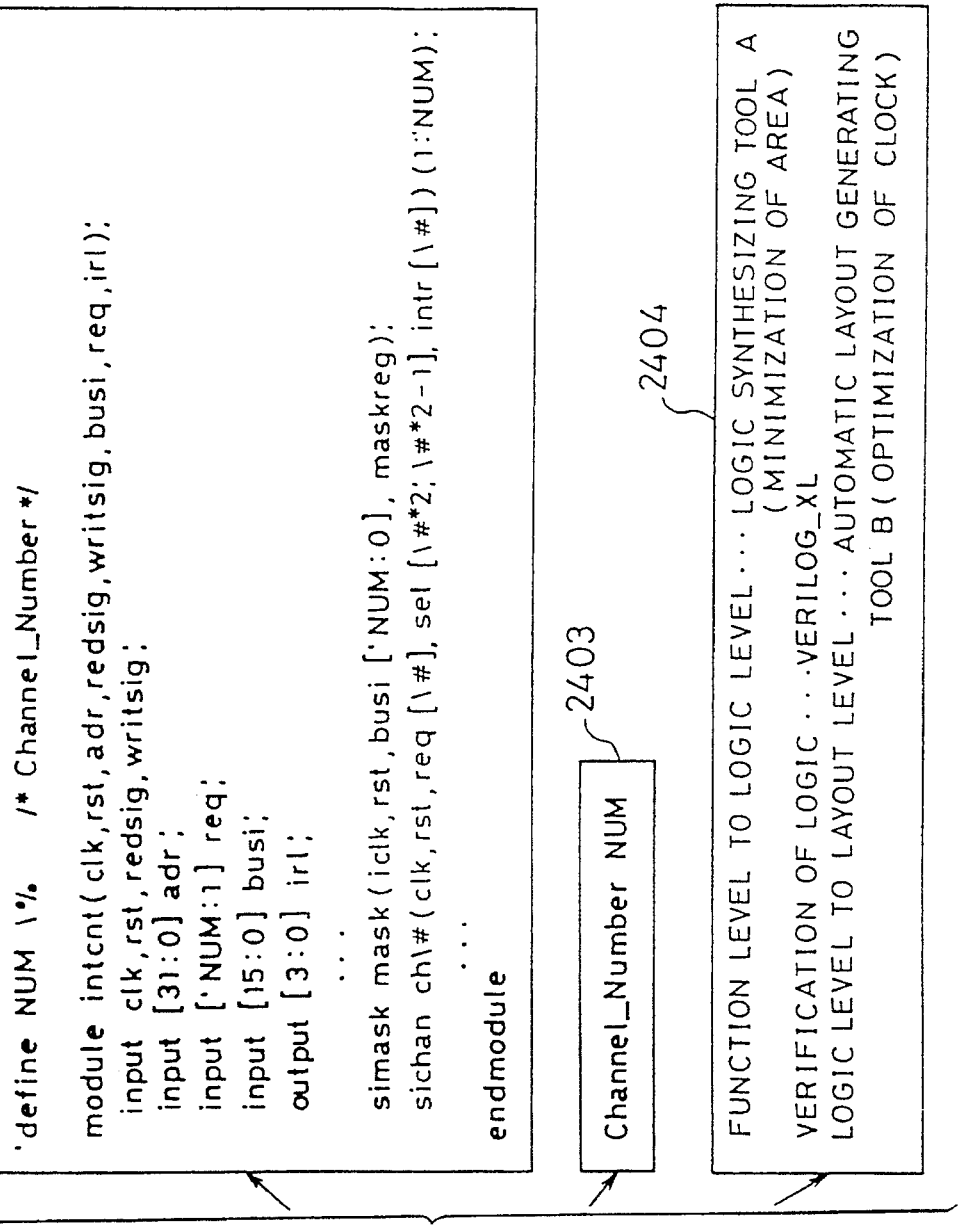

FIG. 24a-2

```
`define NUM \%     /* Channel_Number */ module intcnt(clk,rst,adr,redsig,writsig,busi,req,irl);
input clk,rst,redsig,writsig;
input [31:0] adr;
input [`NUM:1] req;
input [15:0] busi;
output [3:0] irl;
  ...
simask mask(iclk,rst,busi [`NUM:0], maskreg);
sichan ch\#(clk,rst,req [\#], sel [\#*2:\#*2-1], intr [\#]) (1:`NUM);
  ...
endmodule
```

Channel_Number NUM

FUNCTION LEVEL TO LOGIC LEVEL...LOGIC SYNTHESIZING TOOL A
                                (MINIMIZATION OF AREA)
VERIFICATION OF LOGIC...VERILOG_XL
LOGIC LEVEL TO LAYOUT LEVEL...AUTOMATIC LAYOUT GENERATING
                              TOOL B (OPTIMIZATION OF CLOCK)

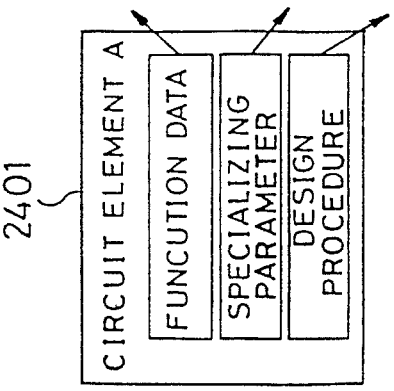

FIG. 24a-1

CIRCUIT ELEMENT A
| FUNCUTION DATA |
| SPECIALIZING PARAMETER |
| DESIGN PROCEDURE |

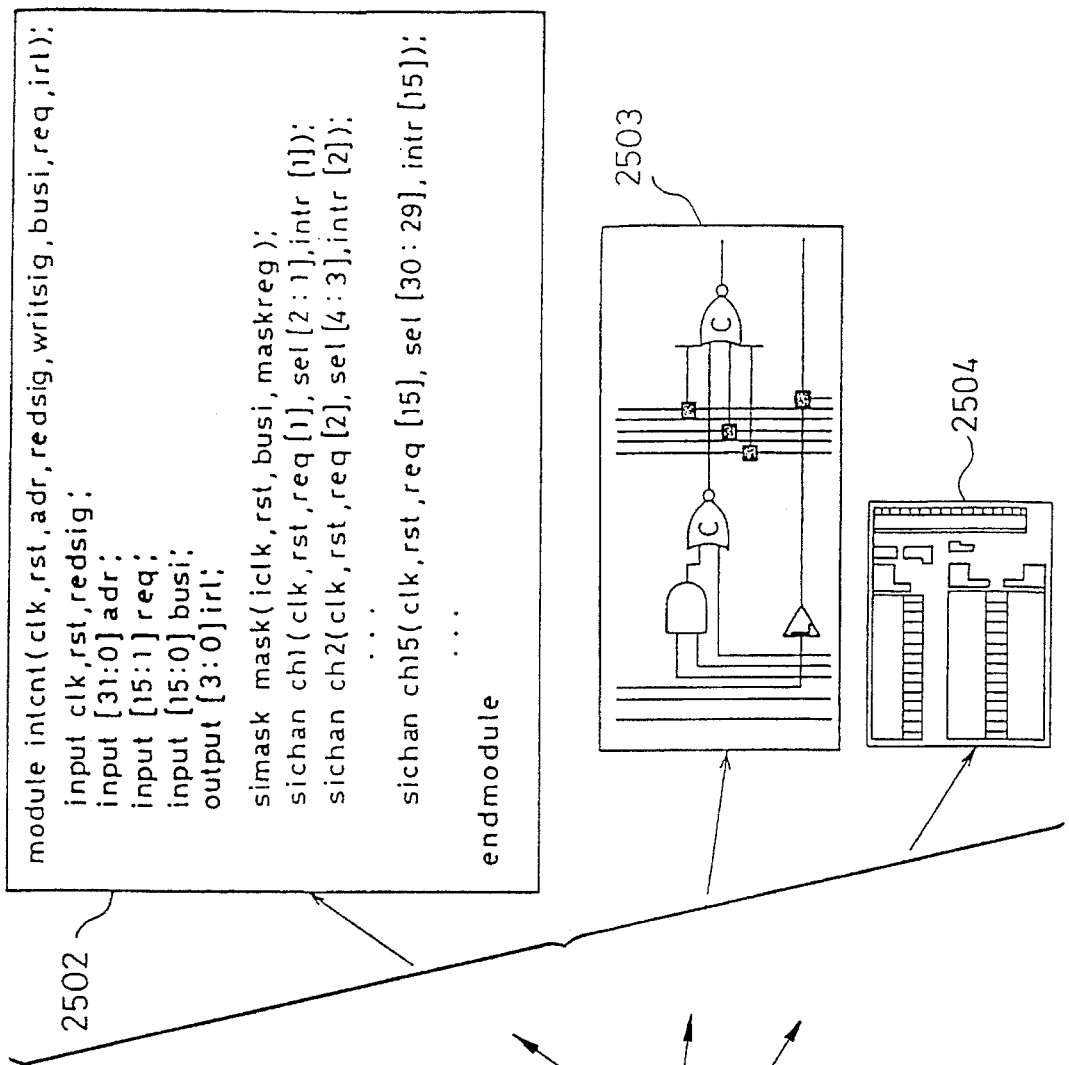

FIG. 30

| CODE NO. | NON-CONNECTION TERMINAL PROCESSING SELECTION INFORMATION |
|---|---|
| 0 | INPUT TERMINAL OR INPUT/OUTPUT TERMINAL TO BE LEFT AS IT IS AND OUTPUT TERMINAL TO BE GROUNDED |
| 1 | UNCONDITIONALLY GROUNDED |
| 2 | UNCONDITIONALLY CONNECTED TO THE POWER SOURCE |
| 3 | UNCONDITIONALLY LEFT AS IT IS |

FIG. 31

| CODE NO. | PLURAL TERMINAL SELECTION INFORMATION |
|---|---|
| 0 | ALL TO BE CONNECTED |
| 1 | ONLY ONE TO BE CONNECTED |
| 2 | UNCONDITIONALLY NOT CONNECTED |
| 3 | MUX INSERTING PROCESSING |

```
(min 0 (3:0),   data 0,    0,  0,  1)
(min 1 (1:0),   func 0,    0,  0,  1)
(mclk,          clock,     0,  0,  0)
(mout 0(3:0),   data 1,    1,  0,  3)
(mout 1(3:0),   data 2,    1,  0,  3)
(mout 2(1:0),   data 3,    1,  3,  3)
```

FIG. 39a

```
(in  0 [3 : 0],  data 0,   0,  0,  1)
(in  1 [1 : 0],  func 0,   0,  0,  1)
(clk,            clock ,   0,  0,  0)
(out 0 [3 : 0],  data 1,   1,  0,  1)
(out 1 [3 : 0],  func 1,   1,  0,  3)
```

FIG. 39b

```
(in  0 [3 : 0],  func 1,   0,  0,  1)
(in  1        ,  clock ,   0,  0,  0)
(out 0 [3 : 0],  data 2,   1,  0,  1)
(out 1 [1 : 0],  func 2,   1,  0,  3)
```

FIG. 39c

```
(in  0        ,  clock,    0,  0,  0)
(in  1 [3 : 0],  func 1,   0,  0,  1)
(in  2 [1 : 0],  func 2,   0,  0,  1)
(out 0 [3 : 0],  data 3,   1,  0,  1)
(out 1 [1 : 0],  func 3,   1,  3,  3)
```

FIG. 40

```
module M (min 0, min 1, mclk,
          mout 0, mout 1, mout 2);
    input  [3:0]  min 0 ;
    input  [1:0]  min 1 ;
    input         mclk ;
    output [3:0]  mout 0;
    output [3:0]  mout 1 ;
    output [1:0]  mout 2;
    wire   [3:0]  a out 1 _ bin 0 ;
    wire   [1:0]  b out 1 _ cin 1 ;
    wire   [1:0]  c out 2_ f   ;

P1 A (.in 0 (min 0),.in 1 (min 1), .clk (mclk),
          .out 0 (mout 0),.out1 (aout 1_bin 0));

P2 B (.in 0 (aout 1_bin 0), .in 1 (mclk),
          .out 0 (mout 1), .out 1 (bout 1 _ cin 1));

P3 C (.in 0 (mclk), .in1 (aout 1_bin 0),
          .in 2 (bout 1 _cin 1),
          .out 0 (mout 2 ), .out 1 (cout 2 _f));
end module
```

FIG. 42
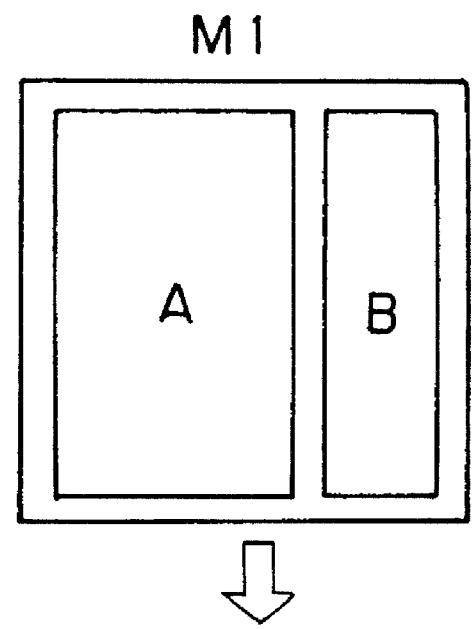
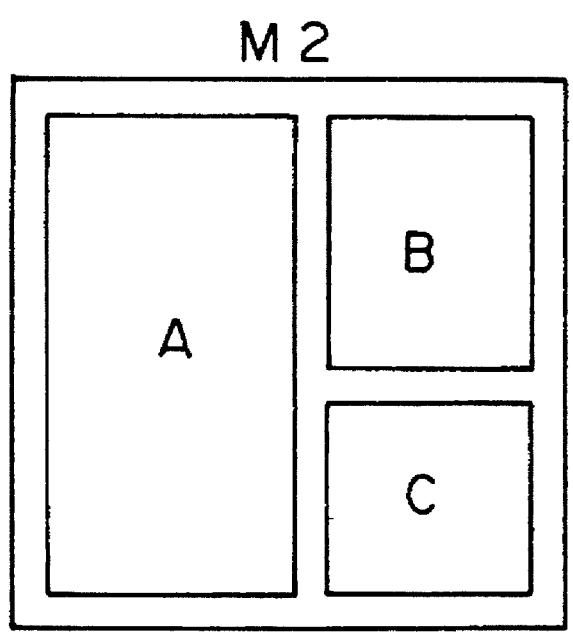

```
module test data;

reg [3:0] in;
        wire [1:0] out 1;
        wire [1:0] out 2;

initial
    begin
            in = 4'b 0000 ;
    #10     in = 4'b 1111 ;
    #10     in = 4'b 0111 ;
    #10     in = 4'b 1001 ;
    #10     in = 4'b 1000 ;
    #10     in = 4'b 0001 ;
    #10     in = 4'b 0100 ;
    #10     in = 4'b 1100 ;
    #10     in = 4'b 0101 ;
    #10     in = 4'b 1011 ;
    #10     in = 4'b 0110 ;

end
initial
    $ monitor ($ time ,," in =%b  out1=%b  out 2 =%b,
                            in, out1, out 2 ) ;

end module
```

LSI AUTOMATED DESIGN SYSTEM

This application is a Continuation-In-Part of pending application Ser. No. 08/112,122 filed Aug. 26, 1993.

BACKGROUND OF THE INVENTION

The present invention relates to an LSI automated design system capable of effectively utilizing design property.

To achieve an LSI automated design system, a variety of CAD tools have been recently developed. However, when designing a circuit with the use of a plurality of CAD tools, it is required to prepare a dedicated converter for forwarding a design work since such CAD tools lack data conformity. Further, in order to use CAD tools in the respective optimum manners, it is required to know thoroughly a method of invoking each of the tools and interfaces among the tools. Thus, it disadvantageously takes much time to use CAD tools.

As means for solving such a problem, there has been developed an integration system for LSI designing CAD tools which is called a framework. This framework has, in addition to a function of integrating CAD tools, a variety of functions including a function of managing design procedures (design processes) to navigate the execution of design tools according to a design methodology, a function of managing design data to be entered in and supplied from the design tools, a design data edition number managing function of managing the version and revision of design data groups.

An example of the framework above-mentioned is shown in "A Process Scheduling Technique and an Interface Builder for CAD Tool Integration" by Toshiaki MIYAZAKI et al, Automated Design/Research Report No. 56-1, 1991, pp 1 to 8. In this example, the design procedures are managed by using a graphic interface called a design flow-chart editor. That is, the design procedures can be managed based on the relation between CAD tools set by the design flow-chart editor and input/output data thereof. Further, data designed by a designer can be readily utilized by another designer.

To efficiently design a high-performance LSI, it is important to flexibly reuse existing design data to improve the design efficiency. As above-mentioned, the framework achieves an LSI automated design by managing design data and design procedures. However, an actual LSI is formed by combination of a variety of circuits and there is the optimum design procedure for each of the circuits. Accordingly, it is difficult to obtain a circuit satisfying a desired performance, merely by forwarding a design work with the application of design procedures previously prepared in the framework. In such an automated design with the reuse of existing design data using the framework, it is difficult to automatically generate a circuit satisfying a required performance since these existing design data to be reused are not related to information relating to the optimum design procedures for the design data.

As a conventional art relating to LSI automated design, there is known a method in which logic circuit modules, each having a function, are previously stored, as wiring information among logic gates, in a develop data storage of a computer such that, when required during logic design, suitable logic circuit modules are retrieved from the develop data storage, thereby to generate a logic circuit of the logic gate level. Such a conventional art can be used for generating functional modules having low-level functions such as a register, a counter, an incrementer or the like, but cannot be used for generating general functional modules having sophisticated functions. Further, it is required to enter a combination of functional modules in the form of a functional diagram with attention placed on the wiring of module terminals. Such a conventional art lacks flexibility in that a reuse design with the use of already designed circuit data, can be effected only on functional modules such as so-called soft-macro or hard-macro of which logics or layouts are fixed.

Prior art as an example of a method of solving the problem above-mentioned, is disclosed in U.S. Pat. No. 4,964,056. Such a prior art is arranged such that functional modules having sophisticated functions such as a control module for controlling the execution of a micro-program, are flexibly reused for designing. More specifically, elements forming functional modules and information about the operations of the modules are previously stored in a computer such that there is automatically synthesized a logic circuit of functional modules including an irregular logic circuit so arranged as to satisfy the demand for the functional modules from the user or logic designer.

Even with such a prior art, the scope of circuit elements to be used for reuse design cannot be extended to all control modules, but can be extended only to portions thereof. In this connection, such a prior art is not effective in designing LSIs having sophisticated functions such as CPU, FPU and the like in a micro-processor or a micro-controller. More specifically, such a prior art cannot be applied to a circuit in which circuit elements lack versatility in operational models, causing the inside states of the functional modules to be complicated.

DISCLOSURE OF THE INVENTION

It is an object of the present invention to achieve an automated design of an LSI satisfying a required performance and a required function, with the reuse of existing design data.

To achieve the object above-mentioned, the present invention is arranged such that existing design data together with design procedures thereof are collectively managed in the form of elements, which can be utilized in a reuse-type design.

More specifically, the LSI automated design system according to the present invention comprises: memory means for collectively managing and storing, in the form of elements, the real data of existing design data and managing information thereof; means for entering an element arrangement for carrying out a function design of a desired circuit with the use of elements stored in the memory means; means for combining the elements selected by the entering means to synthesize an element which satisfies a connection relation among the selected elements; and means for converting the real data of the elements used in the design, into data on a target level with the use of the optimum tools according to information relating to the design procedures of the elements. There are instances where a selected element is designed in a rank structure. In such a case, when a target level is set to an upper-rank element of the selected element, the same target level is also set to lower-rank elements forming the selected element. Accordingly, the real data of each element is converted into the target-level data based on the information relating to the design procedure of the element.

According to the present invention, an LSI design can be automated from the stage of a function design as set forth below.

The memory means contains elements generated from existing design data. Each of the elements has, in addition to the real data of the design data, information relating to the management of the design data, information relating to the design procedure, information relating to the rank structure of the element, information relating to the layout shape of the element, and the like.

Elements having functions required for achieving a desired function, are selected from the elements stored in the memory means. When each of the elements thus selected has general-purpose design data, the design data are specialized, thus generating design data of which functions have been determined, the design data thus generated being subjected to the subsequent design processing. By combining such design data, a function design is to be executed. At this time, each design data is represented in the form of a symbol which indicates a layout shape. By forwarding the design while disposing such symbols with the final floor plan taken into consideration, a design satisfying the floor plan can be conducted from the stage of a function design.

Then, a design data satisfying the connection relation among the respective design data forming the LSI, is synthesized based on information relating to input/output of the respective design data. Thus, merely by combining necessary functions, the design of an LSI function can be automated in its entirety.

Based on the results of function design, the LSI design is further forwarded. Information relating to design procedure and other information are stored in each of the elements for which design data have been generated, and design processings are to be executed on the design data according to such information. When a target level is set to the design data, each of the design data selects the optimum tool according to its design procedure, and the tool thus selected is operated on the design data by the optimum method, thus automatically generating design data on the target level.

There are instances where a design data is designed in a rank structure. In such a case, when a target level is set to an upper-rank data of such a design data, the same target level is also set to lower-rank design data forming the first-mentioned design data, according to information relating to the rank structure of the element for which the upper-rank data has been generated. Accordingly, each design data is converted into data on the target level based on the design procedure of each design data.

As discussed in the foregoing, each of the elements is provided with information relating to the design procedure, information relating to the rank structure and the like. Accordingly, merely by setting once a target level to a specified design data, the target level can be set to all design data forming the specified data. Further, even though design data are to be converted according to different conversion processes, the design data can be converted without no special attention paid on the design procedures.

Thus, the present invention is arranged such that, by reusing existing design data, a design can be automated from the stage of a function design and the number of steps of a function design can be reduced, such reduction in step number being conventionally difficult. Further, since each element has information relating to the optimum design procedure, it is possible to operate a CAD tool on each element in the optimum manner, thus enabling a high-quality design to be carried out.

To extend the applicability of reuse design to LSIs having sophisticated functions, the present invention is arranged such that the circuit data of existing circuit elements are collectively managed together with external specification information thereof such that the circuit elements are used for reuse design.

More specifically, an LSI automated design system according to a further embodiment of the present invention, is arranged such that together with the circuit data of circuit elements, function information relating to input terminals and output terminals thereof, is previously stored, as external specification information of the circuit elements, in a memory device, so that when the element arrangement and external specification information of a circuit to be designed are entered, wiring information for the circuit elements is automatically generated to generate circuit data of the circuit to be designed including the wiring information.

BRIEF DESCRIPTION OF THE DRAWINGS

FIG. 3 is a view illustrating the inner arrangement of a memory device in FIG. 2;

FIG. 5 is a view illustrating the detail arrangement of circuit arrangement entering means in FIG. 1a;

FIG. 12 is a view illustrating the detail arrangement of a library element specializing means in FIG. 1a;

FIG. 14 is a view illustrating an example of designing an element layout by the circuit arrangement entering means in FIG. 1a;

FIG. 24a is a view illustrating a specific example of an element stored in the library element memory means in the LSI automated de sign system in FIG. 15a and FIG. 15b;

FIG. 24b is a view illustrating a specific example of a design object generated in the function design device in FIG. 15a;

FIG. 24c is a view illustrating a specific example of the final design object as converted by the design data converting device in FIG. 15b;

FIG. 30 is a view illustrating the meaning of each code number of the non-connection terminal processing selection information in FIG. 28;

FIG. 31 is a view illustrating the meaning of each code number of the plural terminal selection information in FIG. 28;

FIG. 38a is a view illustrating a specific example of external specification information of a circuit to be designed by the LSI automated design system in FIG. 25;

FIG. 38b is a view illustrating an example of the element arrangement of the circuit to be designed shown in FIG. 38a;

FIG. 39a to FIG. 39c are views each illustrating a specific example of the external specification information of each of three circuit elements in FIG. 38b;

FIG. 40 is a view of the generation result of a circuit which connects, to one another, the three circuit elements in FIG. 39a to FIG. 39c;

FIG. 42 is a view of an example of element synthesis with an already designed circuit utilized;

FIG. 45a is a view of a specific example of a circuit to be subjected to a circuit testing (verifying) processing in the LSI automated design system in FIG. 44; and FIG. 45b is a view of a specific example of a test model for a circuit to be designed which has been generated by the LSI automated design system in FIG. 44, the test model being applied to the circuit shown in FIG. 45a.

DETAILED DESCRIPTION OF PREFERRED EMBODIMENTS

Figure 1A:
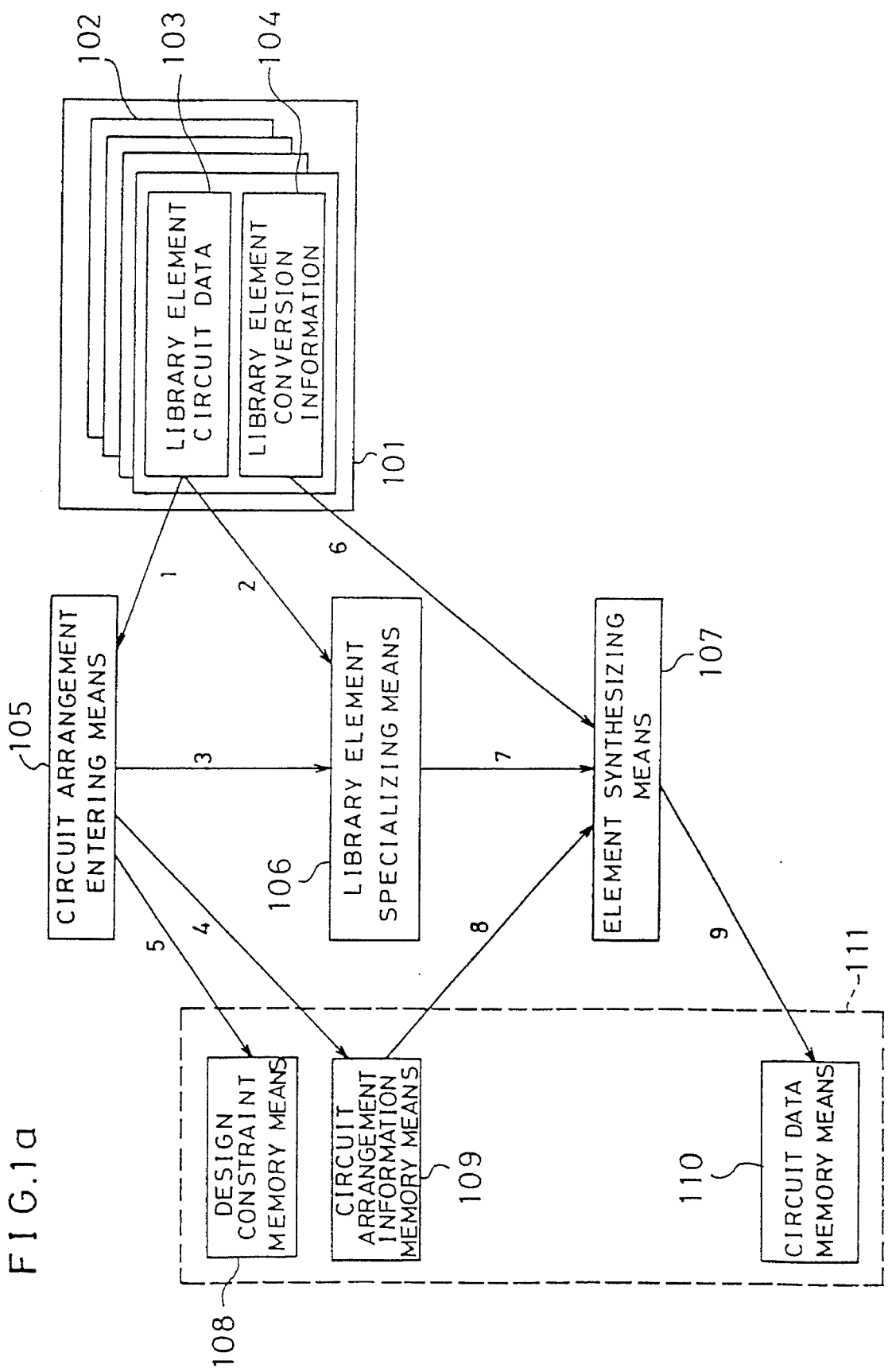
FIG. 1a is a view illustrating the arrangement of a function design device in an LSI automated design system according to an embodiment of the present invention.
Figure 1B:
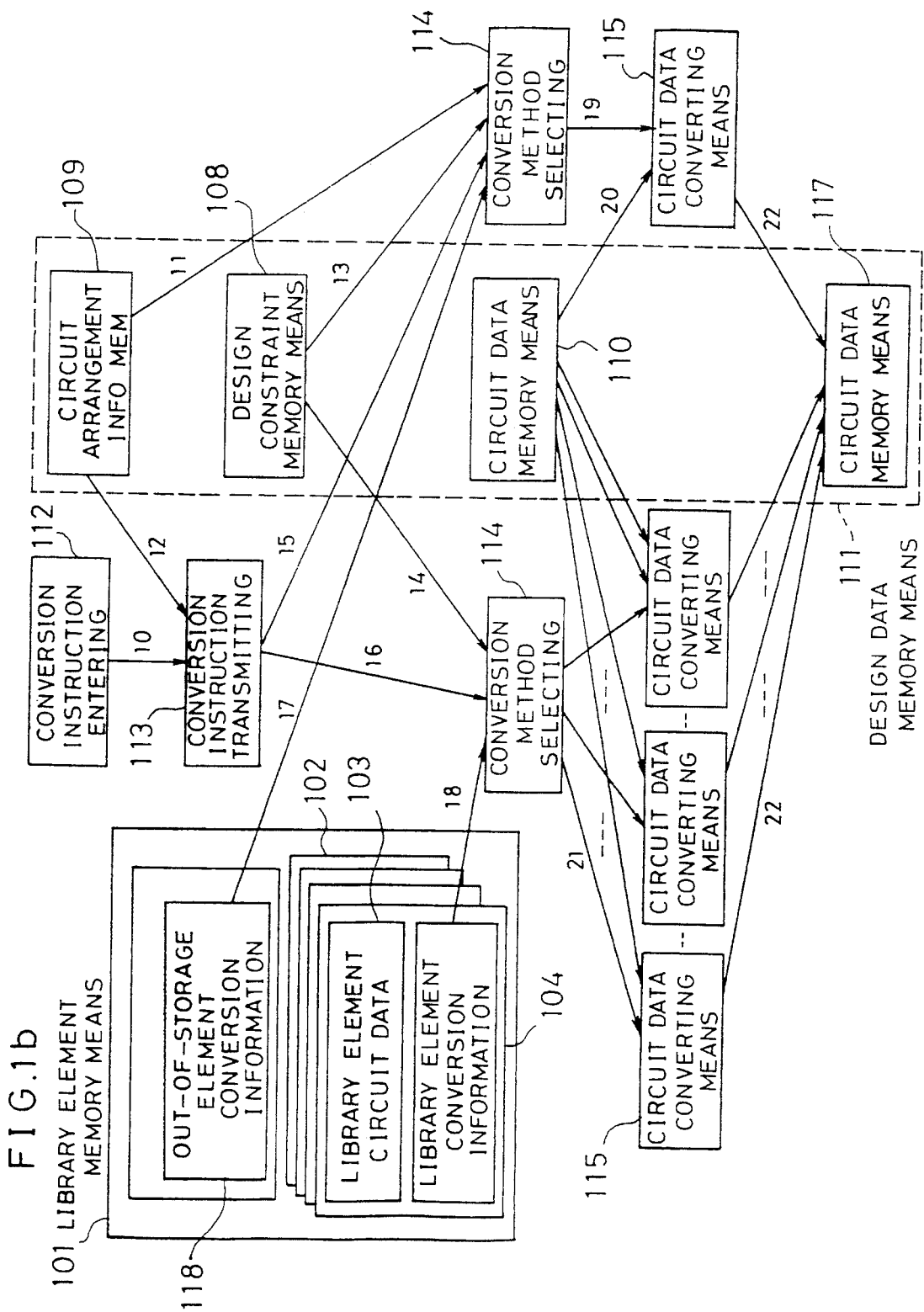
FIG. 1b is a view illustrating the arrangement of a design data converting device in the LSI automated design system according to the embodiment of the present invention.

FIG. 1a and FIG. 1b are views illustrating the arrangement of an LSI automated design system according to an embodiment of the present invention. FIG. 1a shows a function design portion for achieving the desired function of a circuit using elements stored in a library, and FIG. 1b shows a design data converting portion for converting a circuit of which function design has been complete, into circuit data on the finally required level.

In FIG. 1a, library element memory means 101 has a memory area 102 having areas respectively prepared for elements. The memory area 102 has (i) a library element circuit data memory 103 for storing element names, circuit data, function determining parameters, and information relating to the circuit arrangements of elements, and (ii) a library element conversion information memory 104 for storing information relating to design procedures for obtaining an optimum circuit, such as tools to be used, the order in which the tools are used, the conditions under which the tools are executed, and the like.

Figure 9A:
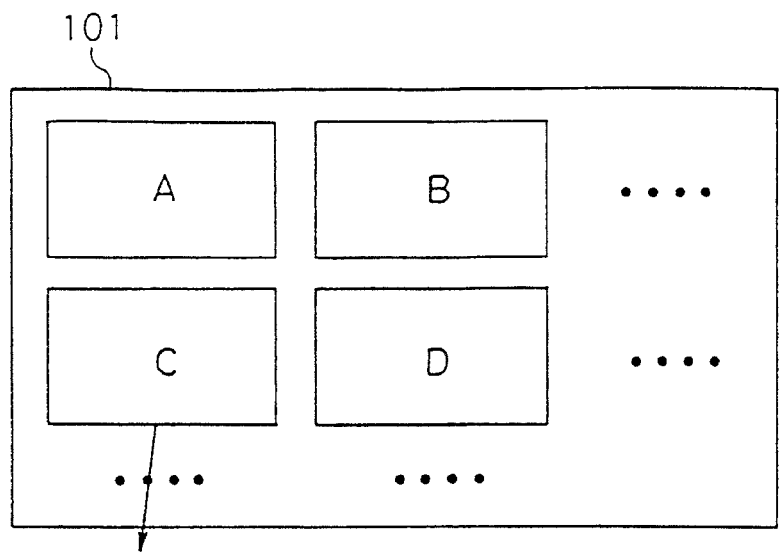
FIG. 9 is a view illustrating an element storing method in a library element memory means in the LSI automated design system in FIG. 1a and FIG. 1b.
Figure 9B:
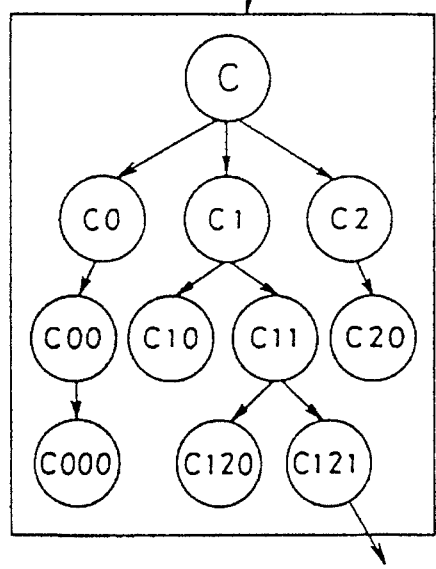
Figure 9C:
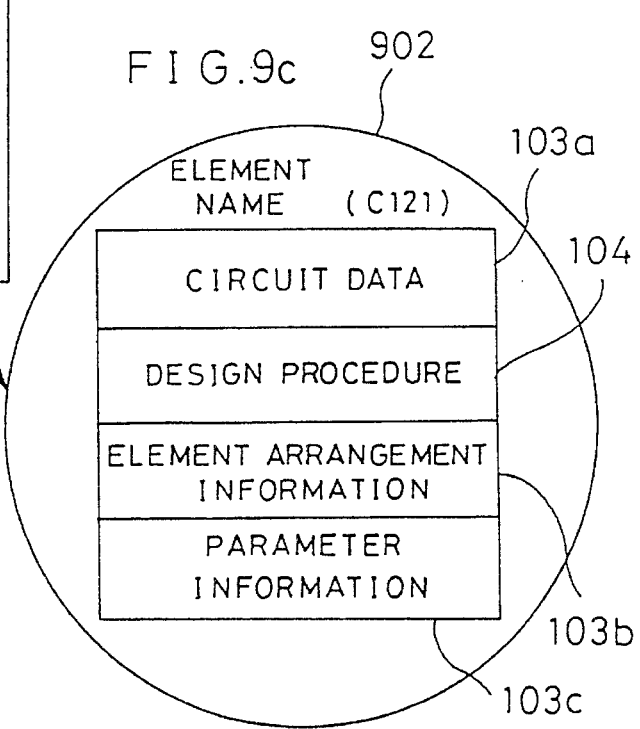

FIG. 9 shows an example of a method of storing elements in the library element memory means 101. In the library element memory means 101, there are sets of elements classified by function. In a set, each of A, B, C, D, ... itself is a set of elements having a specific function. For example, each of A, B, C, D is a set of elements having a function serving as a CPU, a RAM, a ROM, a timer or the like. An actual circuit design can be carried out with the use of elements thus classified by function.

In FIG. 9, a reference numeral 901 shows an example of a method of storing elements forming each element set. In this storing method, as the function of each element becomes more detailed, such element is stored in a lower rank. More specifically, as the function of each element is more specified, such an element is stored in a lower rank. An element on a lower rank, succeeds to all the functions of elements on upper ranks. Thus, by storing elements as succeeding to the functions of upper-rank elements, the retrieval of elements to be used at the design time, can be carried out at a higher speed. In FIG. 9, there is shown an example of an element 902 which has, in addition to a circuit data 103a, a variety of pieces of information required for a design such as information relating to a design procedure 104, information relating to the element arrangement 103b and information relating to parameters for determining the function of the element 103c. Accordingly, merely by giving the same conversion instruction to different elements, different design procedures can be respectively applied to the elements, so that the design can be automatically forwarded.

The following will discuss a method of designing a circuit having a predetermined function (a function design method) using elements stored in the library element memory means 101.

As shown in FIG. 1a, the library element circuit data memory 103 sends the lists of element names, information relating to the arrangement of each element and information relating to parameters for determining the function of each element, to circuit arrangement entering means (element arrangement entering means) 105 through a signal line 1. Based on the information thus sent, the circuit arrangement entering means 105 selects elements required for achieving a desired circuit, and sets information for determining a function to the parameter information of each of the elements thus selected. Also entered to the circuit arrangement entering means 105 is information relating to design constraints such as working frequency, circuit area and the like required for each element. Also, as to the layout of the elements, disposition places are specified with the floor plan taken into consideration. Out of the information thus set, the information relating to design constraints is stored in design constraint memory means 108 through a signal line 5, while the information relating to the names of selected elements and the information relating to the disposition places of the elements are stored in circuit arrangement information memory means 109 through a signal line 4. With the processings above-mentioned, there is finished setting the information required for achieving a desired circuit using the present system.

Figure 14:
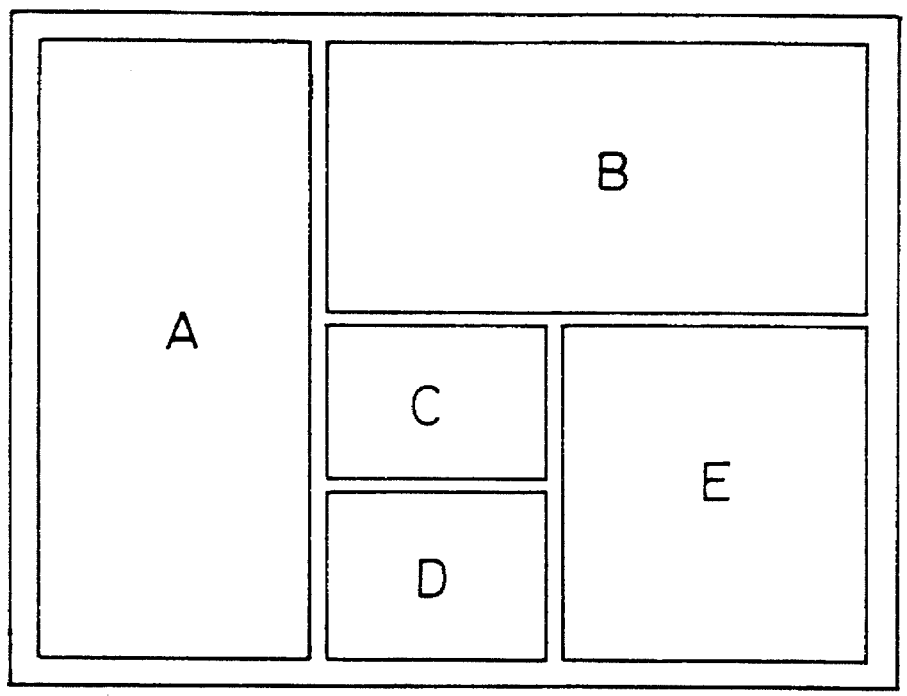

FIG. 14 shows a design example of element layout specified in the circuit arrangement entering means 105. Each of A, B, C, D, E is an element having a specific function. The outer frame represents the contour of the LSI to be formed at the time when the design thereof will be actually finished. The disposition of each element is related to floor plan information of each element in an actual design. The size of each element in FIG. 14 is related, as it is, to the area of each element on the LSI. It is therefore possible to estimate the area of the LSI.

By library element specializing means (design data specializing means) 106, the design data of general-purpose elements are to be converted into circuit data of which functions have been determined. Here, based on information relating to each of the names of elements forming the circuit sent through a signal line 3, a circuit data corresponding to each of the elements is taken out from the library element circuit data memory 103 through a signal line 2, and the circuit data thus taken out is converted, based on the element function determining information sent through the signal line 3, into a circuit data of which function has been specialized. Such function specialization of the circuit data of a library element, is carried out on all the elements forming the circuit.

By element synthesizing means 107, there is to be generated a circuit element which satisfies the connection relation among all the elements forming the circuit. Here, sent to the element synthesizing means 107 are (i) information relating to the elements forming the circuit through a signal line 8, (ii) the specialized circuit data generated by the library element specializing means 106 through a signal line 7 and (iii) information relating to a method of converting the circuit data in order to unify the levels of the circuit data, through a signal line 6. Then, the element synthesizing means 107 retrieves information relating to input/output of all the elements forming the circuit, extracts the connection relation among all the circuit data based on the information thus retrieved, and generates a circuit element satisfying the connection relation. Then, the specialized circuit data sent through the signal line 7 and the circuit data generated by the element synthesizing means 107 are stored in circuit data memory means 110 through a signal line 9. With the processings above-mentioned, there are finished the function design of the desired circuit and the specializing processing of the circuit data. All the circuit data memory means 110, the design constraint memory means 108 and the circuit arrangement information memory means 109 may be made in the form of single memory means, i.e., design data memory means 111.

In the design data converting portion in FIG. 1b, there is to be executed a processing of converting the circuit of which function design has been complete, to circuit data on the finally required level (target level).

In conversion instruction entering means 112, there are entered a conversion instruction and the names of elements to which the conversion instruction is to be given. Then, the conversion instruction which specifies a target level of conversion, and the element names are sent to conversion instruction transmitting means 113 through a signal line 10.

Based on the specified element names sent through the signal line 10 and information relating to the circuit arrangement sent from the circuit arrangement information memory means 109 through a signal line 12, the conversion instruction transmitting means 113 retrieves all lower-rank elements forming each of the specified elements. Then, the conversion instruction transmitting means 113 transmits the names of all the elements thus retrieved and the conversion instruction sent through the signal line 10, to conversion method selecting means 114 through a signal line 16. As to elements which have not been stored in the library element memory means 101, the conversion instruction and the names of such elements are sent to the conversion method selecting means 114 through a signal line 15.

The conversion method selecting means 114 which has received the conversion instruction and the element names through the signal line 15, then receives (i) the information relating to the layout positions of the elements from the circuit arrangement information memory means 109 through a signal line 11, (ii) the information relating to design constraints from the design constraint memory means 108 through a signal line 13, and (iii) conversion information for the elements which have not been stored in the library element memory means 101, the conversion information being sent, through a signal line 17, from out-of-storage element conversion information memory means 118 in the library element memory means 101. Based on the pieces of information thus received, the conversion method selecting means 114 then determines the optimum tools for element conversion and parameters to be set when the tools are used, and selects the optimum converting means.

The element names and information relating to parameters to be set when the tools determined by the conversion method selecting means 114 are used, are sent to circuit data converting means (design data converting means) 115 selected by the conversion method selecting means 114 through a signal line 19. Also, the circuit data corresponding to the specified elements are sent to the circuit data converting means 115 through a signal line 20. By operating the tool in the circuit data converting means 115 on the circuit data with the use of the parameters sent through the signal line 19, the circuit data can be converted into circuit data on a desired level.

Further, the conversion method selecting means 114 receives (i) the names of elements forming specified elements and the conversion instruction given to these elements through the signal line 16, (ii) the information relating to design constraints from the design constraint memory means 108 through a signal line 14, and (iii) element conversion information of the elements forming the specified elements through a signal line 18. Based on the pieces of information thus received, the conversion method selecting means 114 determines tools and parameters which are optimum for converting the elements into data on the level specified by the conversion instruction, and the conversion method selecting means 114 selects the optimum converting means for the elements.

The circuit data converting means 115 selected by the conversion method selecting means 114, receives (i) the name of an element to be converted and information relating to parameters to be set for a tool to be used for converting the element in the optimum manner, through a signal line 21, and (ii) the circuit data corresponding to the element to be converted through a signal line 20. By operating the tool in the selected circuit data converting means 115 on the circuit data with the use of the parameters sent through the signal line 21, the element can be converted into circuit data on a desired level. The circuit data converted by the circuit data converting means 115, are stored in circuit data memory means 117 through a signal line 22.

According to the processings above-mentioned, without special attention paid on the circuit data, the designer can obtain circuit data having a desired function on a desired level, merely by combining elements stored in the library element memory means 101 to carry out a function design and by specifying a target level. It is noted that the circuit data memory means 110 and 117 may be made in the form of single memory means, and that the circuit arrangement information memory means 109, the design constraint memory means 108 and the circuit data memory means 110, 117 may be made in the form of single memory means, i.e., design data memory means 111.

Figure 2:
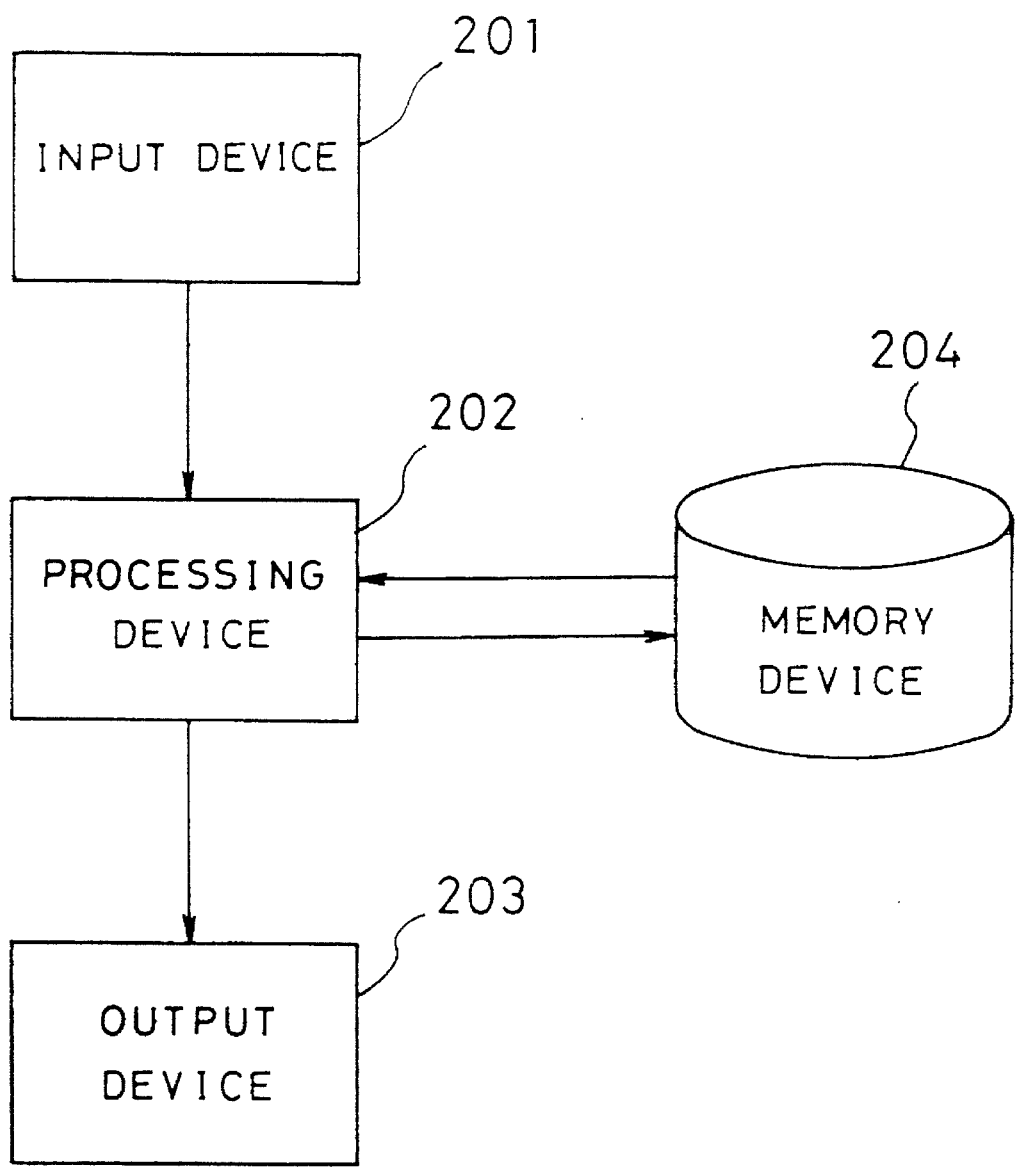
FIG. 2 is a view illustrating the arrangement of hardware of the LSI automated design system in FIG. 1a and FIG. 1b.

FIG. 2 is a view illustrating the arrangement of hardware of the LSI automated design system in FIG. 1a and FIG. 1b. This hardware arrangement is adapted to execute a circuit design processing shown in FIG. 4. In FIG. 2, there are shown an input device 201, a processing device 202, an output device 203 and a memory device 204. The input device 201 is adapted to enter, to the processing device 202, (i) circuit data such as function descriptions, logic circuits, layout data and the like which are required for designing a desired circuit and which are to be stored in an element library, and (ii) information relating to a design method for each circuit data and information relating to the circuit arrangement required for designing the desired circuit. The output device 203 is adapted to supply a circuit which has a function identical with that of the circuit entered thereinto, and which is formed by actually existing elements. The processing device 202 is adapted to execute a variety of processing programs stored in the memory device 204 for executing circuit design processings such as conversion of the entered design circuit into circuit data on a desired level. Examples of the input device 201 include a keyboard, a card reader, a schematic entry system, a file and the like. Examples of the output device 203 include a character display, a graphic display, a plotter, a file and the like.

FIG. 3 is a block diagram illustrating the inner arrangement of the memory device 204. Conversion method memory means 301 contains a variety of processing methods for an LSI design. Library element memory means 302 (101 in FIG. 1a and FIG. 1b) contains elements to be used for an LSI design, together with circuit data, design methods and other information required for a circuit design. Design data memory means 303 (111 in FIG. 1a and FIG. 1b) contains design results such as circuit data, design constraints, LSI circuit arrangement and the like which have been generated in the course of an LSI design.

Figure 4:
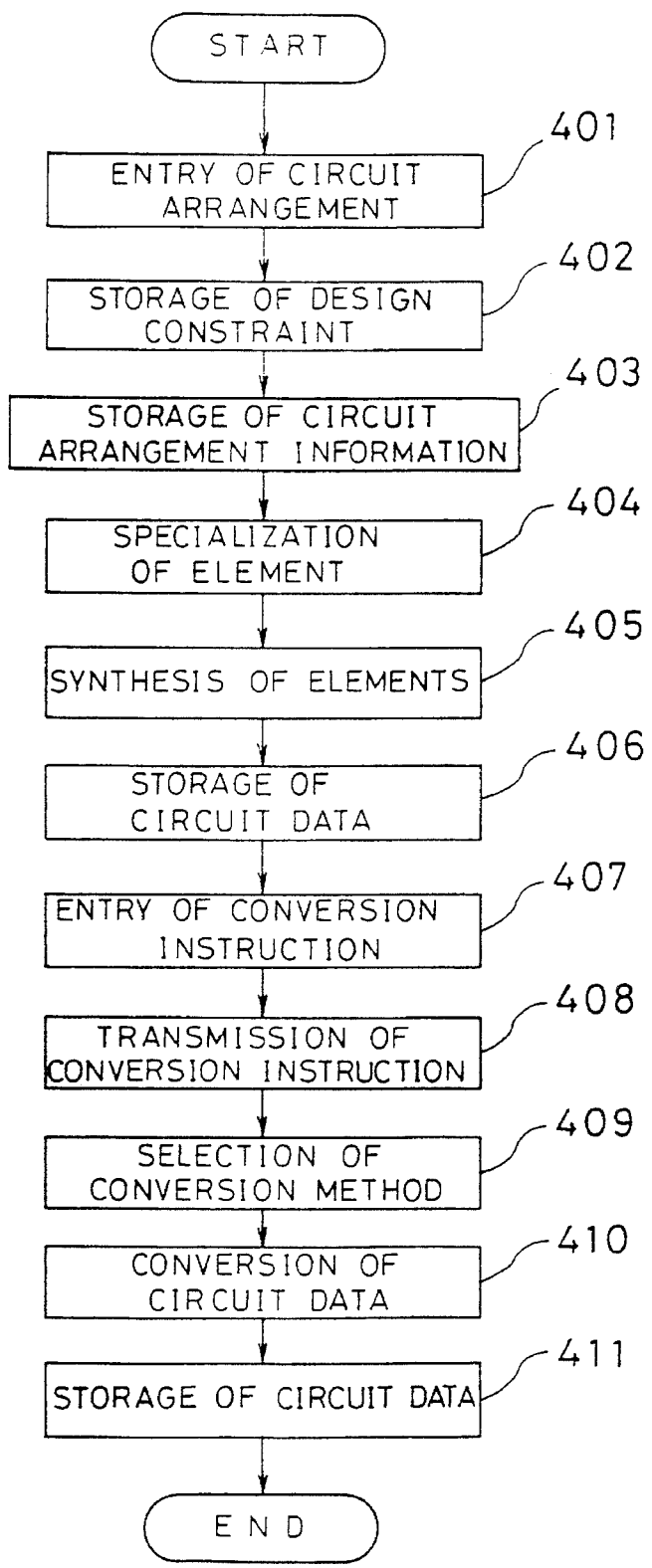
FIG. 4 is a processing flow chart of the LSI automated design system in FIG. 1a and FIG. 1b.

FIG. 4 shows a processing flow chart of the LSI automated design system having the arrangement above-mentioned. The following will discuss the entire operation of the system according to the flow chart.

At a circuit arrangement entering step 401, circuit elements required for achieving the desired function are selected from the elements stored in the library element circuit data memory 103 in the library element memory means 101, and there are entered information relating to design constraints required for achieving the desired function and information relating to the layout with the floor plan taken into consideration. At a design constraint storing step 402, there are stored, in the design constraint memory means 108, the elements entered at the circuit arrangement entering step 401 or information relating to design constraints for the entire circuit. At a circuit arrangement information storing step 403, the information relating to the circuit arrangement entered at the step 401 is stored in the circuit arrangement information memory means 109. At an element specializing step 404, there are replaced the parameters of the elements selected at the circuit arrangement entering step 401, and selected component elements based on the parameters, thus specializing the functions of the elements. At an element synthesizing step 405, there is synthesized an element for integrating the elements forming the circuit, based on (i) information relating to input/output of the elements specialized at the element specializing step 404 and (ii) information relating to the circuit arrangement stored at the step 403. At a circuit data storing step 406, there are stored, in the circuit data memory means 110, the circuit data specialized at the step 404 and the circuit data for connecting the circuit component elements which was synthesized at the step 405.

At a conversion instruction entering step 407, there is entered a conversion instruction for converting the circuit thus designed, into data on a desired level. At a conversion instruction transmitting step 408, the conversion instruction entered at the step 407 is transmitted to the conversion method selecting means 114. At a conversion method selecting step 409, information relating to converting tools and information relating to parameters to be set when the tools are used, are determined based on the conversion instruction thus transmitted and information 104 (FIG. 1b) relating to conversion methods of elements to be converted. Also, based on the pieces of information thus determined, there is selected the optimum conversion method for each element. At a circuit data converting step 410, the circuit data stored at the step 406 are converted with the use of the conversion methods selected at the conversion method selecting step 409. At a circuit data storing step 411, the conversion results are stored in the circuit data memory means 117. With the steps above-mentioned, the LSI design is complete.

Figure 13:
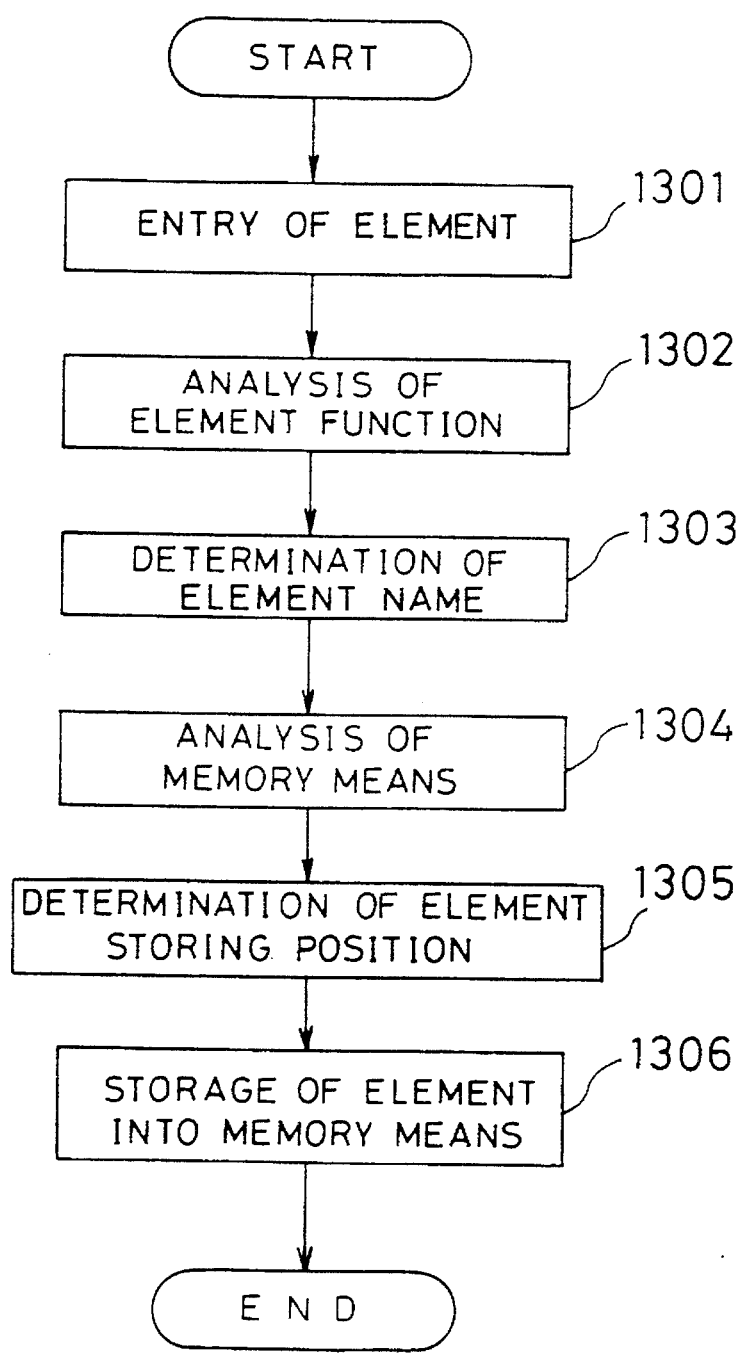
FIG. 13 is a flow chart of a processing of storing elements in the library element memory means in the LSI automated design system in FIG. 1a and FIG. 1b.

The following will discuss a method of storing an element into the library element memory means 101 with reference to FIG. 13.

At an element entering step 1301, design data are to be entered. Here, there are collectively entered, as an element, a general-purpose circuit data, information relating to a method of designing such a circuit data, information relating to the arrangement of the circuit data and information relating to general-purpose parameters. At an element function analyzing step 1302, there is analyzed the function of the element entered at the element entering step 1301. At an element name determining step 1303, there is determined, based on information relating to the function of the element extracted at the function analyzing step 1303, the optimum element name which represents the function of the element. At a memory means analyzing step 1304, the memory means 101 in which elements have been already stored, is analyzed. Then, there is extracted information relating to the storage arrangements of the elements already stored therein. Each of the storage arrangements thus extracted has a rank structure according to a function. As an element has a more detailed function, the element is stored in a lower rank. At an element storing position determining step 1305, the name determined at the element name determining step 1303 is compared with the information relating to the storage arrangements of the existing elements which was obtained at the memory means analyzing step 1304, and determines the storing position of the element entered at the element entering step 1301. At the final step 1306, the element is newly stored in the memory means at the storing position thus determined. According to the element storing method above-mentioned, elements can be retrieved at a high speed at the time of a design, and effective element selection can be made with the use of element names relating to functions.

Figure 5:
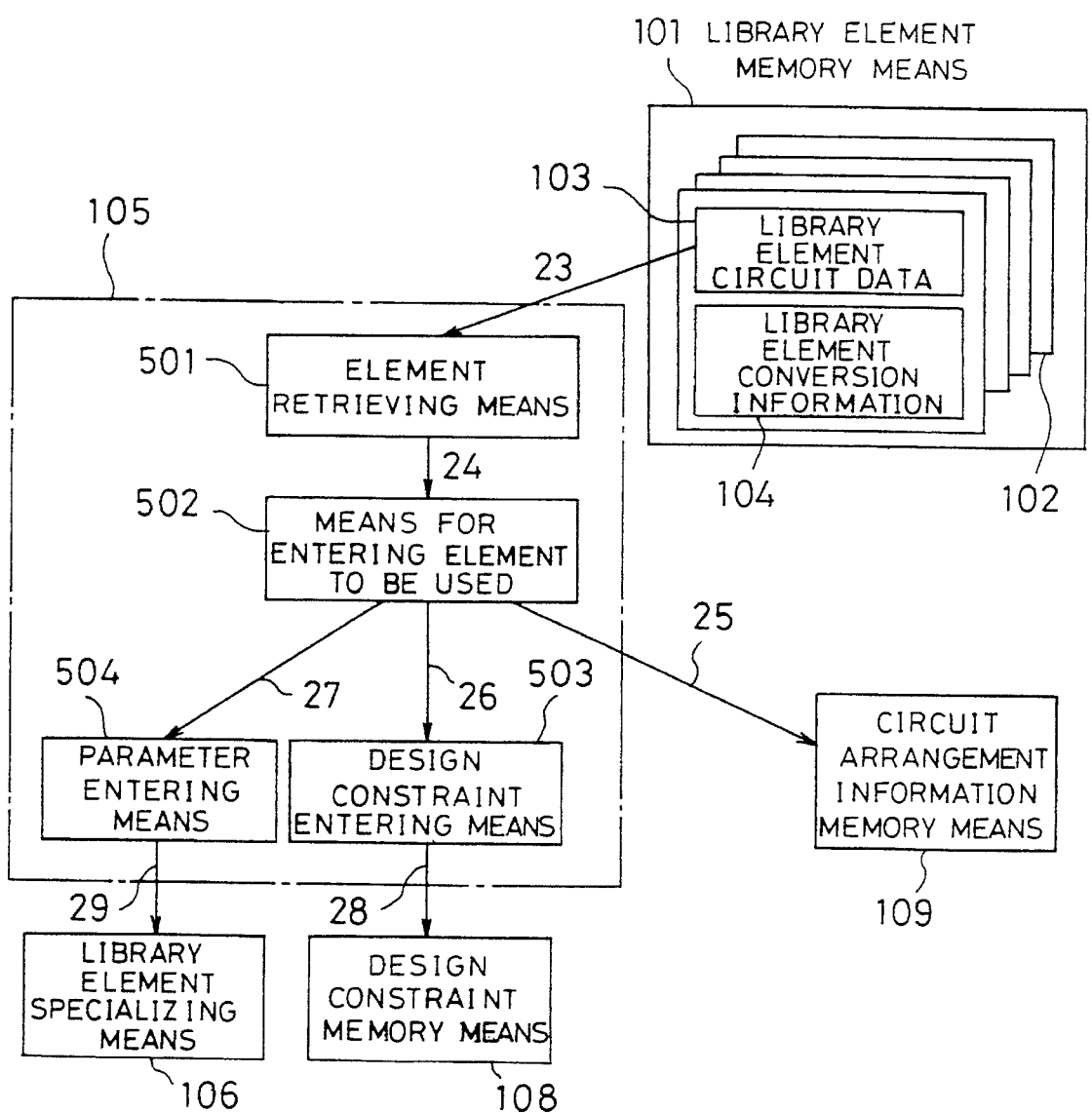
Figure 6:
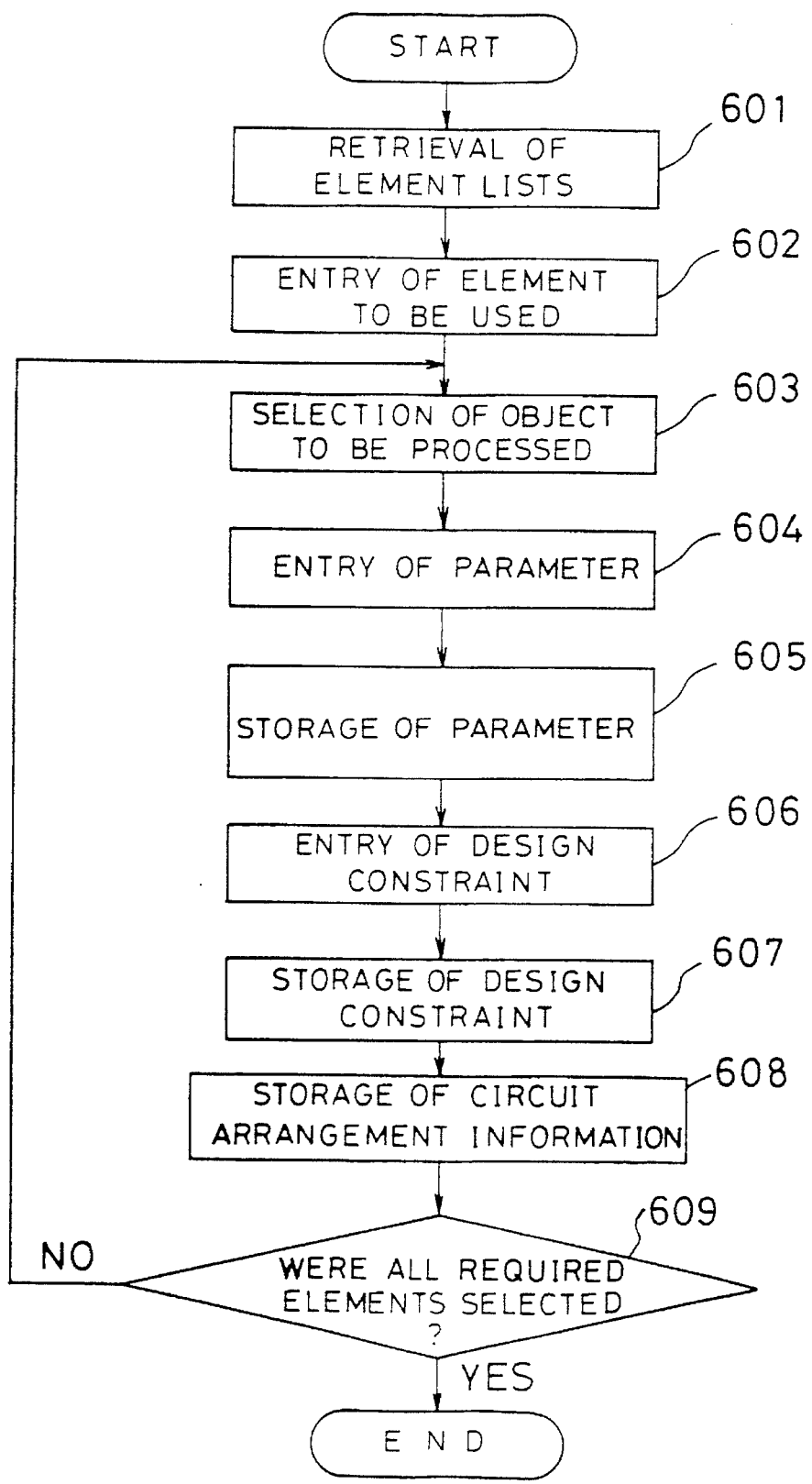
FIG. 6 is a detail flow chart of a circuit arrangement entry processing in FIG. 4.

With reference to FIGS. 5 and 6, the following will discuss in detail the arrangement and processing flow of the circuit arrangement entering means 105 in FIG. 1a.

FIG. 5 is a view illustrating the detailed arrangement of the circuit arrangement entering means 105. As shown in FIG. 9, the library element memory means 101 contains design data in the form of elements and other information required for achieving an automated circuit design.

In element retrieving means 501, the name of each element required, information relating to parameters for determining the function of the element and information relating to the arrangement of the element, are extracted from information sent to the element retrieving means 501, through a signal line 23, from the library element circuit data memory 103 of the library element memory means 101. The element name, the information relating to parameters and the information relating to element arrangement thus extracted, are sent to means for entering elements to be used 502 through a signal line 24.

Based on the element names and the information relating to parameters sent through the signal line 24, the means 502 selects the elements required for designing a circuit which achieves the desired function.

Information relating to the elements selected by the means 502, is sent to the circuit arrangement information memory means 109 through a signal line 25, to design constraint entering means 503 through a signal line 26 and to parameter entering means 504 through a signal line 27. More specifically, the element names, the information relating to the element arrangements and the information relating to the final element layout position sent through the signal line 25, are stored, as circuit arrangement information, in the circuit arrangement information memory means 109. The information relating to the element layout position specified at this time, serves as information relating to a circuit floor plan. The design constraint entering means 503 enters, to the elements sent through the signal line 26, design constraints which must be satisfied by the elements. Together with the element names, the information relating to the design constraints is sent to and stored in the design constraint memory means 108 through a signal line 28. To the elements and the information relating to the parameters for determining the functions of these elements sent through the signal line 27, parameter entering means 504 enters parameter information required such that the elements achieve the desired functions. The parameter information thus entered is then sent to the library element specializing means 106 through a signal line 29.

FIG. 6 is a processing flow chart of the circuit arrangement entering means 105.

At an element list retrieving step 601, the lists of elements stored in the library element memory means 101 are retrieved to extract the names of all elements, information relating to parameters for determining the function of each element and element arrangement information. At a step of entering elements to be used 602, elements required for forming a circuit having a desired function are selected based on the information extracted at the step 601.

At a step of selecting an object to be processed 603, an element is selected, as an object to be processed, from the elements selected at the step 602. A parameter entering step 604, there are set function determining parameters to the parameter information which has been retrieved at the step 601 and which corresponds to the element selected at the step 603. At a parameter storing step 605, the parameters thus set are stored in the library element specializing means 106. At a design constraint entering step 606, there are entered design constraints which the element should satisfy for achieving a desired function thereof. At a design constraint storing step 607, the design constraints entered at the design constraint entering step 606, are stored in the memory means 108. At a circuit arrangement information storing step 608, the information relating to the arrangement of the element and the information relating to the final layout position of the element, are stored, as circuit arrangement information, in the circuit arrangement information memory means 109. At a step 609, it is judged whether or not all elements required for forming the circuit were selected. In the affirmative, the function design of the circuit is complete. In the negative, the sequence is returned to the step 603 where selection is made on an element which has not been selected yet. Then, the processings on and after the step 604 are carried out.

With the processings above-mentioned, a circuit having a desired function can be designed by selecting elements as obtained from existing design data. Further, such a design can be made with no special attention paid on the contents of design data.

Figure 7:
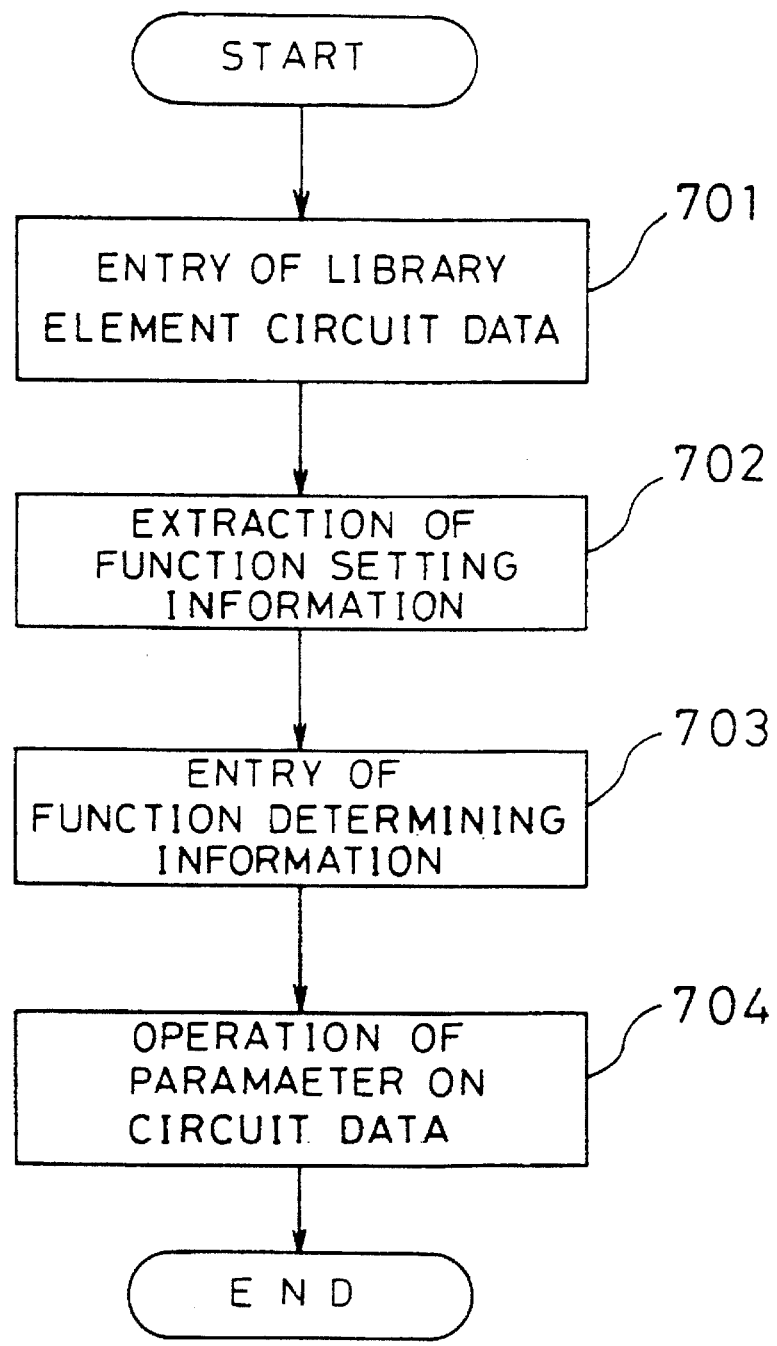
FIG. 7 is a detail flow chart of an element specializing processing in FIG. 4.
Figure 12A:
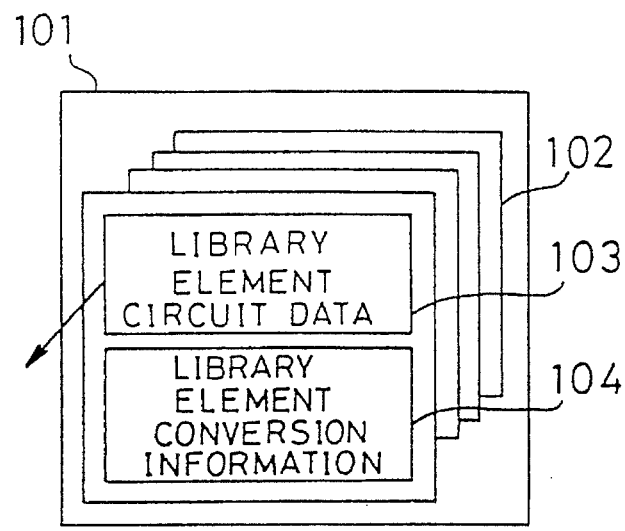
Figure 12B:
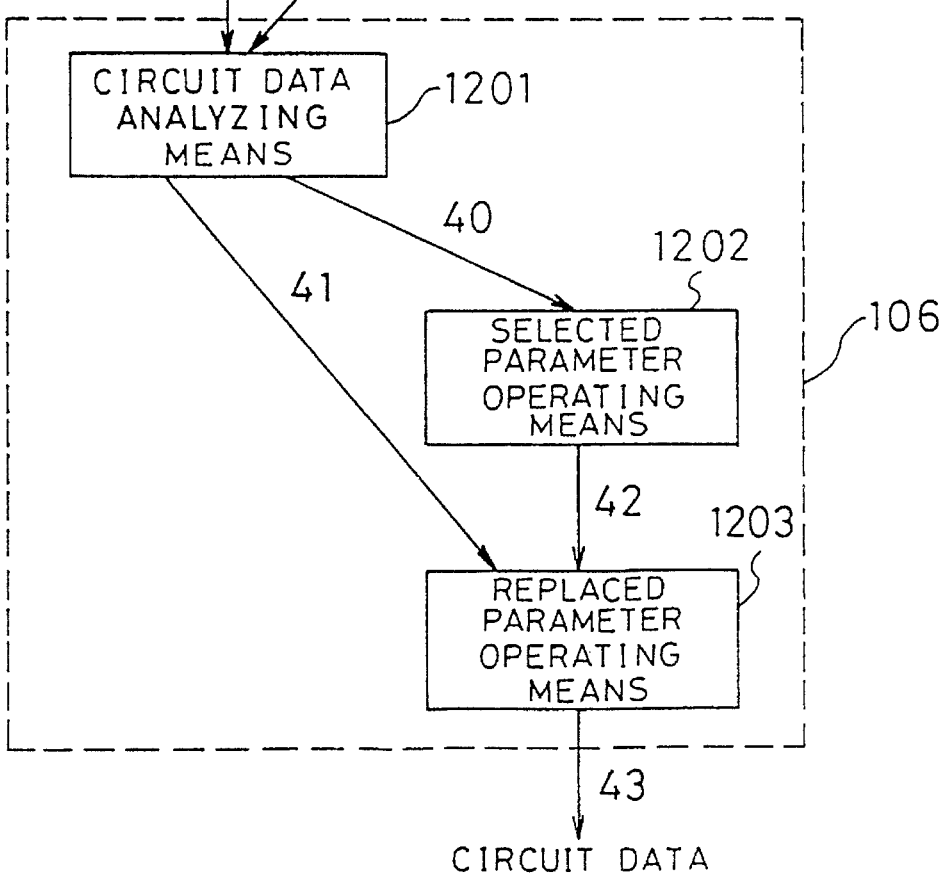

With reference to FIG. 12 and FIG. 7, the following will discuss in detail the arrangement and processing flow of the library element specializing means 106 in FIG. 1a.

FIG. 12 is a view illustrating the arrangement of the library element specializing means 106.

Circuit data analyzing means 1201 analyzes (i) the circuit data of elements to be specialized which are sent to the means 1201 from the library element memory means 101 through the signal line 2 and (ii) information relating to function determining parameters, and determines a method of operating function determining information (parameters) which is prepared for function specialization and which is entered to the means 1201 through the signal line 3. Here, there is selected a method of replacing the information set as parameters, or a method of selecting data to be used by the information set as parameters.

Sent through a signal line 40 to selected parameter operating means 1202 are (i) circuit data to be specialized and (ii) parameter information for specializing functions with the use of data selected from the circuit data to be specialized. By operating the parameters on the circuit data, there is carried out specialization of the circuit data by selection of data to be used.

Sent to replaced parameter operating means 1203 are (i) parameter information for determining functions by parameter replacement and (ii) circuit data in which portions of the functions have been specialized by the selected parameter operating means 1202, the parameter information and the circuit data being sent to the means 1203 through signal lines 41, 42, respectively. When the parameters of the circuit data are replaced with the parameter information sent through the signal line 41, the specialization of the circuit data is complete. As a result, there are obtained circuit data of which functions have been specialized, and the circuit data thus obtained are sent to the element synthesizing means 107 through a signal line 43.

FIG. 7 is a processing flow chart of the library element specializing means 106. At a step 701, the circuit data of library elements to be specialized are entered. At a function setting information extracting step 702, the circuit data thus entered are analyzed, and there is determined a method of operating the function determining information (parameters) for function specialization, on the parameters of the circuit data of the elements. At a function determining information entering step 703, there is entered information for determining the function of the circuit data already set. At a step 704, the parameters set at the step 703 are operated on the circuit data entered at the step 701, thus generating circuit data which have no parameters and of which functions have been determined. With the processings above-mentioned, circuit data obtained by combination of general-purpose elements, can be converted into data of which functions have been determined and with which the design work can be forwarded.

Figure 8:
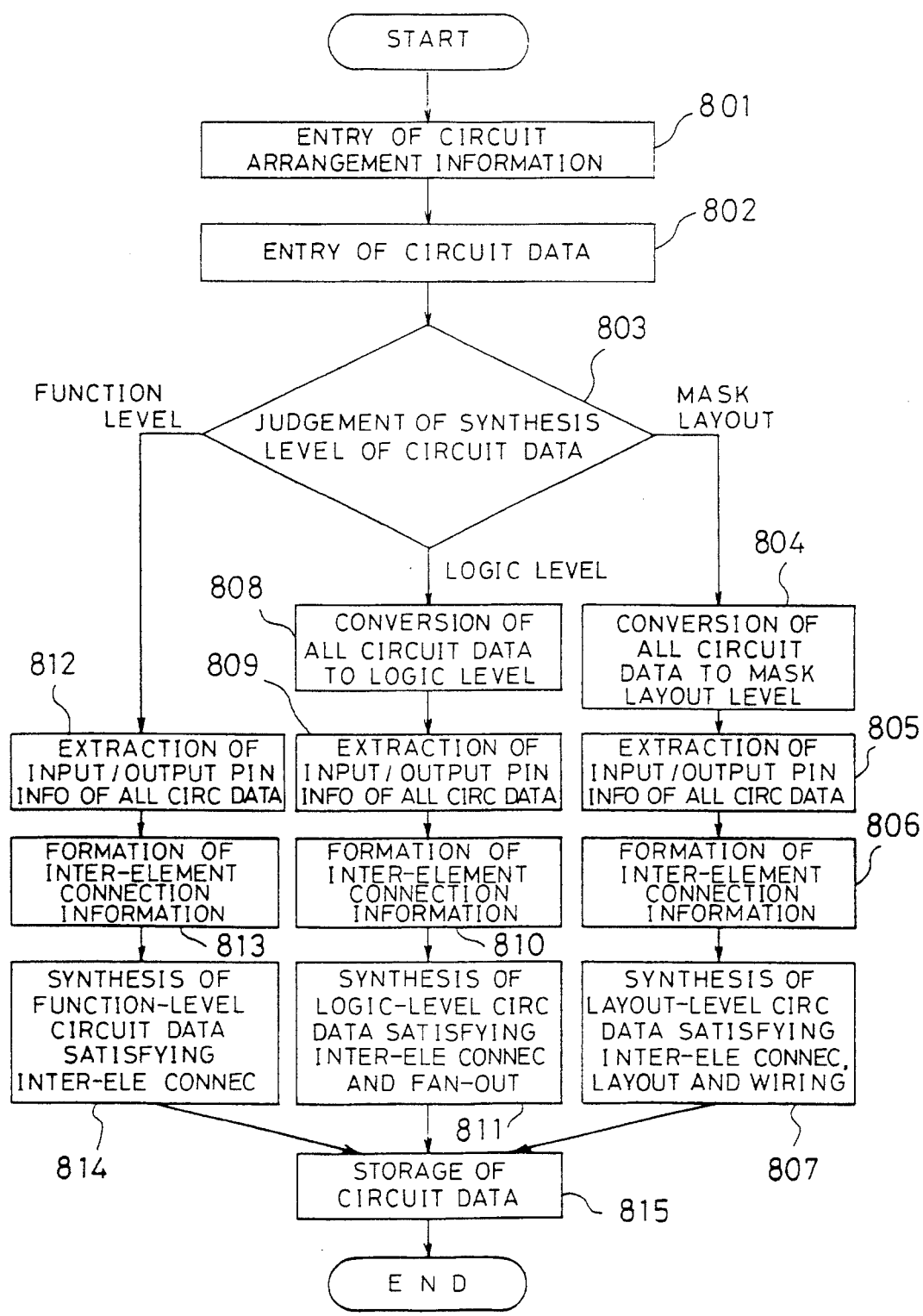
FIG. 8 is a detail flow chart of an element synthesizing processing in FIG. 4.

With reference to FIG. 8, the following will discuss in detail a processing flow of the element synthesizing means 107.

At a circuit arrangement information entering step 801, there are entered (i) the relation among elements which are stored in the circuit arrangement information memory means 109 and which form a circuit to be designed, (ii) information relating to the layout positions of the elements and (iii) information indicating a circuit level at which synthesis is to be carried out. At a circuit data entering step 802, there are entered circuit data specialized by the library element specializing means 106. At a step of judging a synthesis level of circuit data 803, there is analyzed the information relating to the element synthesizing level which has been entered at the circuit arrangement information entering step 801. Then, according to the specified level, i.e., a function level, a logic level or a mask layout level, the subsequent processing flow is selected.

It is now supposed that the mask layout level is specified. At a circuit data converting step 804, all circuit data entered at the circuit data entering step 802, are converted into circuit data on the mask layout level according to conversion information of the circuit data (information sent from the library element circuit data memory 103 through the signal line 6). At a step of extracting input/output pin information of circuit data 805, there is extracted information relating to the input/output pins of circuit data converted at the step 804. At an inter-element connection information forming step 806, there is formed information relating to the connection relation among the circuit data, based on the information relating to the input/output pins and the information relating to the circuit element arrangement. At a step 807, there is synthesized a circuit data containing (i) wirings satisfying the connection relation among the circuit data and (ii) a layout satisfying the information relating to the layout positions of the circuit data. Finally, at a circuit data storing step 815, the circuit data converted at the step 804 and the circuit data synthesized at the step 807, are stored in the circuit data memory means 110.

It is now supposed that the logic level is specified. At a circuit data converting step 808, all circuit data entered at the circuit data entering step 802, are converted into circuit data on the logic level according to conversion information of the circuit data (information sent from the library element circuit data memory 103 through the signal line 6). At a step of extracting input/output pin information of circuit data 809, there is extracted information relating to the input/output pins of the circuit data converted at the step 808. At an inter-element connection information forming step 810, there is formed information relating to the connection relation among the circuit data, based on the information relating to the input/output pins and the information relating to the circuit element arrangement. At a step 811, there is synthesized, based on the information relating to the connection among the circuit data, a logic-level circuit data which satisfies the connection relation among the circuit data and which satisfies constraints relating to circuit data fan-outs. Finally, at a circuit data storing step 815, the circuit data converted at the step 808 and the circuit data synthesized at the step 811, are stored in the circuit data memory means 110.

It is now supposed that the function level is specified. At a step of extracting input/output pin information of circuit data 812, there is extracted information relating to the input/output pins of the circuit data, from all circuit data entered at the circuit data entering step 802. At an inter-element connection information forming step 813, there is formed information relating to the connection relation among the circuit data, based on the information relating to the input/output pins and the information relating to the circuit element arrangement. At a step 814, there is synthesized, based on the information relating to the connection among the circuit data, a function-level circuit data which satisfies the connection relation among the circuit data. Finally, at a circuit data storing step 815, the circuit data entered at the step 802 and the circuit data synthesized at the step 814, are stored in the circuit data memory means 110.

According to the processings in FIG. 8 thus discussed, it is possible to form a circuit data for integrating the elements of a circuit as obtained by combining the elements which achieve the desired function of the circuit. The circuit data thus formed are to be processed by the design data converting portion in FIG. 1*b*.

Figure 10:
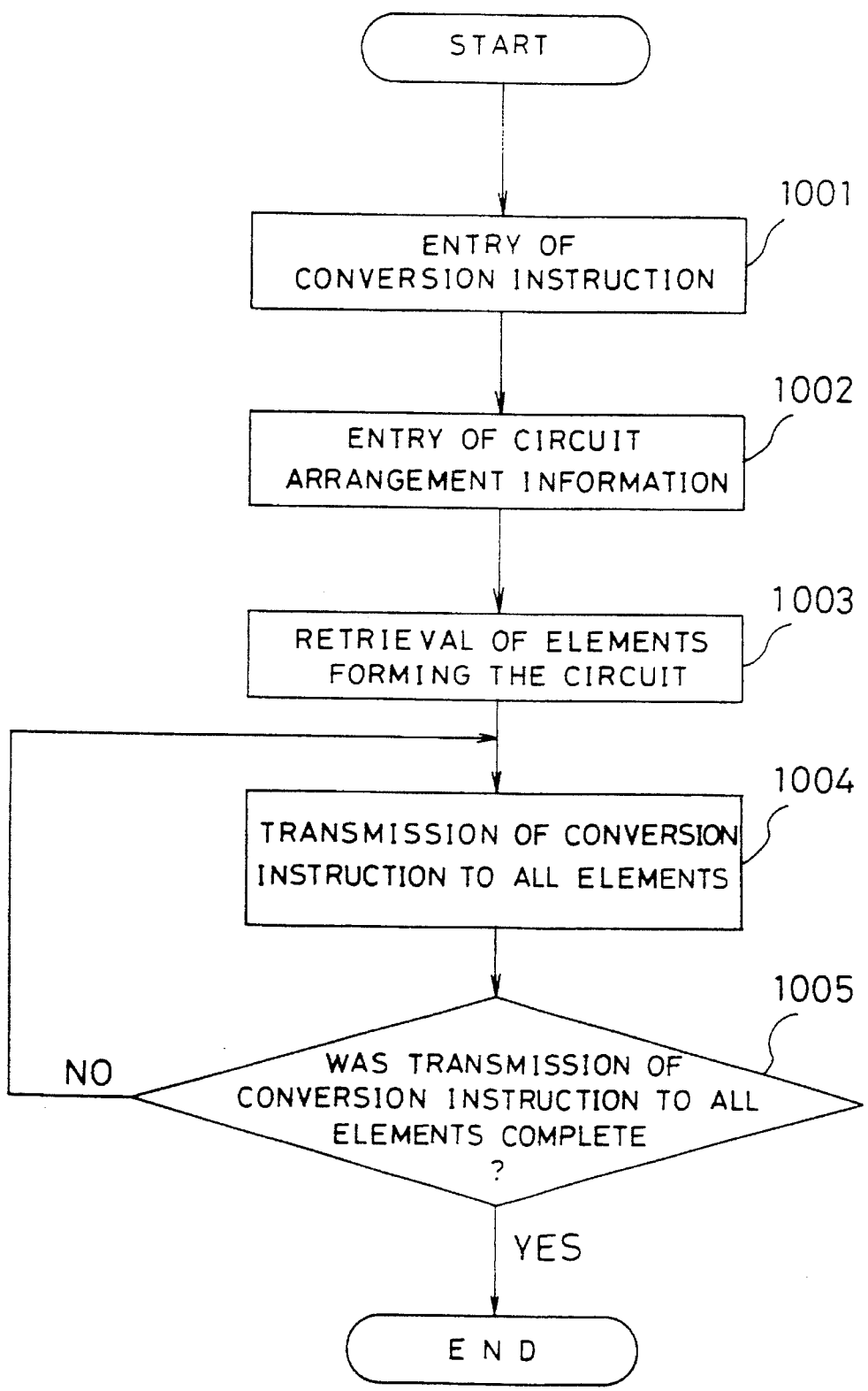
FIG. 10 is a detail flow chart of a conversion instruction transmitting processing in FIG. 4.

With reference to FIG. 10, the following will discuss in detail the processing flow of the conversion instruction transmitting means 113. At a conversion instruction entering step 1001, there is entered a conversion instruction for setting a level of circuit data to which a circuit is to be converted. At a circuit arrangement information entering step 1002, information relating to the elements forming the circuit to be converted, is entered from the circuit arrangement information memory means 109 through the signal line 12. At a circuit component element retrieving step 1003, there are extracted the names of the elements forming the circuit to be converted. At a conversion instruction transmitting step 1004, a conversion instruction is transmitted to the element names thus extracted. At a judging step 1005, it is judged whether or not the conversion instruction was transmitted to all the elements. In the negative, the sequence is returned to the conversion instruction transmitting step 1004. The transmitting processing is continued until the transmission of the conversion instruction to all the elements is complete. Thus, the conversion instruction can be transmitted to all the elements.

Figure 11:
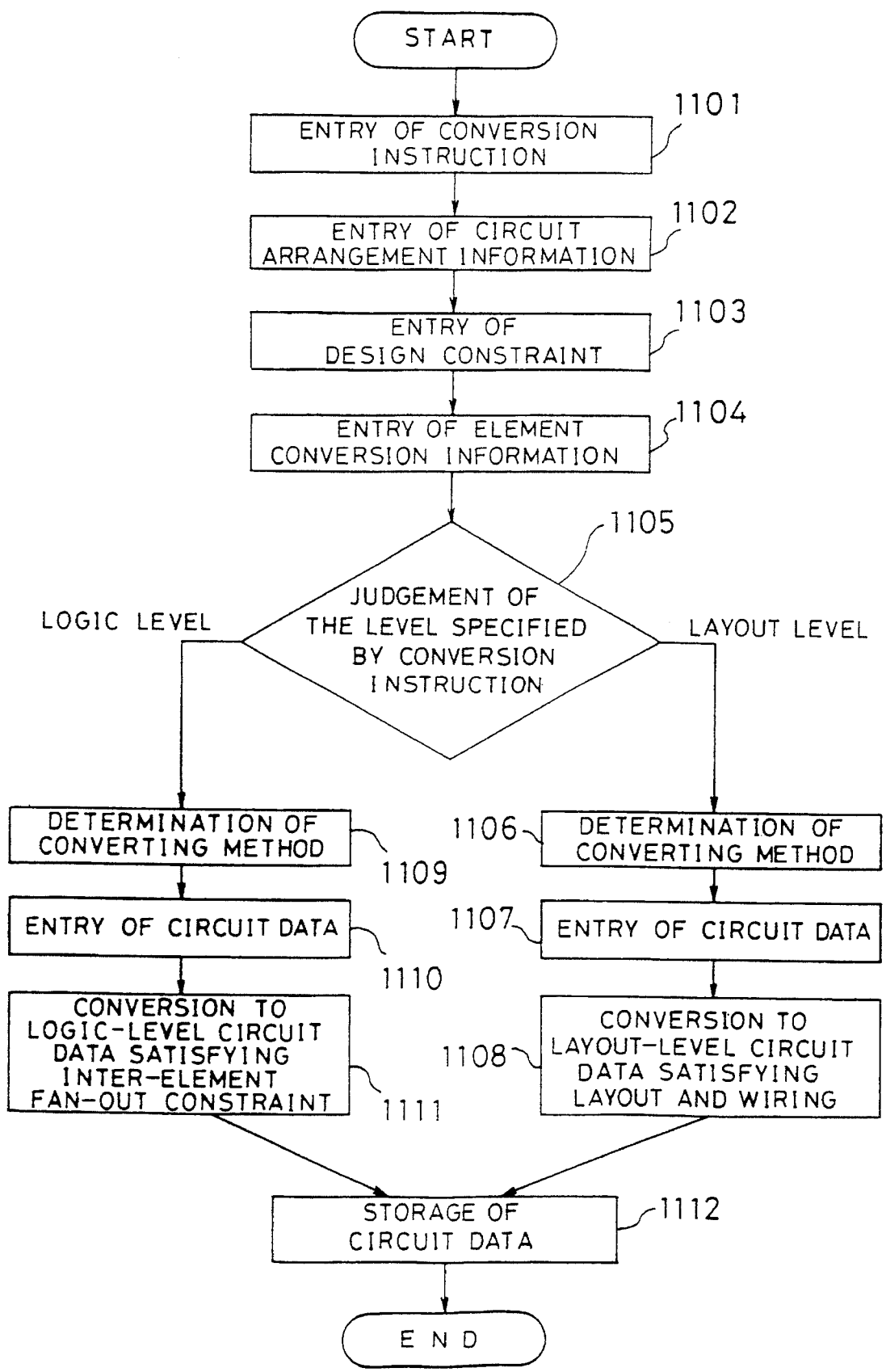
FIG. 11 is a processing flow chart of the design data converting device in FIG. 1b.

With reference to FIG. 11, the following will discuss in detail the entire processing flow of the design data converting-portion in FIG. 1b.

At a conversion instruction entering step 1101, there is entered, from the conversion instruction entering means 112, information indicating a data level on which circuit data are to be converted. At a circuit arrangement information entering step 1102, there are entered, from the circuit arrangement information memory means 109, information relating to the elements forming the circuit and information relating to the layout positions of the elements. At a design constraint entering step 1103, there is entered, from the design constraint memory means 108, information relating to design constraints which should be satisfied for converting the circuit. At an element conversion information entering step 1104, there is entered, from the library element conversion information memory 104, element conversion information which corresponds to each of the elements forming the circuit to be converted.

At a step of judging the level specified by a conversion instruction 1105, the conversion method selecting means 114 analyzes the conversion instruction entered at the conversion instruction entering step 1101 and judges whether the specified level is a logic level or a layout level. The subsequent processing method varies with the judgment result.

It is now supposed that the conversion instruction specifies the layout level. At a conversion method determining step 1106, there is determined, in the conversion method selecting means 114, a circuit converting method based on the element conversion information entered at the element conversion information entering step 1104. At a circuit data entering step 1107, there are entered, from the circuit data memory means 110, circuit data corresponding to elements to be converted. At a circuit data converting step 1108, the circuit data converting method determined at the conversion method determining step 1106 is operated, by the circuit data converting means 115, on the circuit data entered at the circuit data entering step 1107. Accordingly, the circuit data are converted and there are ultimately carried out processings of disposing and wiring the circuit data. At a circuit data storing step 1112, the circuit data or conversion result obtained at the circuit data converting step 1108, are stored in the circuit data memory means 117.

It is now supposed that the conversion instruction specifies the logic level. At a conversion method determining step 1109, there is determined, by the conversion method selecting means 114, a circuit converting method based on the element conversion information entered at the element conversion information entering step 1104. At a circuit data entering step 1110, there are entered, from the circuit data memory means 110, circuit data corresponding to the elements to be converted. At a circuit data converting step 1111, there is operated, in the circuit data converting means 115, the circuit data converting method determined at the conversion method determining step 1109, on the circuit data entered at the circuit data entering step 1110. Accordingly, the circuit data are converted and there is ultimately carried out a processing of converting the circuit data into logic-level circuit data satisfying circuit data fan-out constraints. At a circuit data storing step 1112, the circuit data or conversion result obtained at the circuit data converting step 1111, are stored in the circuit data memory means 117.

According to the processings in FIG. 11 thus discussed, it is possible to convert circuit data without no special attention paid on the circuit data level and the conversion method.

Figure 15A:
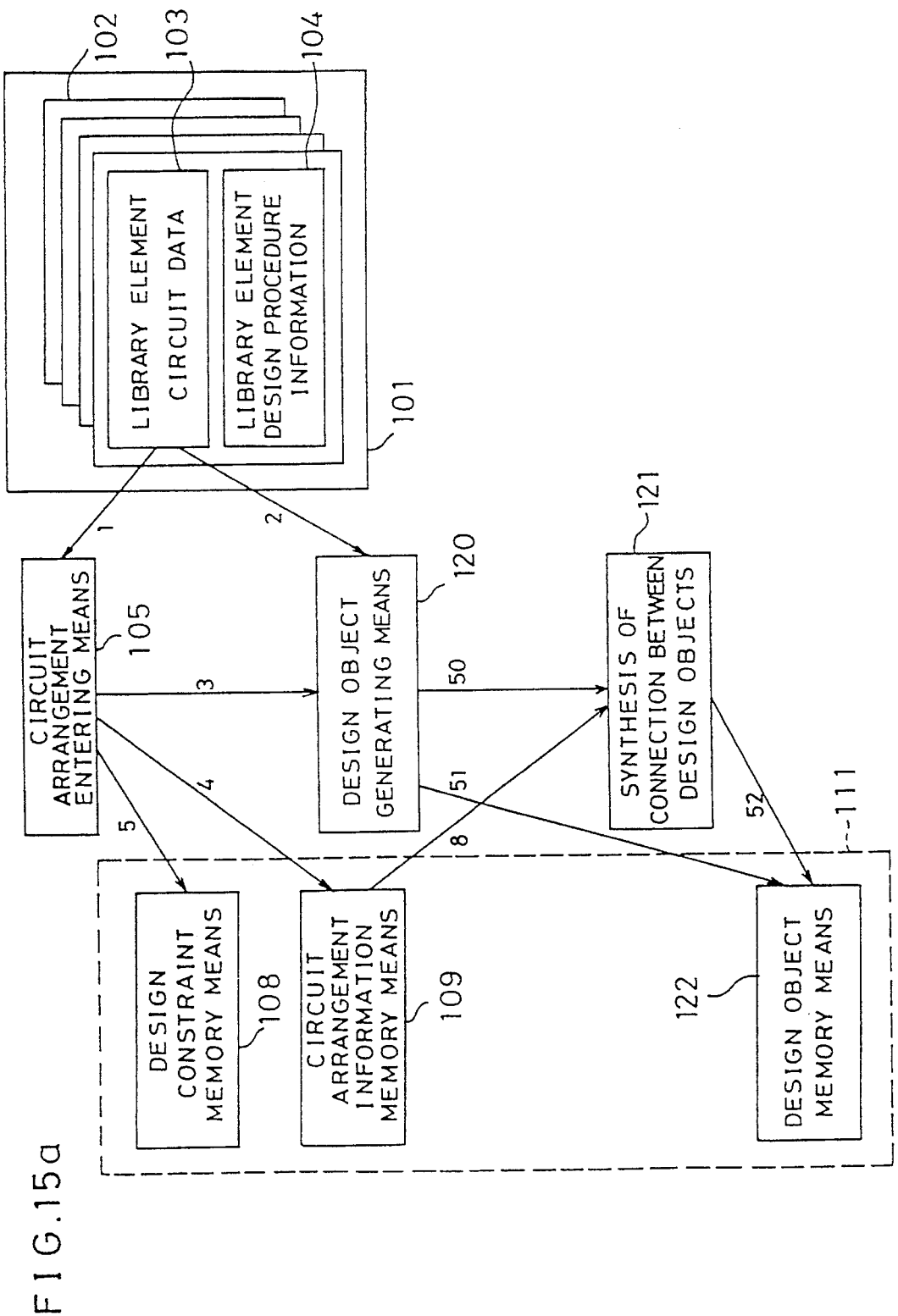
FIG. 15a is a view illustrating the arrangement of a function design device in an LSI automated design system according to another embodiment of the present invention.
Figure 15B:
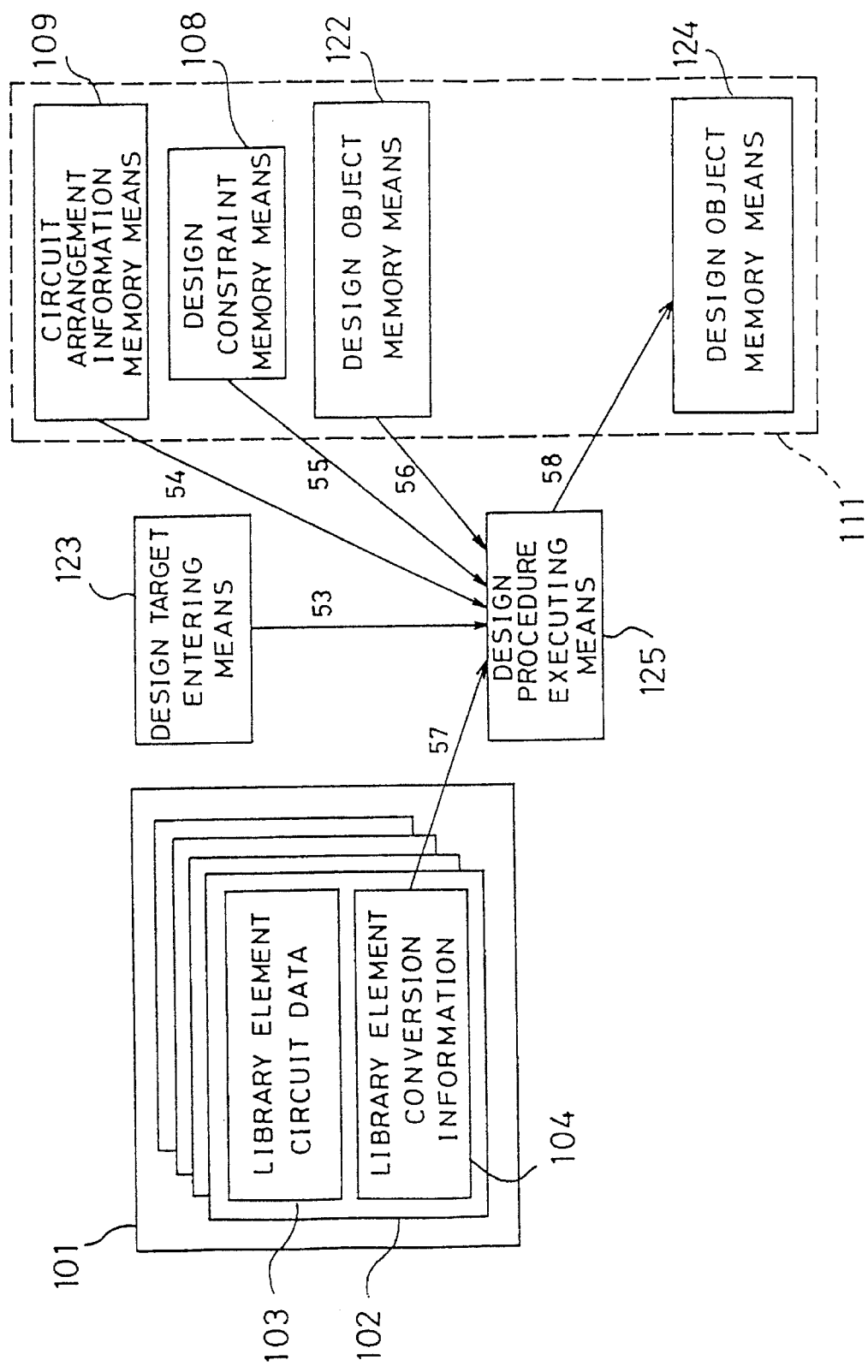
FIG. 15b is a view illustrating the arrangement of a design data converting device in the LSI automated design system according to the another embodiment of the present invention.

When an object-oriented technology is employed in the LSI automated design system above-mentioned, elements can be reused in a more efficient manner. FIG. 15a and FIG. 15b show the arrangement of an LSI automated design system according to another embodiment of the present invention into which the object-oriented technology is introduced.

FIG. 15a shows a function design portion for achieving a circuit having a desired function using elements stored in a library, and FIG. 15b shows a design data converting portion for converting a circuit of which function design has been complete, into circuit data on the finally required level. The function design portion in FIG. 15a and the design data converting portion in FIG. 15b are basically identical with those in FIG. 1a and FIG. 1b, respectively. In the system in FIG. 15a and FIG. 15b, elements stored in library element memory means 101 may be handled as objects, and such objects may be operated to carry out design processings.

In FIG. 15a, library element memory means 101 has a memory area 102 having areas for respective elements (objects). The memory area 102 has (i) a library element circuit data memory 103 for storing element names, circuit data, function determining parameters and information relating to the circuit arrangements of elements, and (ii) a library element design procedure information memory 104 for storing information relating to design procedures for obtaining the optimum circuit, such as tools to be used, the order in which the tools are used, the conditions under which the tools are executed, and the like.

The following will discuss a method of designing a circuit having a desired function (a function design method) using elements stored in the library element memory means 101.

As shown in FIG. 15a, the library element circuit data memory 103 sends the lists of element names, information relating to the arrangements of elements, information relating to parameters for determining the functions of the elements, to element arrangement entering means 105 through a signal line 1. Based on the information thus sent, there are entered, in the element arrangement entering means 105, functions required for achieving the desired circuit. There is also entered, as design constraints, information relating to required working frequency, circuit area and the like. Thus, there are specified elements which satisfy the conditions above-mentioned. Elements are selected from the elements thus specified. When each of the elements thus selected is a general-purpose element, parameters for determining the function thereof are set. As to the layout of the elements, too, the disposition places are specified with the floor plan taken into consideration. Of all the pieces of information thus set, the information relating to design constraints is stored in design constraint memory means 108 through a signal line 5, and the information relating to the selected element names and the information relating to the disposition places of the elements, are stored in circuit arrangement information memory means 109 through a signal line 4. With the processings above-mentioned, there is finished setting the information required for achieving the desired circuit with the use of the system.

With the use of each of general-purpose elements stored in the library element memory means 101, design object generating means 120 generates a design object having (i) circuit data of which function has been determined and (ii) information relating to the design procedure and rank structure thereof. Here, based on (i) information relating to each of elements used for forming the circuit and (ii) information relating to parameters given to each of the elements forming the circuit, both pieces of information being sent through a signal line 3, a circuit data corresponding to each of the elements is taken out from the library element circuit data memory 103 through a signal line 2. Based on the information sent through the signal line 3, the circuit data thus taken out is converted into a circuit data of which function has been specialized. Further, information relating to design procedure and the like stored in the library element memory means 101, is combined with each specialized circuit data to form a design object. The design object is stored in design object memory means 122 through a signal line 51. Generation of such a design object from a library element, is carried out to all the elements forming the circuit.

Then, an object for connecting design objects to one another, is to be synthesized in design-object connection synthesizing means 121. In the synthesizing means 121, there is generated a design object which satisfies the connection relation among all the elements forming the circuit. More specifically, the synthesizing means 121 receives (i) information relating to the elements forming the circuit from the circuit arrangement information memory means 109 through a signal line 8, and (ii) information relating to input/output of the circuit data of each of the objects generated by the design object generating means 120, through a signal line 50. Based on the pieces of information thus received, the synthesizing means 121 extracts the connection relation among all the circuit data and generates a design object which satisfies the connection relation. The design object thus generated is stored in design object memory means 122 through a signal line 52. With the processings above-mentioned, there are finished the function design and the generation of design objects for the desired circuit. All the design object memory means 122, the design constraint memory means 108 and the circuit arrangement information memory means 109 may be made in the form of single memory means, i.e., design data memory means 111.

The design data converting portion in FIG. 15b is adapted to execute a processing of converting a circuit of which function design has been complete, into circuit data on the finally required level (target level).

In design target entering means 123, a design target serving as a target to be processed is entered to design objects serving as objects to be designed. The design target and the names of the design objects serving as objects to be processed, are sent to design procedure executing means 125 through a signal line 53.

There are instances where a design object serving as an object to be processed has lower-rank design objects. In such a case, based on (i) the name of the design object serving as an object to be processed which is sent through the signal line 53 and (ii) information relating to the circuit arrangement sent from the circuit arrangement information memory means 109 through a signal line 54, the design procedure executing means 125 retrieves all lower-rank design objects forming the design object so that all lower-rank design objects are also to be processed. Further, the design procedure executing means 125 receives (i) information relating to the layout positions of elements from the circuit arrangement information memory means 109 through the signal line 54 and (ii) information relating to design constraints from the design constraint memory means 108 through a signal line 55. Based on the pieces of information thus received, the design procedure executing means 125 generates information for properly executing design procedures on the design objects in the optimum manners. Further, the design procedure executing means 125 receives, through a signal line 57, information relating to real design procedure, such as tools to be used for actually executing the design procedures for the design objects serving as objects to be processed, parameters to be set when the tools are used, the order in which the tools are used, and the like. According to the real design procedure, a processing is executed on each design object, and the circuit data of each object sent through a signal line 56 are converted and verified.

In particular, when a design object serving as an object to be processed has lower-rank design objects, the design procedure is executed also on each of the lower-rank design objects. For each of the lower-rank design objects, too, the real design procedure is sent through the signal line 57. Accordingly, the optimum design procedure is also executed to each of the lower-rank design objects. The circuit data thus converted by the design procedure executing means 125 are stored, as one circuit data of a design object serving as an object to be processed, in design object memory means 124 through a signal line 58.

With the processings above-mentioned, the designer can obtain circuit data on a desired level having a desired function, or verification results without special attention paid on the circuit data and the design procedures, merely by combining elements stored in the library element memory means 101 to carry out a function design and by specifying a design target serving as a target level. The design object memory means 122, 124 may be made in the form of single memory means. The design object memory means 122 may be different from the design object memory means 124. In such a case, however, it is required to clarify the relation among objects.

Figure 16:
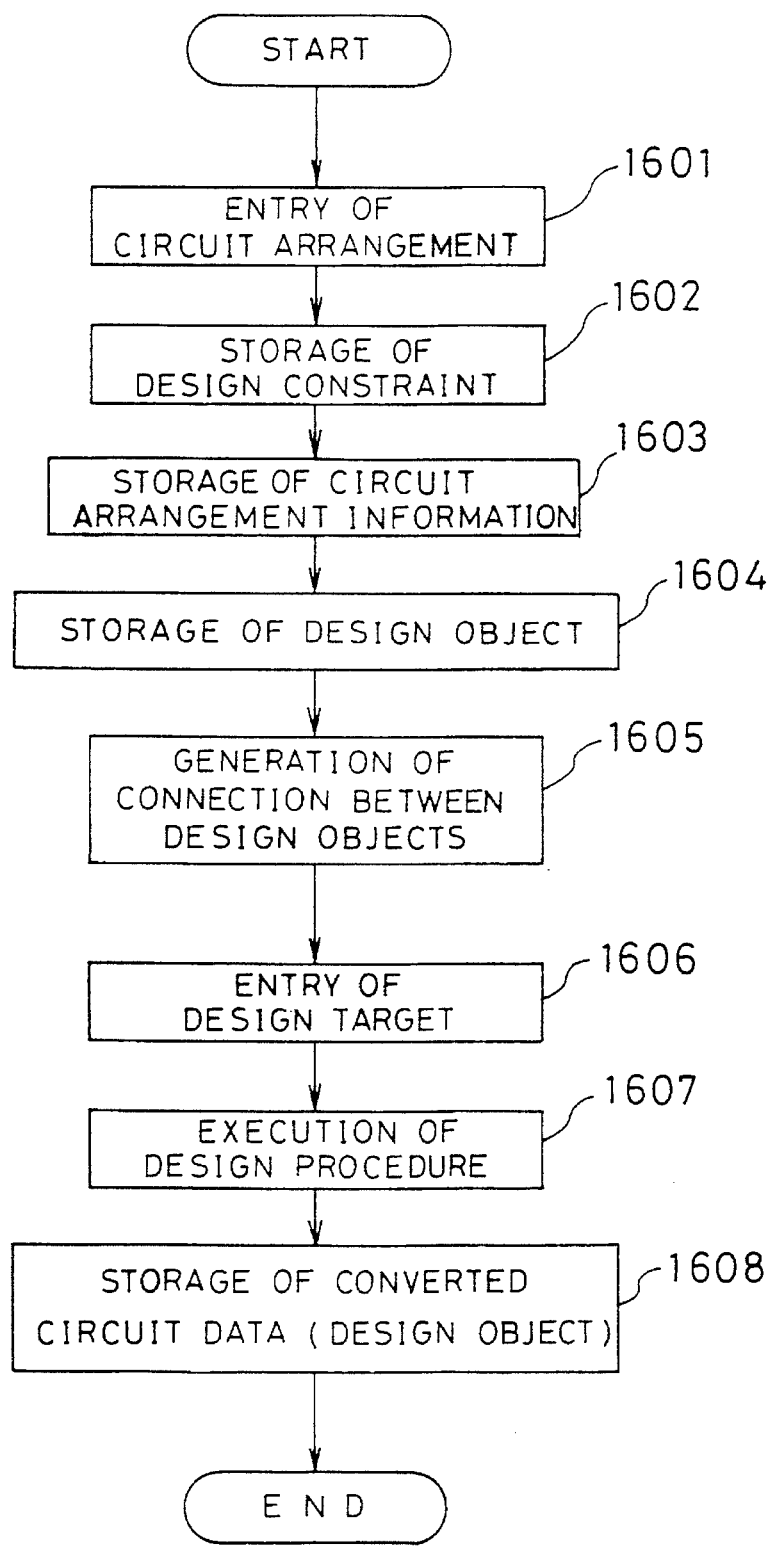
FIG. 16 is a processing flow chart of the LSI automated design system in FIG. 15a and FIG. 15b.

FIG. 16 is the processing flow chart of the LSI automated design system in FIG. 15a and FIG. 15b. The following will discuss the entire operation of the system according to this flow chart.

At a circuit arrangement entering step 1601, there are selected circuit elements required for achieving the function of a desired circuit. Also, there are entered design constraints required for achieving the desired function and information relating to the layout with the floor plan taken into consideration. Further, there are generated, from the elements thus selected, design objects based on which a subsequent design proceeds. By combining such design objects, a function design is to be achieved. At a design constraint storing step 1602, the design constraints entered at the step 1601, are stored in the design constraint memory means 108. At a circuit arrangement information storing step 1603, the information relating to the circuit arrangement entered at the step 1601, is stored in the circuit arrangement information memory means 109. At a design object storing step 1604, the design objects generated at the step 1601, are stored in the design object memory means 122. At a design object connection generating step 1605, there is generated a design object satisfying the connection relation among the design objects generated at the step 1601 such that data can be communicated among these design objects.

On the design objects thus generated, a predetermined processing is to be carried out to forward a circuit design. At a design target entering step 1606, there is entered a design target serving as a target to be processed for the design objects. At a design procedure executing step 1607, design procedures corresponding to the design target are executed. Here, a processing is executed by applying the real design procedure of each design object to the design target thus entered. At a design object storing step 1608, the processing results obtained at the step 1607 are stored as parts of the design objects. With the processings above-mentioned, there can be achieved an LSI design using library circuit elements.

The following will discuss in detail each of the circuit arrangement entering step 1601, the design object connection generating step 1605 and the design procedure executing step 1607.

Figure 17:
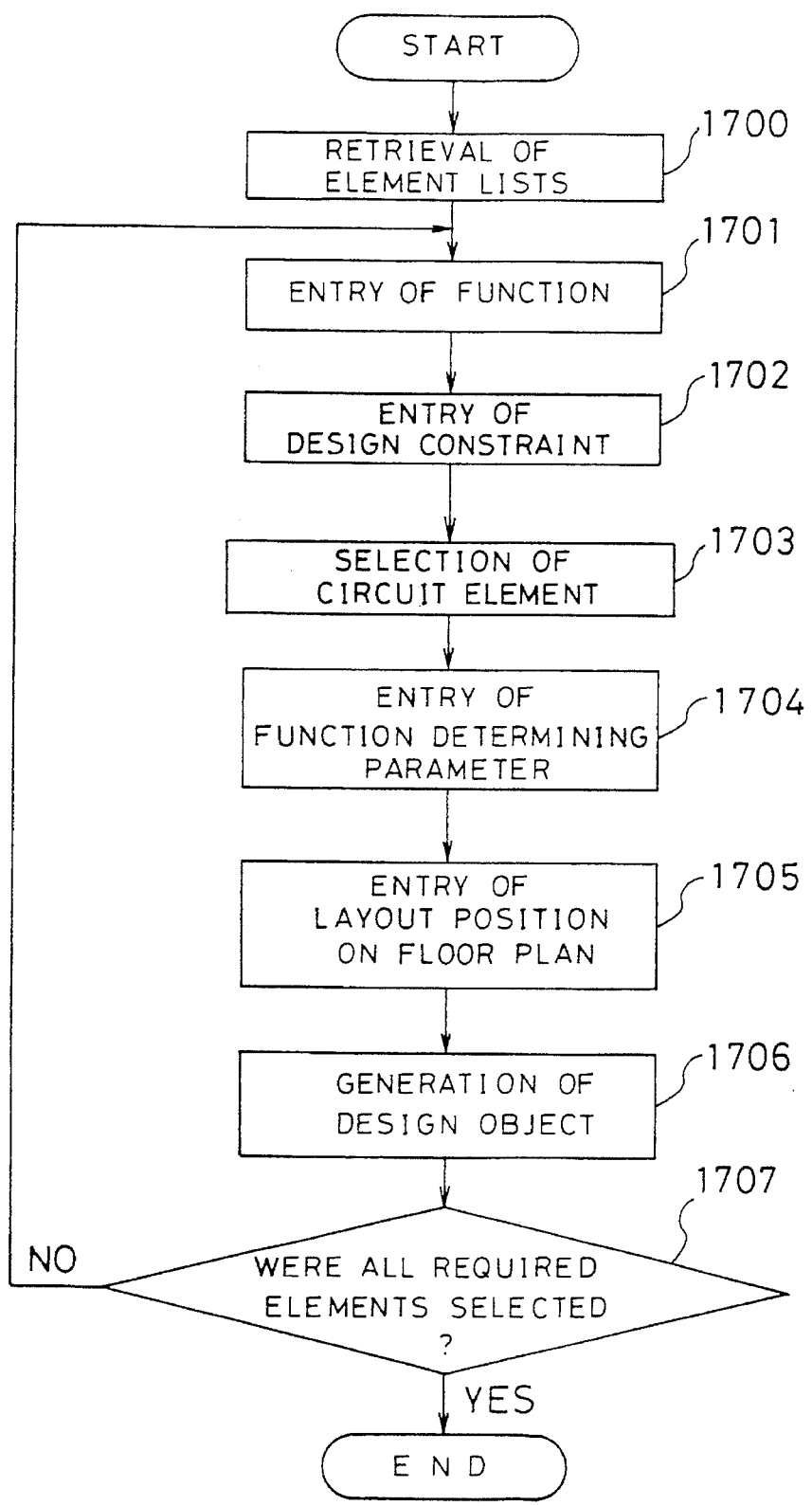
FIG. 17 is a detail flow chart of a circuit arrangement entering processing in FIG. 16.

FIG. 17 is the detail flow chart of the circuit arrangement entering step 1601 in FIG. 16. First, there are to be selected elements required for achieving a desired function. In this connection, at an element list retrieving step 1700, there are retrieved elements prepared for a design. At a function entering step 1701, there are entered the functions of the elements required for a circuit to be designed, thus further specifying elements to be selected. At a design constraint entering step 1702, there is entered information relating to the design constraints and the performance to be achieved by the specified elements. This further specifies elements to be selected. At an element selecting step 1703, there are selected elements to be used in the design, from the elements specified by the steps above-mentioned. Then, design objects are to be generated from the selected elements. At a step 1704, there are entered parameters for determining the actual functions of the elements selected at the step 1703. Accordingly, the elements selected at the step 1703, become elements of which functions have been determined. At a step 1705, there is entered information relating to the layout of the elements of which functions have been determined, such layout being determined with the floor plan taken into consideration. At a step 1706, design objects are generated from the elements selected based on the pieces of information above-mentioned. At a step 1707, it is finally judged whether or not there were entered all the elements required for achieving the desired function. In the negative, the sequence is returned to the step 1701, where there are entered such functional elements, successively. When the entry of information of all the required elements is finished, the circuit arrangement entering processing is complete.

Figure 18:
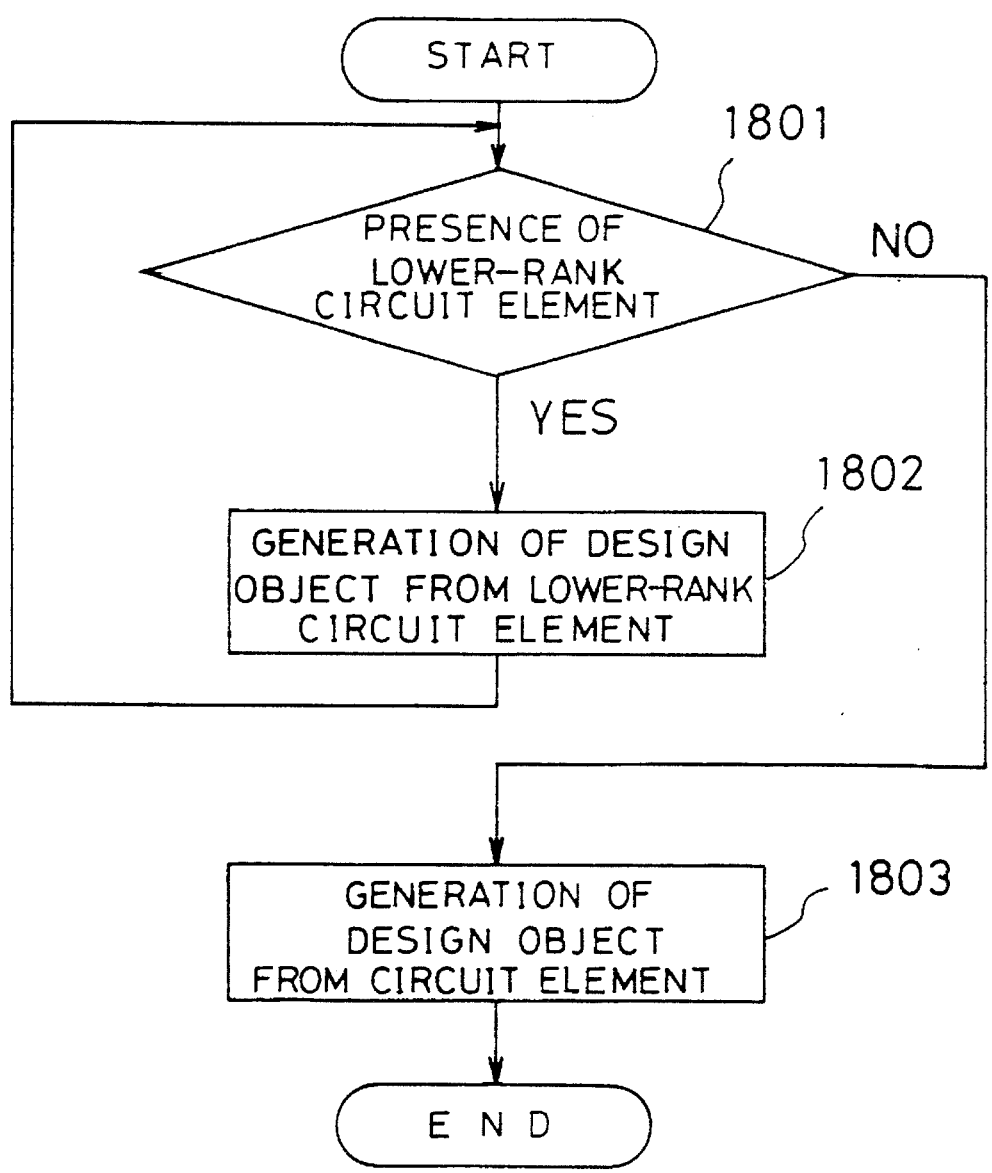
FIG. 18 is a detail flow chart of a design object generating processing in FIG. 17.

The following will discuss in more detail the processing at the design object generating step 1706 with reference to FIG. 18. There are instances where the elements selected at the step 1703 include elements each of which is designed in a rank structure. Accordingly, at a step 1801, it is judged whether or not each of the selected elements is designed in a rank structure and has lower-rank elements for which design objects have not been generated. In the affirmative, at a step 1802, there is generated a lower-rank design object from each of lower-rank circuit elements. By repeating the steps 1801 and 1802, there are generated lower-rank design objects from all the lower-rank elements of the selected elements. After it has been made sure at the step 1801 that there are no lower-rank elements for which design objects have not been generated, the sequence proceeds to a step 1803 where there are generated design objects of the selected elements themselves. Thus, there are finished the generation of design objects from the selected elements and design objects from the lower-rank elements forming such selected elements. When a lower-rank circuit element is further designed in a rank structure, such an element is regarded as a selected element and the processings above-mentioned are repeated in a recursive manner. Thus, predetermined all design objects are automatically generated.

Figure 19:
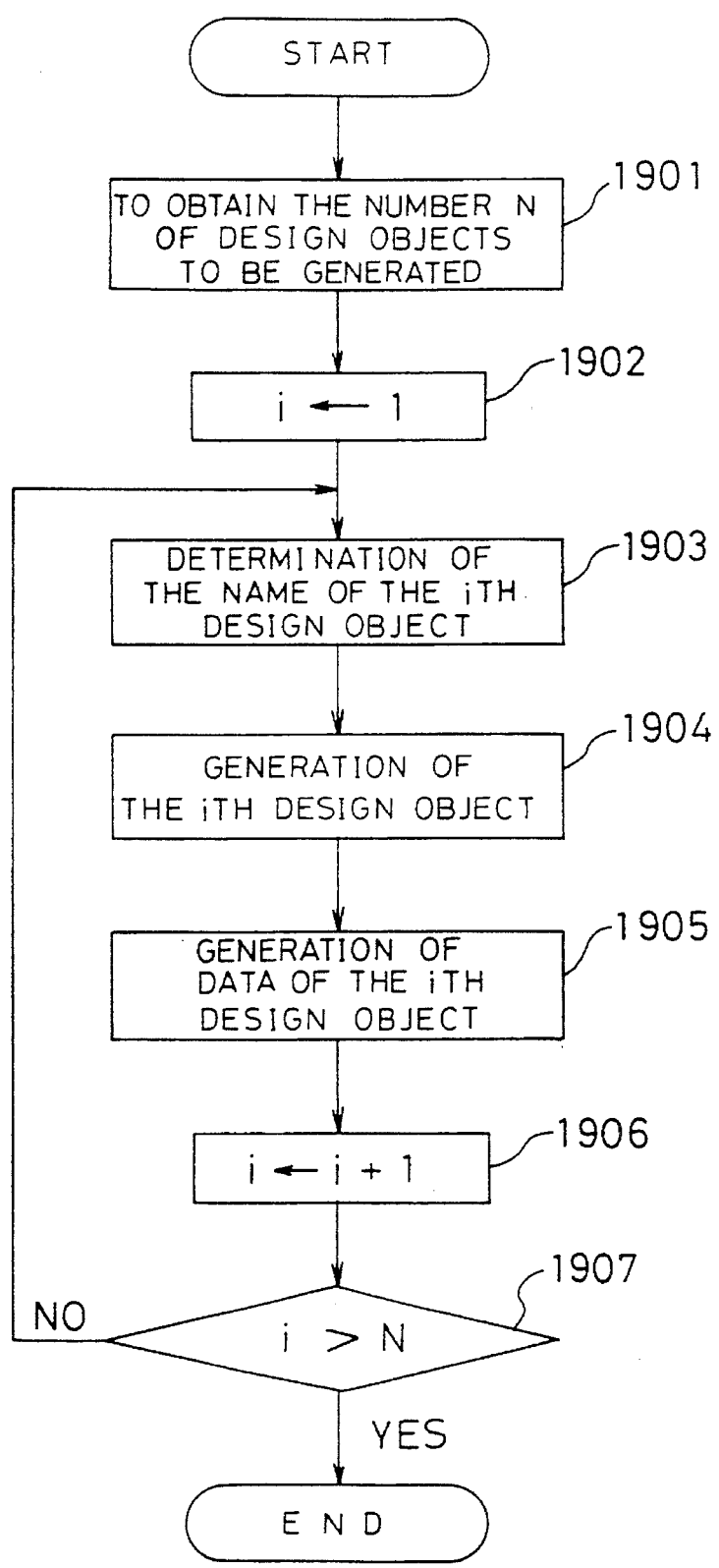
FIG. 19 is a detail flow chart of a design object generating processing in FIG. 18 when generating a plurality of design objects from the same element.

FIG. 19 is a detail flow chart of each of the design object generating steps 1802, 1803 when a plurality of design objects are generated from the same element.

At a step 1901, there is obtained the number N of design objects to be generated. There are instances where a plurality of design objects are generated from the same element, because different design objects are generated dependent on differences among function determining parameters, or because there are used a plurality of objects having the same function. At a step 1902, an initial value 1 is set to a variable i.

At a step 1903, the name of the ith design object is determined. It becomes possible to differentiate, by such names, design objects generated from the same element. At a step 1904, there is generated a design object having the name determined at the step 1903. In the design object at this stage, there are stored only information relating to a design procedure and information relating to a rank structure. At a step 1905, data of the design object are generated. Here, a data file of the element is changed according to function determining parameters, causing the data file to be data of the design object. Such data are made as a part of the design object, together with the information relating to the design procedure which has been previously stored. At a step 1906, "1" is added to the variable i. At a step 1907, judgment is made on the size of the variable i. Until the variable i becomes greater than the number N of design objects to be generated, there are repeated object generating steps on and after the step 1903.

According to the processings in FIG. 19 thus discussed, a plurality of design objects can be generated from the same and single element. This achieves an efficient function design and miniaturization of the design data memory means. It is therefore possible to automatically reuse existing elements, while such element reuse has been manually made in prior art.

Figure 23A:
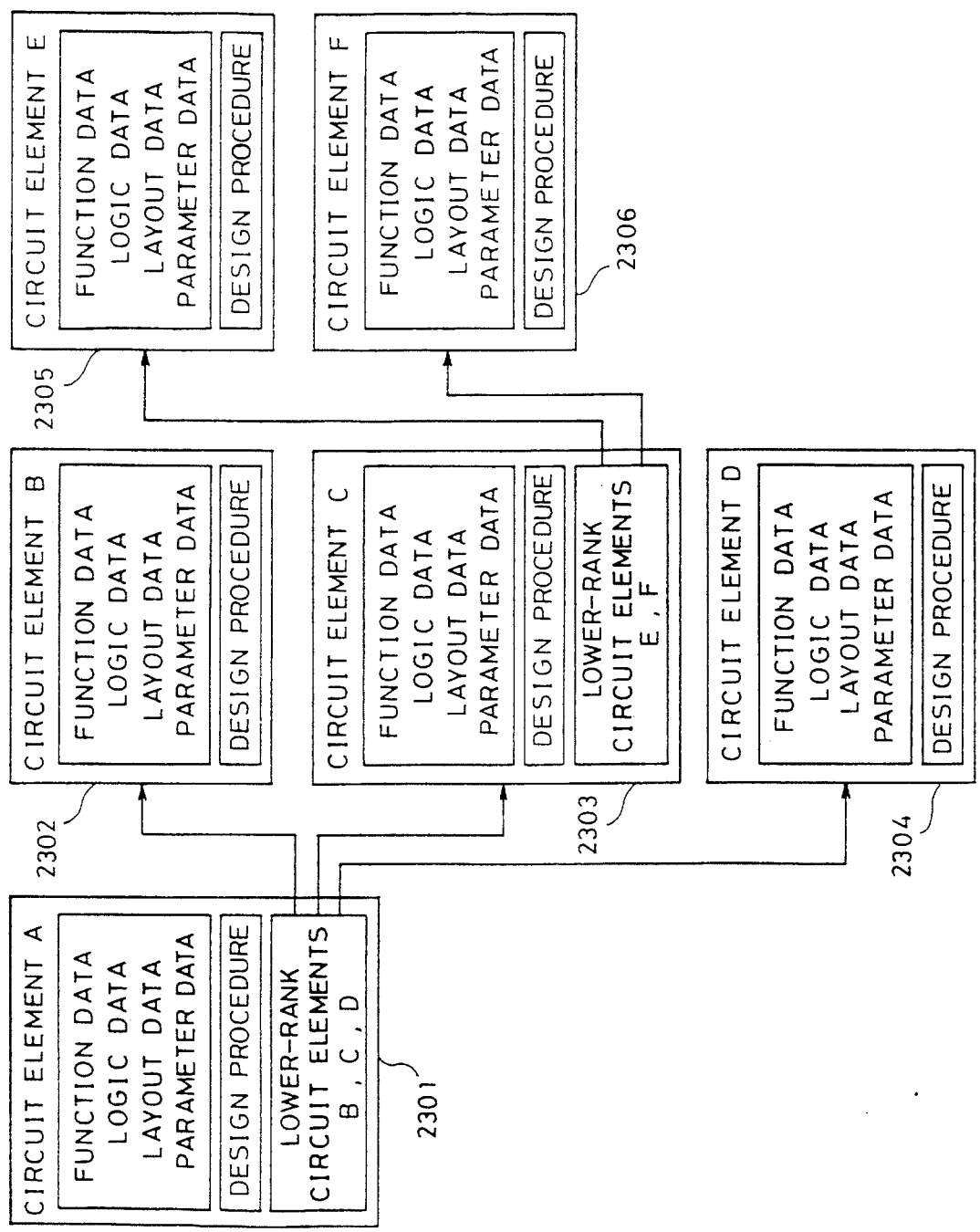
FIG. 23a is a view illustrating an example of elements stored in library element memory means in the LSI automated design system in FIG. 15a and FIG. 15b.
Figure 23B:
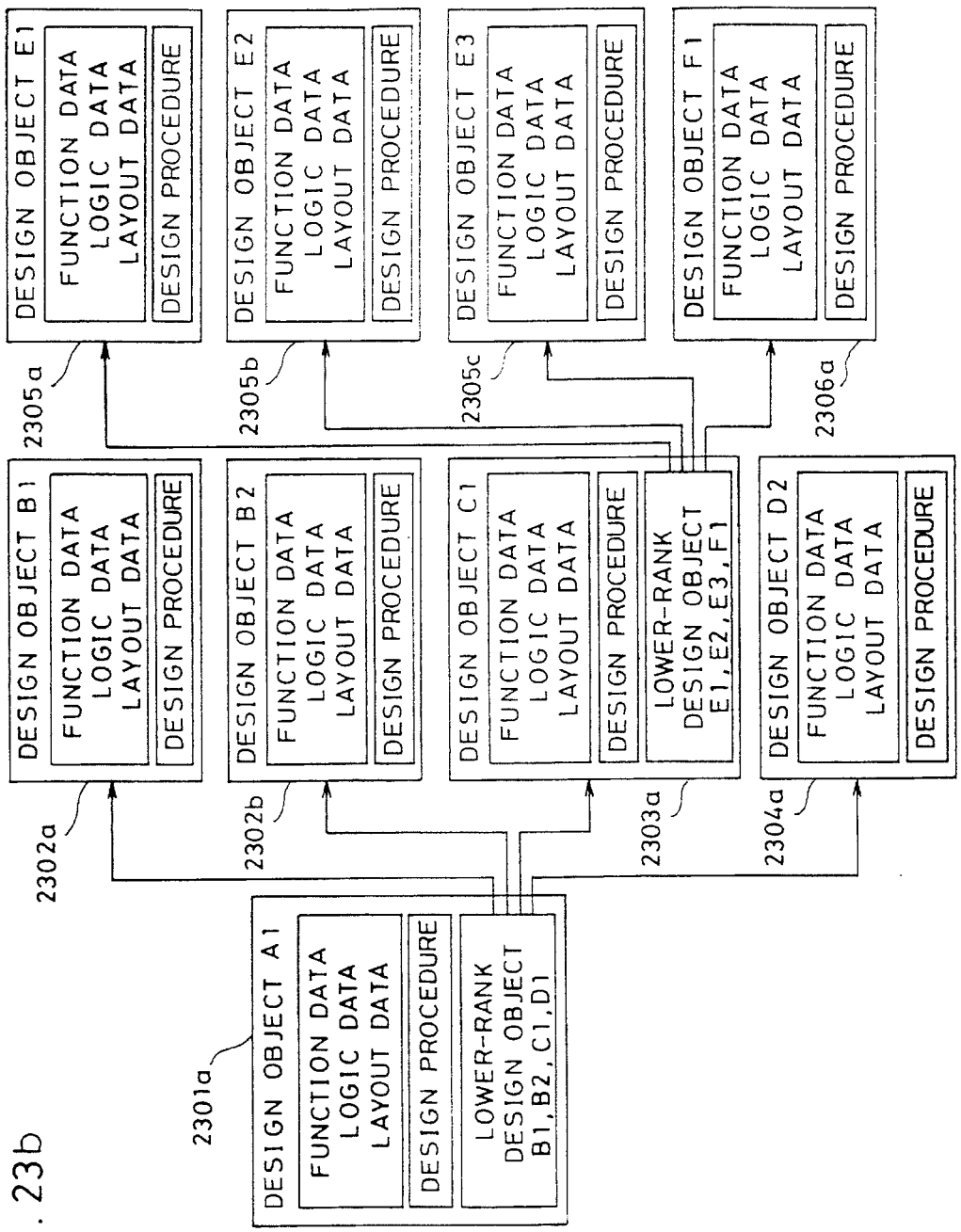
FIG. 23b is a view illustrating an example of design objects generated by the LSI automated design system in FIG. 15a and FIG. 15b.

FIG. 23a shows an example of an element stored in the library element memory means 101, and FIG. 23b shows an example of a design object generated from the stored element.

FIG. 23a shows an example of a circuit element designed in a rank structure. A circuit element A 2301 has a certain function, and has lower-rank circuit elements B, C, D. Further, the lower-rank circuit element C has lower-rank circuit elements E, F. Each of the circuit elements has information relating to circuit data, design procedure, lower-rank circuit elements and function determining parameters. Particularly, as to the information relating to the circuit data, each circuit element has areas for storing circuit data for each of the function, logic and layout levels. However, it is not required that all the data are necessarily being prepared. According to the arrangement above-mentioned, when the circuit element A is selected, it means that there are also selected the lower-rank circuit elements B, C, D, E, F which form the circuit element A.

It is intended to design a circuit satisfying a desired function by combining elements each having such an arrangement. FIG. 23b shows an example where a design object is generated from the circuit element A in FIG. 23a at the step 1706 in FIG. 17. A design object A1 2301a in FIG. 23b, is formed from the circuit element A 2301, and has lower-rank design objects B1, B2, C1, D1. Further, the lower-rank design object C1 generated from the lower-rank circuit element C, has lower-rank design objects E1, E2, E3, F1. Each of the design objects has information relating to circuit data of which function has been determined, design procedure, and lower-rank design objects. As apparent from the foregoing, a design object generated from a circuit element, succeeds to the information relating to the rank structure, the circuit data and the design procedure of the circuit element. As to the circuit data, it is possible to store the function-, logic- and layout-level circuit data generated at the design procedure executing step 1607 in FIG. 16, in the storage areas for the circuit data on the respective levels of each design object.

In fact, there are instances where a plurality of design objects are generated from one circuit element. Such an example is shown as follows. The design objects B1 2302a, B2 2302b are generated from the circuit element B 2302, and the design objects E1 2305a, E2 2305b, E3 2305c are generated from the circuit element E 2305. Each of circuit elements or design objects, has information relating to the one-rank lower circuit element or design object. Accordingly, when an upper-rank element is selected, it is possible to retrieve all lower-rank elements forming such an upper-rank element with the use of such rank information.

Figure 22:
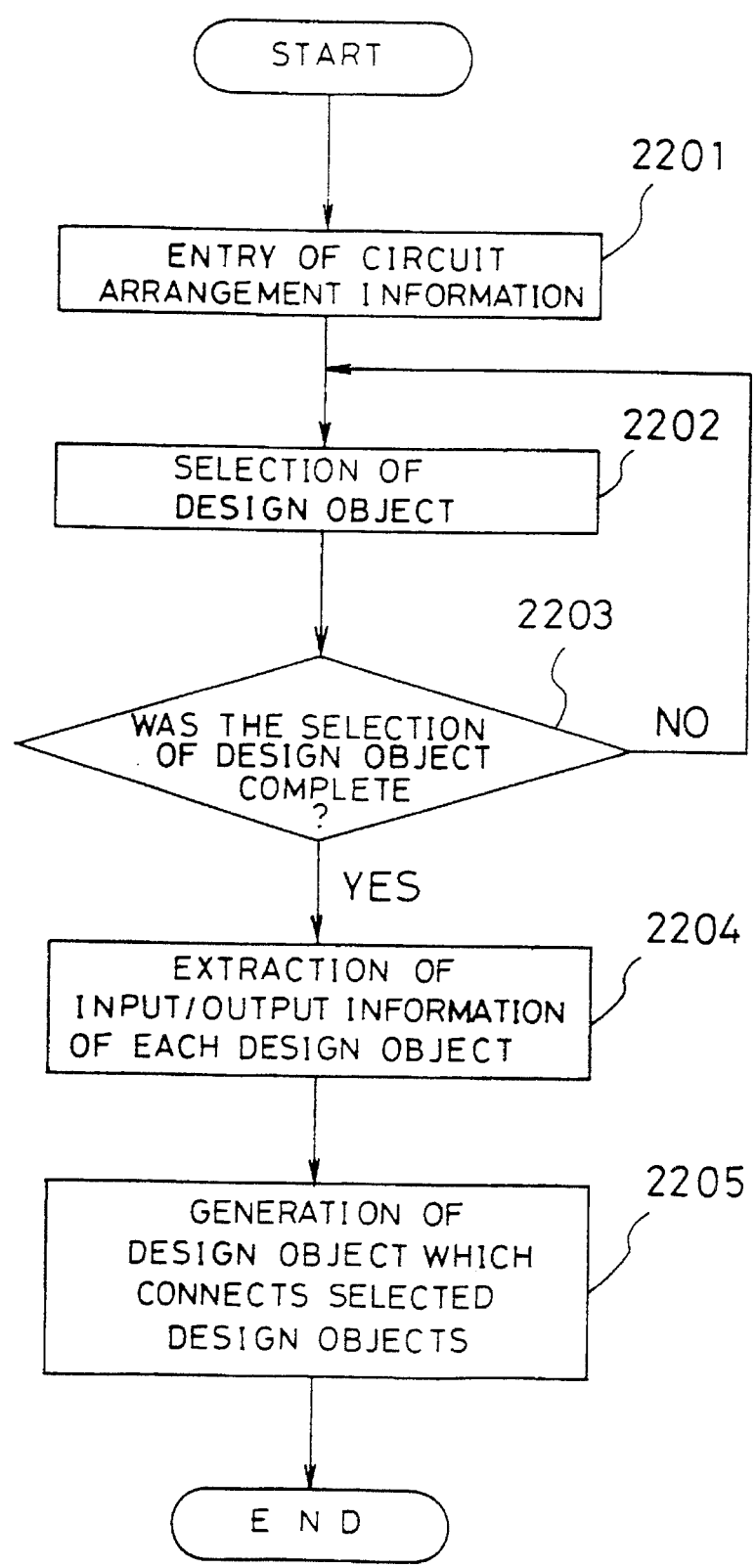
FIG. 22 is a detail flow chart of a processing for synthesizing a connection among design objects in FIG. 16.

FIG. 22 is a detail flow chart of the design-object connection generating step 1605 in FIG. 16. At a circuit arrangement information entering step 2201, there is entered, from the circuit arrangement information memory means 109, information relating to the design objects forming the circuit. At a design object selecting step 2202, there is selected, from the design objects forming the circuit, each of design objects which are required to be connected and integrated. At a step 2203, it is judged whether or not the selection of all required design objects was complete. In the negative, the sequence is returned to the step 2202, where each of necessary design objects is to be selected. In the affirmative, the sequence proceeds to a step of extracting input/output information of each design object 2204. At the step 2204, there is extracted information relating to input/output of all design objects selected from the design objects generated by the design object generating means 120. At a step 2205, there is generated, based on the information thus extracted, a design object for connecting the selected design objects.

Figure 20:
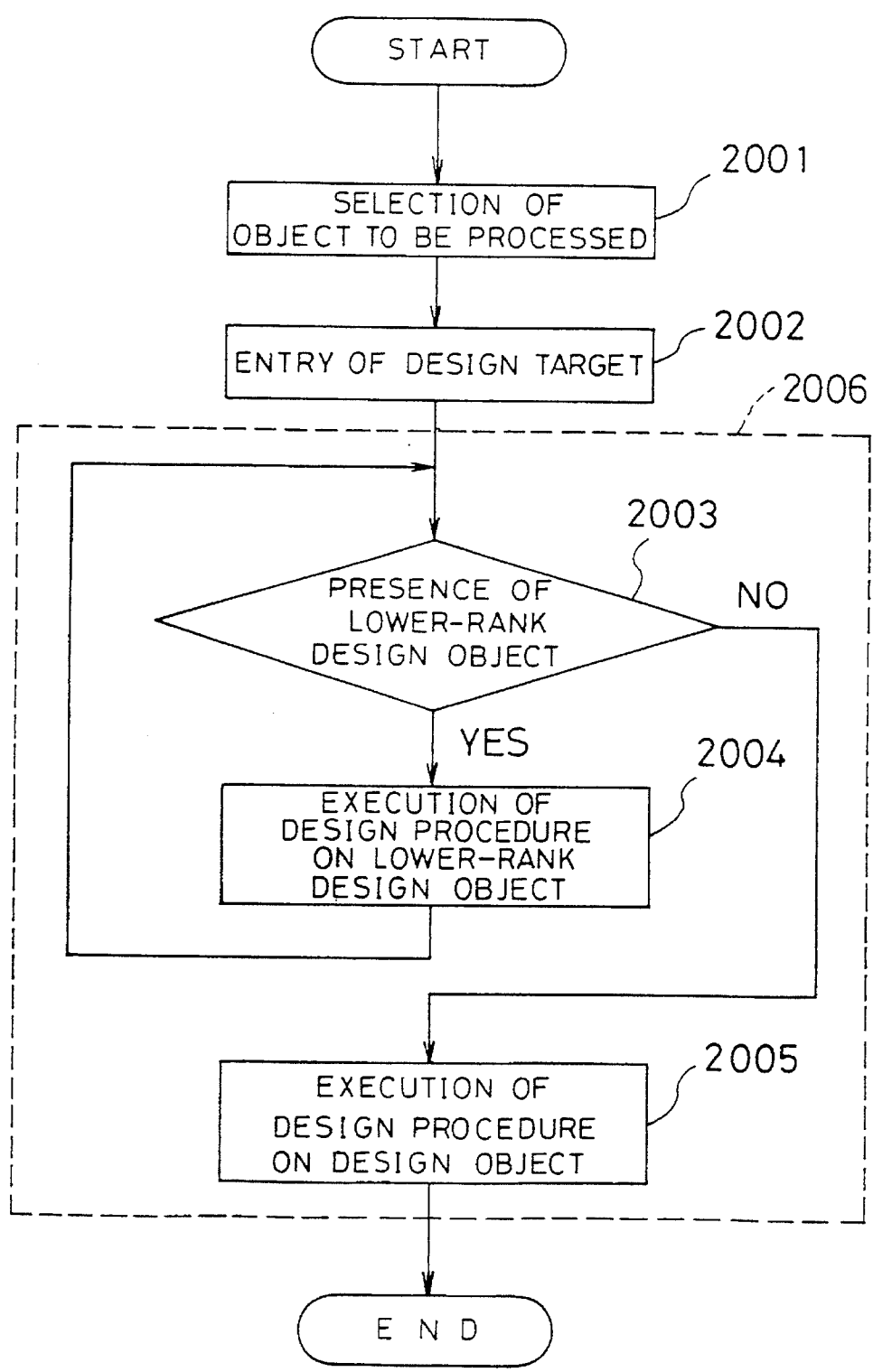
FIG. 20 is a detail flow chart of a design procedure executing processing in FIG. 16.

FIG. 20 is a detail flow chart of the design procedure executing step 1607 in FIG. 16. At a step 2001, there are selected objects to which design procedures are executed. Here, it is possible to select all the design objects forming the circuit, individual design objects or lower-rank design objects. At a step 2002, there is entered a design target serving as a target to be processed. The design target to be entered, refers to the final data level when a design processing is forwarded, and to information indicating a design level of verification when a verifying processing is executed. According to the information thus entered, design procedures are to be executed on objects. At a step 2003, it is judged whether or not a design object serving as an object to be processed has lower-rank design objects to which design procedures have not been executed. In the affirmative, at a step 2004, design procedures are executed on lower-rank design objects. By repeating the steps 2003, 2004, there can be finished the execution of the design procedures on (i) the design objects serving as objects to be processed and (ii) the lower-rank design objects forming each of the design objects. At this time, when any of the lower-rank design objects further has lower-rank design objects, the last-mentioned lower-rank design objects are regarded as design objects to be processed, and the step 2006 is repeated in a recursive manner at the steps 2004. Thus, design procedures can be executed on all the design objects forming the design objects serving as objects to be processed. With the processings above-mentioned, merely by setting the design procedure to an upper-rank design object, design procedures can be executed on all the design objects forming such an upper-rank design object.

Figure 21:
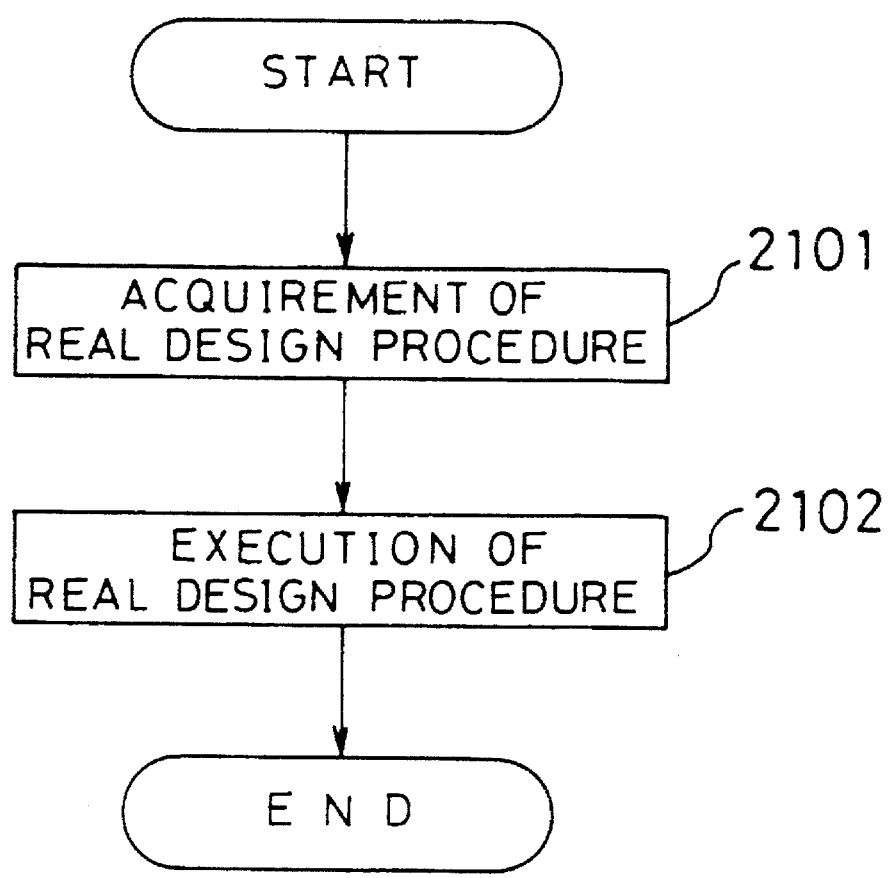
FIG. 21 is a detail flow chart of a design procedure executing processing at each of steps 2004 and 2005 in FIG. 20.

FIG. 21 shows a detail flow chart of the design procedure executing processing at each of the steps 2004, 2005 in FIG. 20. Each design object has a real design procedure indicating tools to be actually used, parameters with which tools are used, the order in which tools are applied, and the like, in order to achieve the design target entered at the step 2002. Accordingly, at a step 2102, such a real design procedure is acquired. At a step 2102, the real design procedure thus acquired at the step 2102, is executed. It is therefore possible to obtain circuit data on a desired level without no special attention paid on the design data and the optimum design procedure of each design object. When the design target entered at the step 2002 refers to a verification level, each real design procedure includes (i) a design procedure according to which data are converted to data on the level at which verification is conducted, and (ii) procedure for giving, to verifying tools, information indicating where circuit data to be verified are located.

Figures 1, 2, 24B:
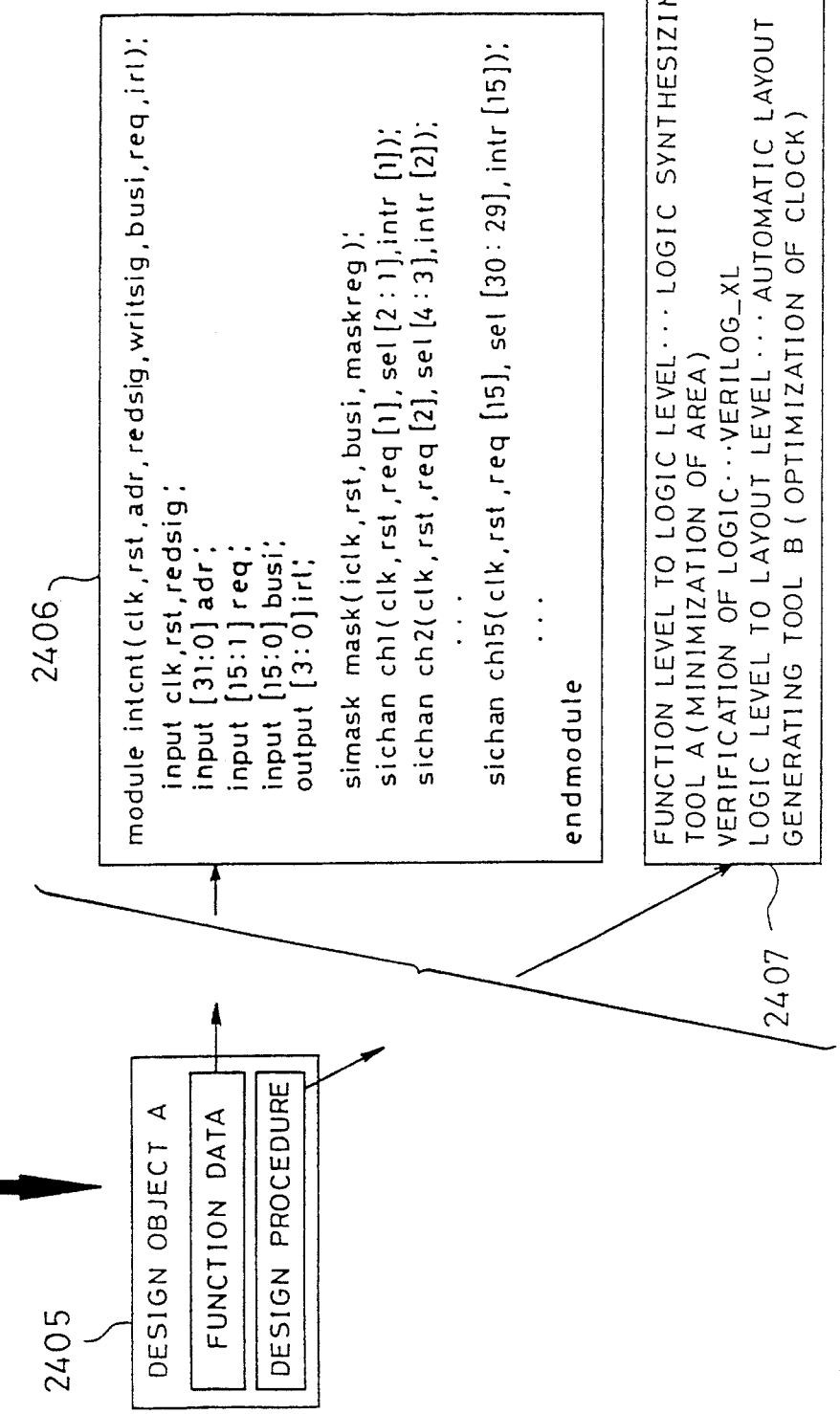

Here, with reference to FIGS. 24a to 24c, the following will discuss a specific example of an LSI design using the LSI automated design system in FIG. 15a and FIG. 15b. In FIG. 24a, a circuit element A (2401) is one of the elements stored in the library element memory means 101. The circuit element A has (i) a function description serving as circuit data in the form of parameters, as shown at 2402, (ii) information serving as conversion information relating to parameters to be set for determining a function, as shown at 2403, and (iii) information relating to design procedure as shown at 2404. This element A is adapted to be selected by the element arrangement entering means 105, and a design object is to be generated therefrom. When parameters are given to the parameter information at 2403, there is generated, as shown in FIG. 24b, a design object A (2405) of which function has been determined. This design object A has, as logic-level circuit data, (i) a function description 2406 of which function has been determined and which has been generated by operating parameters on the function description 2404, and (ii) a design procedure 2407 according to which the data are converted. In this example, "15" is set to a parameter variable NUM to control the bit width and the number of repeat times. While disposing this design object with the floor plan taken into consideration as shown in FIG. 14, the design is forwarded.

Then, when a conversion instruction is given to the design object A, there is executed a processing of converting the design object A into actual circuit data. FIG. 24c shows a design object conversion result 2501 obtained when the design object A receives a conversion instruction of converting data into layout data. In fact, the processing is executed by selecting the design object A on a display on which the layout in FIG. 14 is displayed, and by giving a target level of layout to the design object A. The processing is to be executed on the function description 2406 according to the design procedure set at 2407. First, a logic synthesizing tool A is operated on the function description 2406 (2502) under the conditions that the area is minimized.

There is thus generated a logic diagram shown at 2503. Then, an automatic layout generating tool B is operated on this logic diagram data 2503 under the conditions that priority is given to wiring of clock lines, thus generating layout data 2504.

Thus, merely by selecting elements, giving parameters for achieving a desired function and setting the final target, the desired circuit can be designed without special attention paid on circuit data in the course of the design work. Further, the generated data become circuit data satisfying the desired performance by reusing the optimum design procedures.

Figure 25:
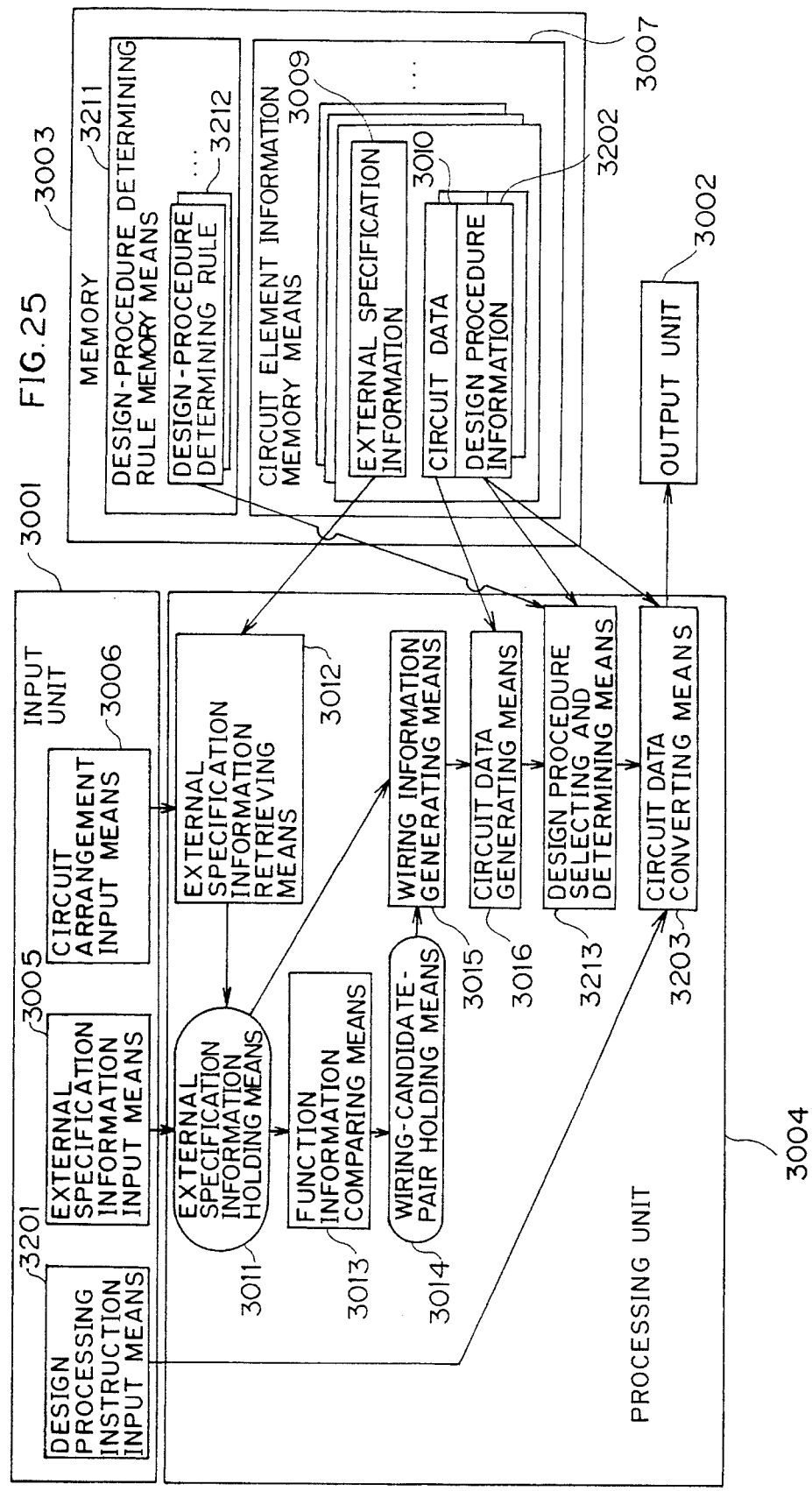
FIG. 25 is a view of the arrangement of an LSI automated design system according to a further embodiment of the present invention.

FIG. 25 is a view of the arrangement of an LSI automated design system according to a further embodiment of the present invention. The following description will discuss mainly the detailed arrangement of the element synthesizing means 107 in FIG. 1a.

In FIG. 25, an input unit 3001 has (i) external specification information input means 3005 for entering external specification information of a circuit to be designed with the use of the present system, this external specification information including function information of each of the terminals of the circuit to be designed, (ii) circuit arrangement input means 3006 for entering a combination arrangement of circuit elements of already designed circuits to be reused, and (iii) design processing instruction input means 3201 for instructing the execution of a design processing for converting circuit data to other circuit data of a level closer to the mounting level.

An output unit 3002 is arranged to supply the resulting circuit data designed by this design system.

A memory 3003 has circuit element information memory means 3007 containing information of the circuit elements of the already designed circuits. More specifically, the information of the circuit elements refers to external specification information 3009, circuit data 3010 and design procedure information 3202 about the procedure of design processings such as a circuit data converting processing and the like. The external specification information 3009 includes function information about each of the terminals of the circuit elements, and selection information about a wiring condition for each of the terminals. As the circuit data 3010, there are stored function-level data called hardware description language, one or more already designed data such as a net list of the logic level, schematic data of the mask layout level and the like. The circuit arrangement input means 3006 may be formed, for example, by an editor or the like for selecting and arranging, one by one, names or block symbols representing circuit elements stored in the memory 3003. Information about circuit elements may be stored, in the form of a combination of a plurality of pieces of information, in the memory 3003. In such a case, the circuit arrangement input means 3006 is adapted to select a single circuit-element set formed by a plurality of circuit elements.

The memory 3003 has design-procedure determining rule memory means 3211 containing design-procedure determining rules 3212 for determining, based on design procedure information 3202 of circuit elements, design procedure information for a circuit which connects the circuit elements to one another.

The external specification information of a circuit to be designed, which has been entered by the external specification information input means 3005, is held by external specification information holding means 3011 of a processing unit 3004. On the other hand, based on the arrangement of circuit elements forming the circuit to be designed which has been entered by the circuit arrangement input means 3006, external specification information retrieving means 3012 retrieves the external specification information 3009 of the circuit elements serving as the component elements of the circuit to be designed, which external specification information is stored in the circuit element information memory means 3007. The external specification information of the component elements is also held by the external specification information holding means 3011. Function information comparing means 3013 obtains, based on the pieces of external specification information thus held, pairs of wiring candidates in which input terminals and output terminals of the circuit to be designed or the circuit elements serving as the component elements thereof, are identical in function with each other, and information relating to these pairs of wiring candidates is stored in wiring-candidate-pair holding means 3014. Wiring information generating means 3015 finds, out of these pairs of wiring candidates, a pair of wiring candidates satisfying a wiring condition specified by the selection information of the external specification information, thereby to generate wiring information of a circuit which connects the circuit elements to one another. Circuit data generating means 3016 generates circuit data of the circuit to be designed, with the use of the circuit data 3010 of the component elements. Out of the circuit data thus generated, a design procedure to be applied to each of the component elements, is selected by design procedure selecting and determining means 3213. Out of the circuit data thus generated, a design procedure of the circuit which connects the circuit elements to one another, is determined, according to the design-procedure determining rules 3212, by the design procedure selecting and determining means 3213. The circuit data of the circuit to be designed are supplied as desired circuit data such as a logic net list, layout data or the like, by executing, with the use of circuit data converting means 3203, a design processing specified by the design processing instruction input means 3201, according to the selected design procedure information 3202 and the determined design procedure.

Figure 26:
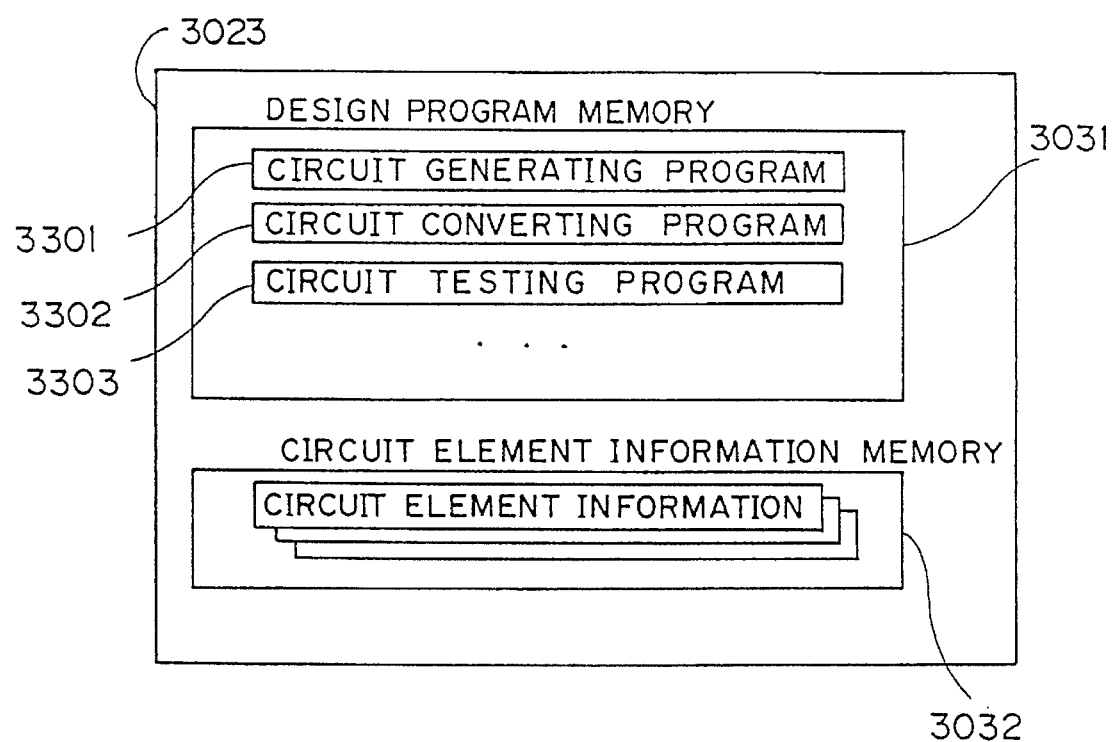
FIG. 26 is a view illustrating the inner arrangement of a memory device forming the memory in FIG. 25.

FIG. 26 is a view illustrating the inner arrangement of a memory device 3023 forming the memory 3003 in FIG. 25. A design program memory 3031 contains a circuit generating program 3301, a circuit converting program 3302, a circuit testing (verifying) program 3303 and the like. A circuit element information memory 3032 contains the circuit element information discussed in connection with FIG. 25.

Figure 27A:
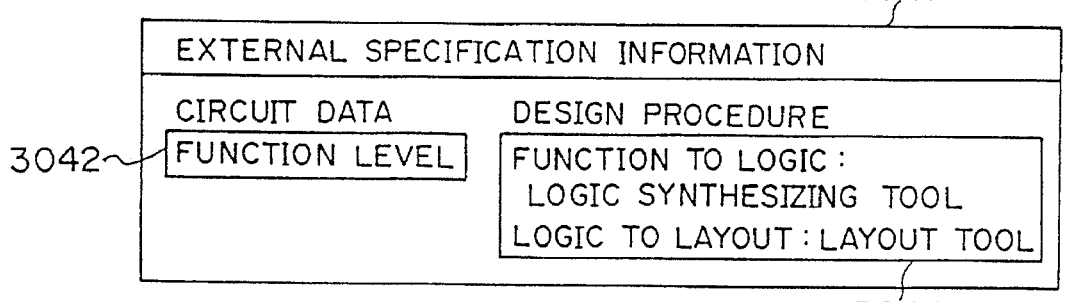
FIG. 27a to FIG. 27c are views illustrating examples of three pieces of circuit element information stored in the circuit element memory in FIG. 26.
Figure 27B:
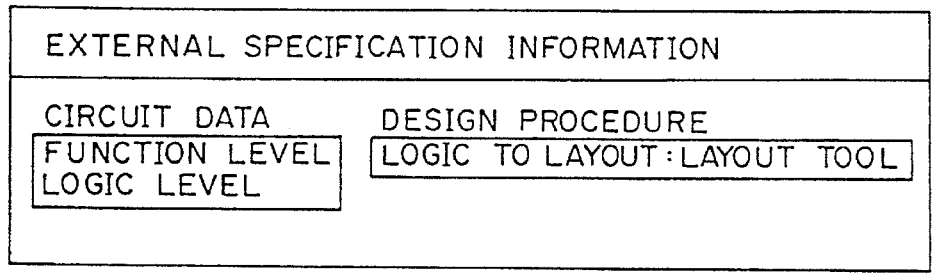
Figure 27C:
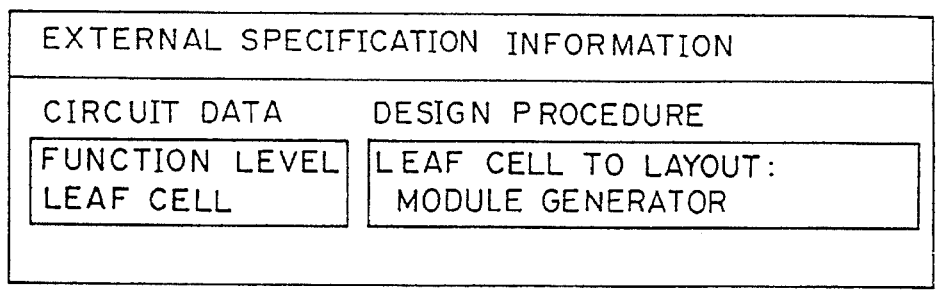

FIG. 27a to FIG. 27c are views illustrating examples of the circuit element information stored in the circuit element information memory 3032. For a circuit element A shown in FIG. 27a for example, there are stored (i) external specification information 3041, (ii) function-level data as circuit data 3042, and (iii) information representing that a logic synthesizing tool is used in a circuit data converting processing from the function level to the logic level, and that a layout tool is used in a circuit data converting processing from the logic level to the layout level, this last-mentioned information serving as design procedure information 3043.

Figures 28, 29:
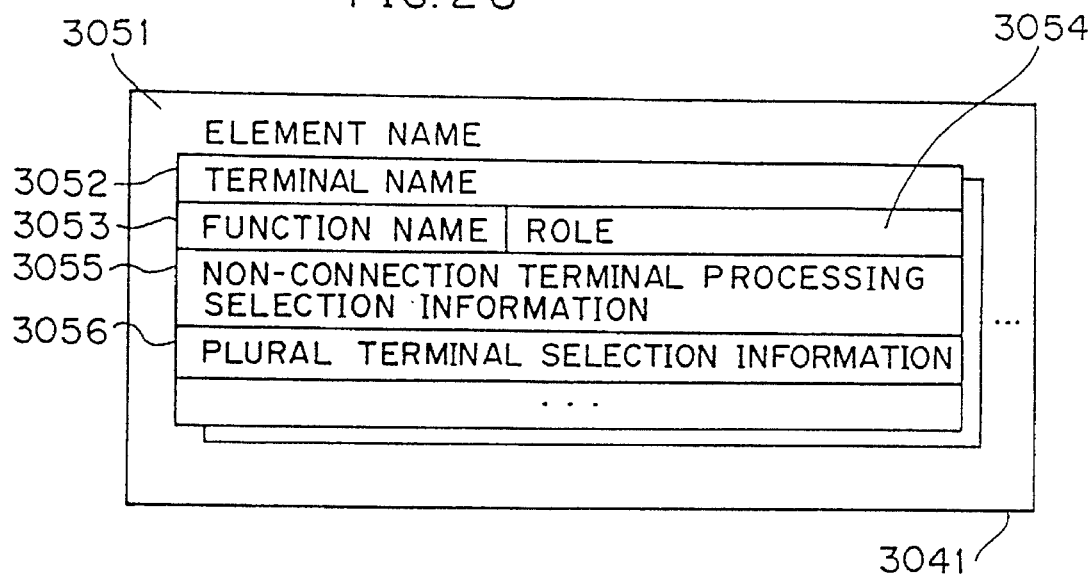
FIG. 28 is a view illustrating an example of the external specification information in each of FIG. 27a to FIG. 27c.
FIG. 29 is a view illustrating the meaning of each code number of the terminal role information in FIG. 28.

FIG. 28 is a view illustrating an example of the external specification information 3041. The external specification information 3041 contains the name of a circuit element 3051, a terminal name 3052 classified per function of the circuit element, and information defined for each terminal. For each terminal, there are stored (i) function information including (a) a function name 3053 and (b) terminal role information 3054 which indicates whether the terminal is a signal receiver or a signal transmitter, and (ii) selection information including (a) non-connection terminal processing selection information 3055 and (b) plural terminal selection information 3056. Each of the terminal role information 3054, the non-connection terminal processing selection information 3055 and the plural terminal selection information 3056 is stored in the form of code Nos.

FIG. 29 shows the meanings of the code Nos. of the terminal role information 3054. A code No. 0 represents that the terminal plays a role of a signal receiver. A code No. 1 represents that the terminal plays a role of a signal transmitter, and a code No. 2 represents that the terminal plays a role of both a signal receiver and a signal transmitter. In a circuit, an input terminal (in-port) is defined such that the code No. is 0, an output terminal (out-port) is defined such that the code No. is 1, and an input/output terminal (i/o-port) is defined such that the code No. is 2.

FIG. 30 shows the meanings of the code Nos. of the non-connection terminal processing selection information 3055. The non-connection terminal processing selection information refers to information which defines a processing to be executed on a terminal for which no matching terminal has been found in a function information comparing processing. A code No. 0 represents that, when the non-connection terminal is an input terminal or an input/output terminal, the non-connection terminal is left as non-connected, and that, when the non-connection terminal is an output terminal, the non-connection terminal is grounded or connected to the positive logic 0. A code No. 1 represents that the non-connection terminal is unconditionally grounded. A code No. 2 represents that the non-connection terminal is unconditionally connected to the power source or the positive logic 1. A code No. 3 represents that the non-connection terminal is unconditionally left as non-connected.

FIG. 31 shows the meanings of the code Nos. of the plural terminal selection information 3056. The plural terminal selection information refers to information which determines a matching terminal to which the terminal is to be connected when there are found, in a function information comparing processing, a plurality of matching terminal candidates to be connected. A code No. 0 represents that the terminal is connected to all terminals each having function information identical with that of the terminal. A code No. 1 represents that the terminal is connected to only the terminal which has been first found. A code No. 2 represents that the terminal is unconditionally not connected. A code No. 3 represents that a multiplexer (MUX) is to be inserted when the function information of each of a plurality of output terminals is identical with the function information of one input terminal.

Figure 32A:
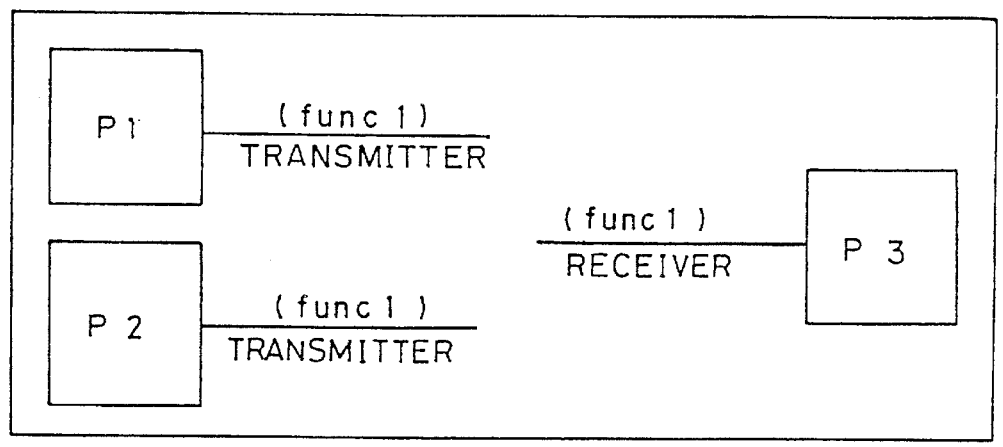
FIG. 32 is a view illustrating the meaning of a multiplexer inserting processing when the code number of the plural terminal selection information is equal to 3.
Figure 32B:
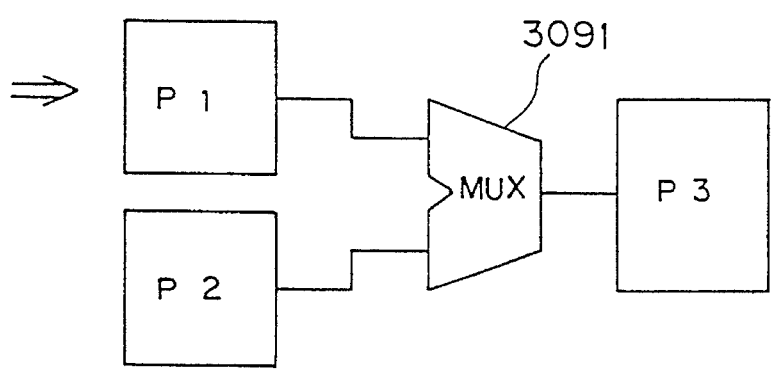

FIG. 32 is a view illustrating a multiplexer inserting processing. When each of circuit elements P1, P2 has a transmitting terminal of which function name is "func1", and a circuit element P3 has a receiver terminal of which function name is "func1", a multiplexer 3091 is inserted between the circuit elements P1, P2 and the circuit element P3 when the code No. of the plural terminal selection information of the receiver terminal of the P3 side is equal to 3.

Figure 33:
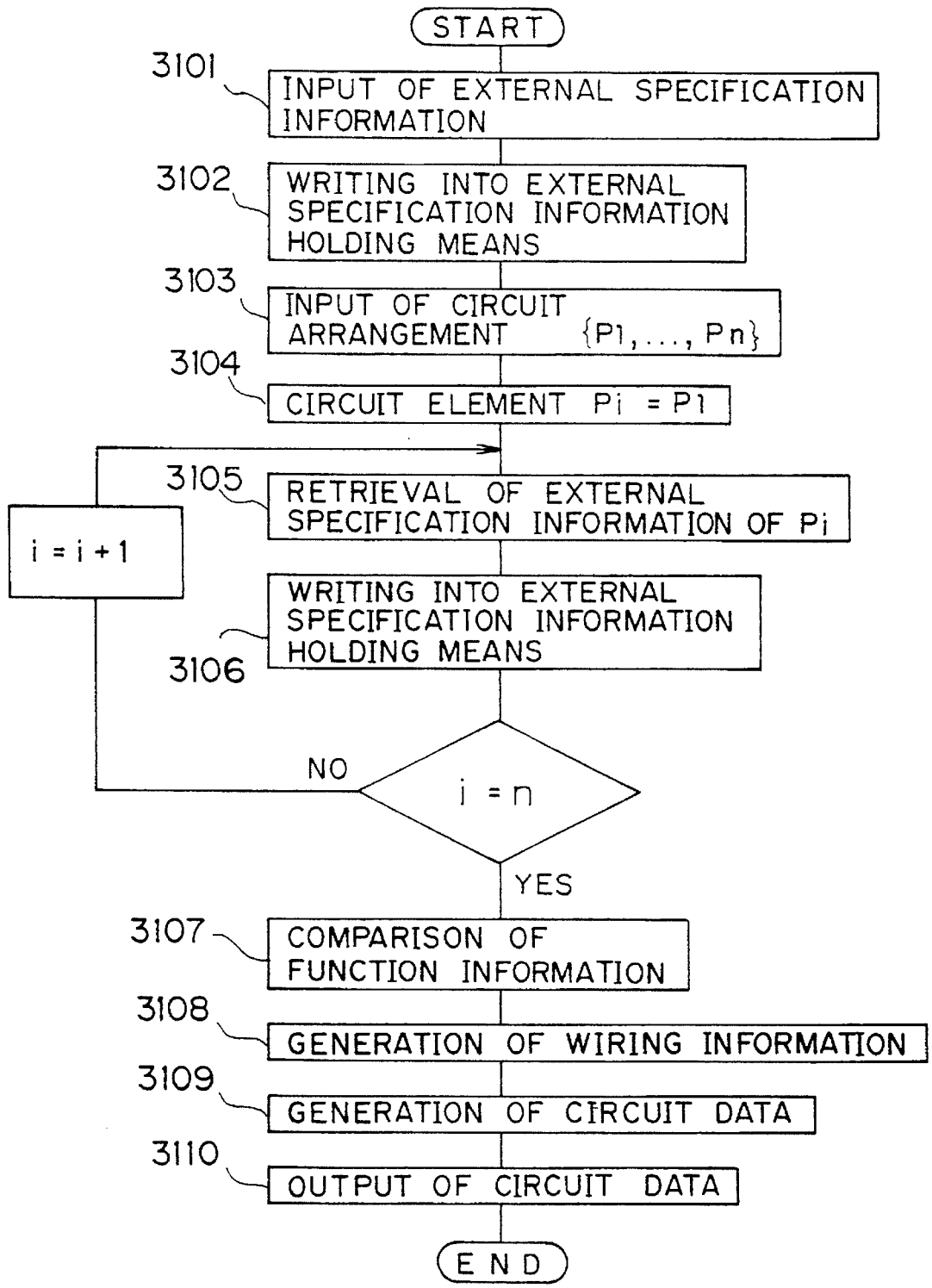
FIG. 33 is a flow chart of the LSI automated design system in FIG. 25.

FIG. 33 is a flow chart of processings of the LSI automated design system in FIG. 25. With reference to FIG. 25, the following description will discuss the entire operation of the LSI automated design system along the flow chart in FIG. 33.

At an external specification information input step 3101, the external specification information of a circuit to be designed is entered. At a step 3102, the contents of the external specification information are held by the external specification information holding means 3011. At a circuit arrangement input step 3103, there is entered an element arrangement {P1, ..., Pn} of the circuit to be designed. P1, ..., Pn refer to n-piece circuit elements forming the circuit to be designed. At a step 3104, the initial value 1 is set to a variable i such that there is selected, out of the n-piece circuit elements, a circuit element Pi of which external specification information is to be retrieved.

At an external specification information retrieving step 3105, the external specification information 3009 of the circuit element Pi is retrieved from the circuit element information memory means 3007. At a step 3106, the contents of the external specification information 3009 thus retrieved are held by the external specification information holding means 3011. The external specification information retrieving and writing steps are executed for all the n-piece circuit elements.

At a function information comparing step 3107, there is executed a comparing processing on the function information of each terminal in the external specification information held by the external specification information holding means 3011, i.e., the function name 3053 and the role information 3054 of each terminal, thereby to obtain pairs of wiring candidates. At a wiring information generating step 3108, a specific pair of wiring candidates is selected from the pairs of wiring candidates obtained at the step 3107. More specifically, based on the selection information of the external specification information, i.e., based on the non-connection terminal processing selection information 3055 and the plural terminal selection information 3056, there is generated wiring information of a circuit which connects the circuit elements to one another. At a circuit data generating step 3109, there are generated, based on (i) the circuit data 3010 of the circuit elements forming the circuit to be designed and (ii) the circuit wiring information generated at the step 3108, circuit data of the circuit which connects the circuit elements to one another, and circuit data of the circuit to be designed are obtained by synthesizing the circuit data of the circuit elements and the circuit data of the circuit which connects the circuit elements to one another. At a step 3110, the circuit data obtained at the step 3109 are supplied.

In the processing flow chart in FIG. 33, the circuit data of the circuit to be designed obtained at the step 3109, are supplied, as they are, at the step 3110. In the design system shown in FIG. 25, however, the circuit data are entered into the circuit data converting means 3203 for converting the circuit data into circuit data of a level closer to the mounting level. As will be discussed later, the circuit data may also be so entered as to be subjected to a circuit testing (verifying) processing.

In this embodiment, the wiring information generating processing is carried out after all pairs of wiring candidates have been obtained at the function information comparing step 3107. However, each time a function information comparing processing is executed, wiring information may be generated with reference to selection information.

Figure 34:
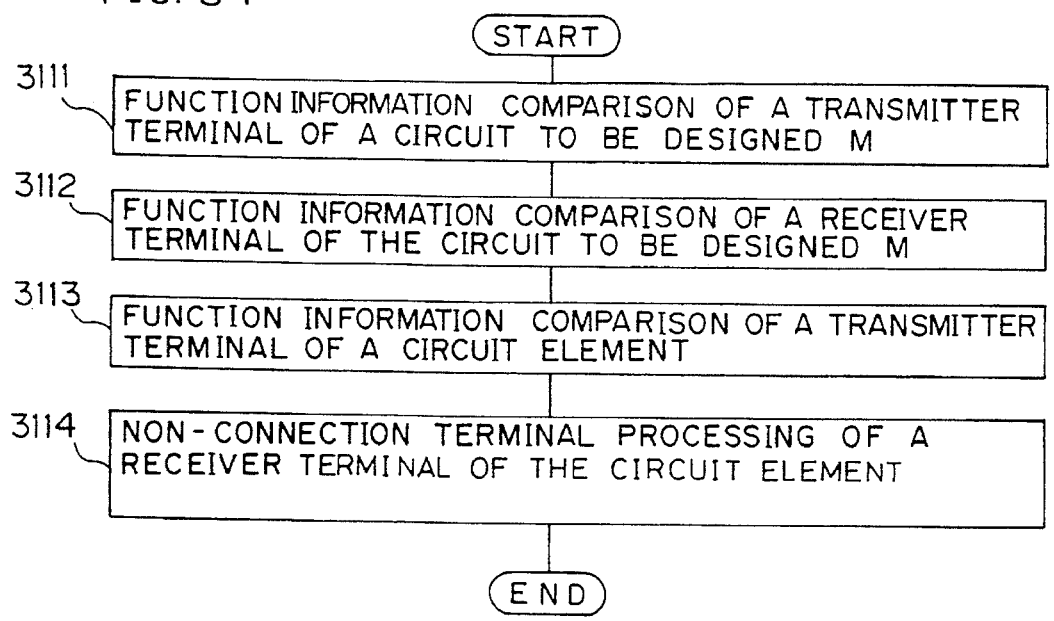
FIG. 34 is a detailed flow chart of the function information comparing processing in FIG. 33.

FIG. 34 is a detailed flow chart of the function information comparing step 3107 in FIG. 33.

The comparison of function information for obtaining pairs of wiring candidates is made firstly on a transmitter terminal (external output terminal) of the circuit to be designed M, secondly on a receiver terminal (external input terminal) of the circuit to be designed M and thirdly on a transmitter terminal (internal output terminal) of a circuit component element. Thereafter, there are executed processings including a processing on a receiver terminal (internal input terminal) of a circuit component element which has not been included in the pairs of wiring candidates. More specifically, at a step 3111, there is executed a function information comparing processing on a transmitter terminal of the circuit to be designed M. At a step 3112, there is executed a function information comparing processing on a receiver terminal of the circuit to be designed M. At a step 3113, there is executed a function information comparing processing on a transmitter terminal of each of circuit elements {P1, ..., Pn} which form the circuit to be designed M. At a step 3114, there are executed processings including a non-connection terminal processing on a receiver terminal which is included in the receiver terminals of the circuit elements {P1, ..., Pn} forming the circuit to be designed M and which is not included in the pairs of wiring candidates at the steps 3112 and 3113.

Figure 35:
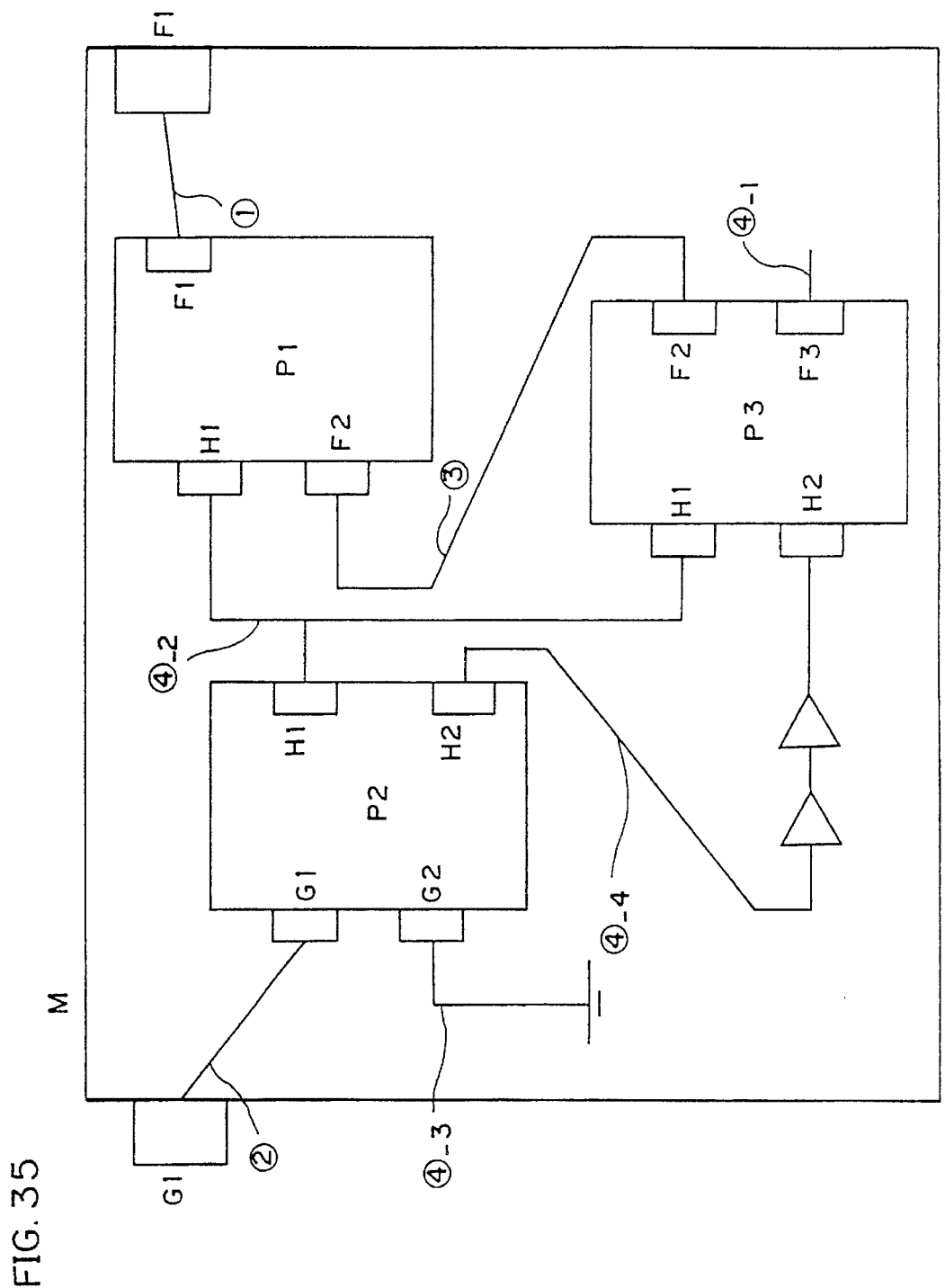
FIG. 35 is a view illustrating a specific example of the function information comparing processing in FIG. 33.

FIG. 35 shows a specific example of the function information comparing processing. The circuit to be designed M comprises three circuit elements P1, P2, P3. The sequence proceeds in order of functional comparison of an external output terminal F1, functional comparison of an external input terminal G1, and functional comparison of an internal output terminal F2. Thereafter, there are executed a processing on an internal output terminal F3 with the use of the non-connection terminal processing selection information 3055, a processing on an internal input terminal H1 with the use of the plural terminal selection information, a processing on an internal input terminal G2 with the use of the non-connection terminal processing selection information 3055, a processing for optimizing the timing of an internal terminal H2, and the like.

Figure 36:
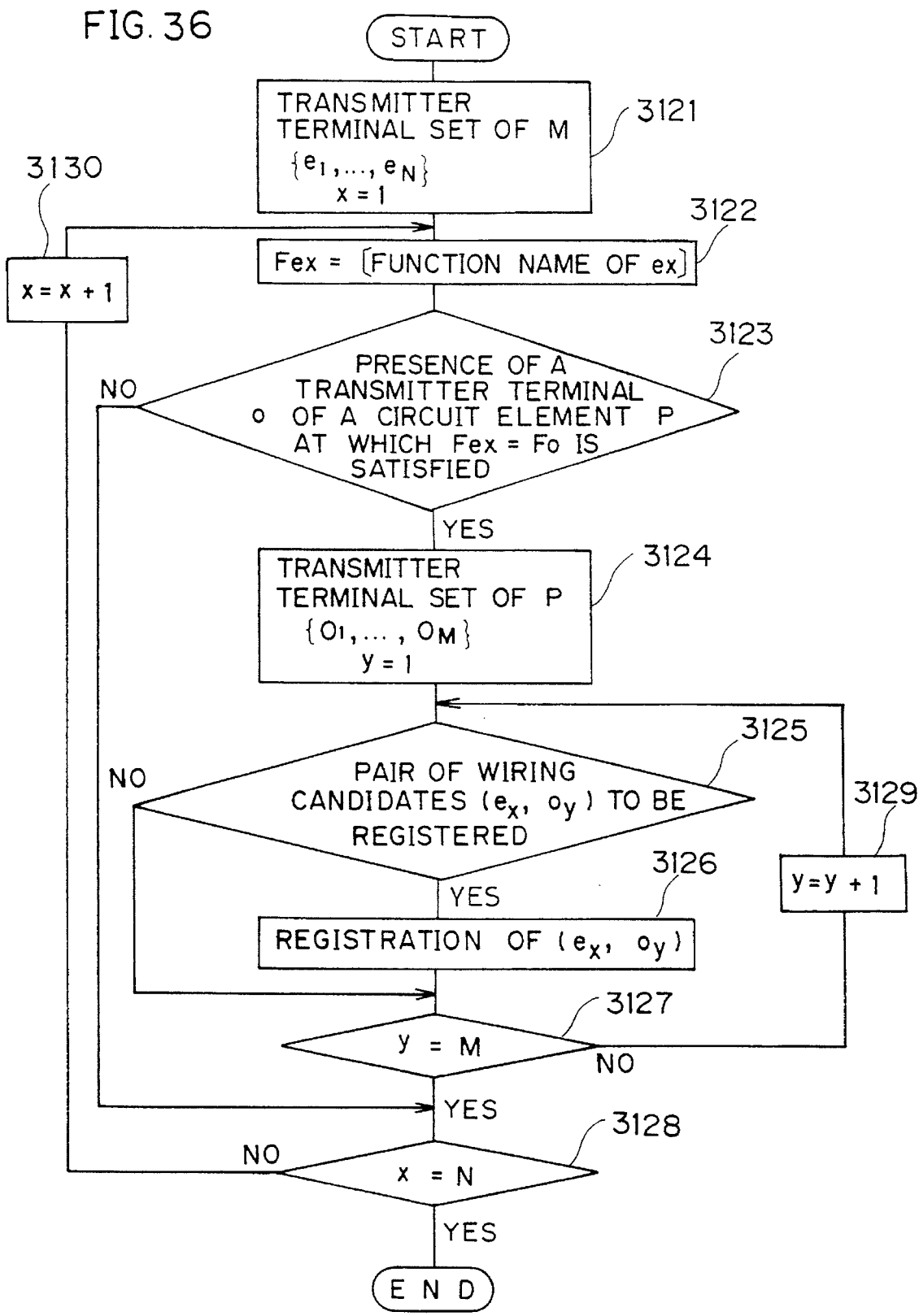
FIG. 36 is a flow chart illustrating in detail the function information comparing processing on a transmitter terminal of a circuit to be designed in FIG. 34, and a wiring information generating processing relating to the first-mentioned processing.

FIG. 36 is a flow chart illustrating in detail the function information comparing processing (step 3111) on a transmitter terminal of the circuit to be designed M in FIG. 34, and the wiring information generating processing relating thereto.

At a step 3121, the initial value 1 is set to a variable x such that there is selected, out of a transmitter-terminal set {$e_1$, ..., $e_N$} of the circuit to be designed M, a transmitter terminal $e_x$ of which function is to be compared. At a step 3122, the function name of the transmitter terminal $e_x$ is read and defined as $Fe_x$. At a step 3123, it is judged whether or not there exists, in a transmitter-terminal set of the circuit elements {P1, ..., Pn} forming the circuit to be designed M, a circuit-element transmitter terminal o in which $Fe_x$ is equal to Fo. In the affirmative, the sequence proceeds to the step 3124. Here, Fo refers to the function name of the transmitter terminal o of a circuit element P. In the negative, the sequence proceeds to a step 3128.

At a step 3124, the initial value 1 is set to a variable y such that there is selected, out of a transmitter-terminal set {$o_1$, ..., $o_M$} of the circuit element P which satisfies the condition at the step 3123, a transmitter terminal $o_y$ which is to be subjected to subsequent processings. At a step 3125, it is judged, based on (i) the external specification information of the circuit to be designed M to which $e_x$ belongs and (ii) the external specification information of the circuit element P to which $o_y$ belongs, whether or not a pair of wiring candidates ($e_x$, $o_y$) can be registered as wiring information. In the affirmative, the pair of wiring candidates ($e_x$, $o_y$) is registered as wiring information at the next step 3126, and the sequence proceeds to a step 3127. In the negative, the sequence proceeds from the step 3125 to the step 3127.

At the step 3127, it is judged whether or not it is still necessary to execute, on a transmitter terminal of a circuit element, a processing for judging whether or not a pair of wiring candidates including the transmitter terminal above-mentioned, can be registered. In the affirmative, at a step 3129, the processing at the step 3125 is executed with y replaced with (y+1). In the negative, the sequence proceeds to the next step 3128. At the step 3128, it is judged whether or not there exists a transmitter terminal of the circuit to be designed M for which the comparing processing has not been executed yet. In the affirmative, at a step 3130, the processing at the step 3122 is executed with x replaced with (x+1). In the negative, a series of operations is finished.

When there is given external specification information which indicates the connection, to the power source, of the transmitter terminal $e_x$ of the circuit to be designed M, it is judged at the step 3125 that the pair of wiring candidates ($e_x$, $o_y$) cannot be registered. In such a case, provision can be made such that the pair of wiring candidates ($e_x$, 1) is registered at the step 3126.

There is omitted a detailed description of (i) the function information comparing processing (step 3112) of a receiver terminal of the circuit to be designed M, (ii) the function information comparing processing (step 3113) of a transmitter terminal of a circuit element and (iii) the wiring information generating processing relating to the processings above-mentioned in FIG. 34, since these processings are similar to those discussed in connection with FIG. 36.

With reference to FIGS. 37 to 41, the following description will discuss a specific example of LSI design with the use of the automated design system in FIG. 25.

Figure 37:
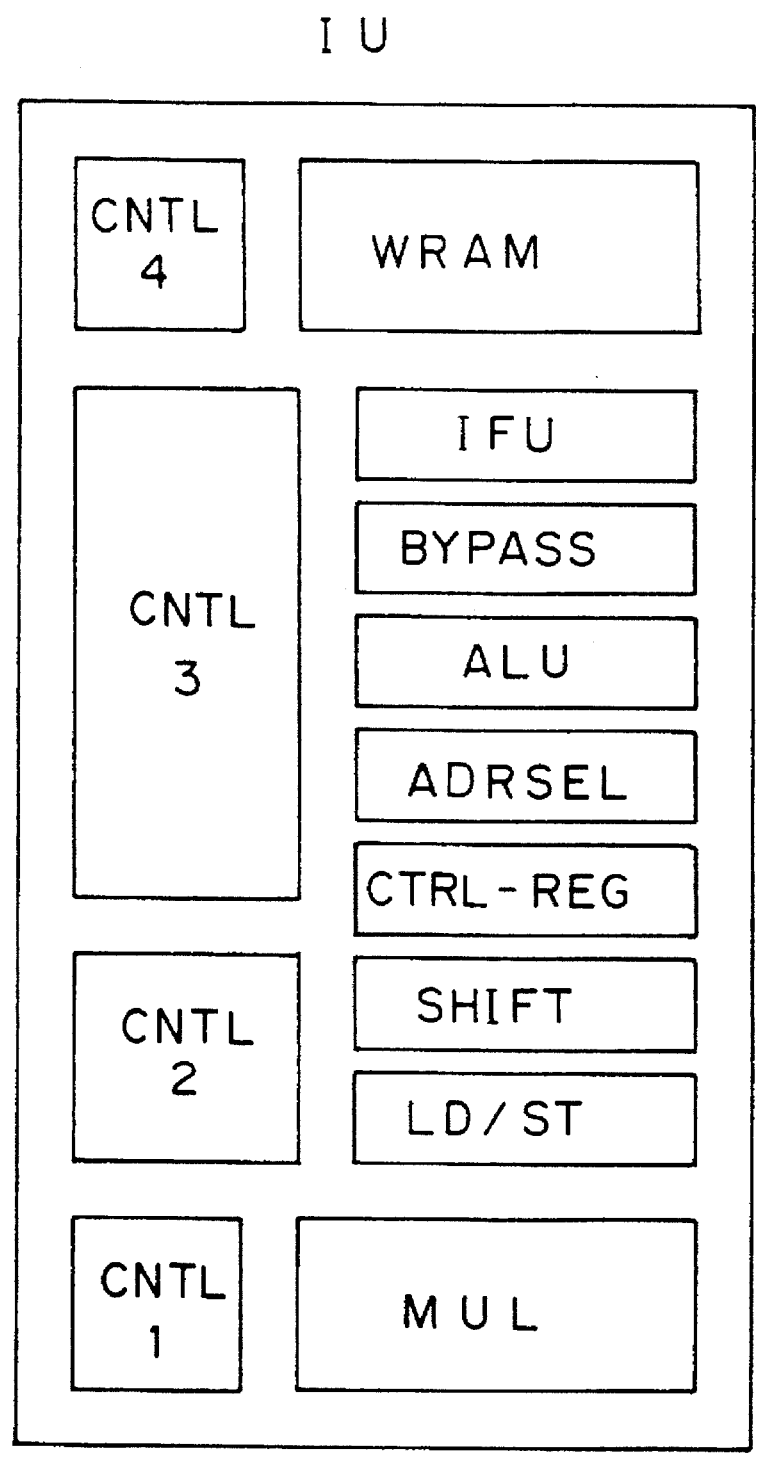
FIG. 37 is a view illustrating a specific example of the element arrangement of a circuit to be designed by the LSI automated design system in FIG. 25.

FIG. 37 shows a specific example of the element arrangement of an IU (integer unit), serving as a circuit to be designed, which is one of LSIs having sophisticated functions. This IU has a complicated structure formed by 13 circuit elements such as an arithmetic and logic unit (ALU), a multiplier (MUL), an instruction fetch unit (IFU), a working register (WRAM) and the like. By the LSI automated design system, there is to be generated wiring information for these 13 circuit elements. For simplification of the description, however, the following will discuss how to generate wiring information for three circuit elements A, B, C which form a circuit to be designed M, as shown in FIG. 38b.

Figures 38A, 38B:
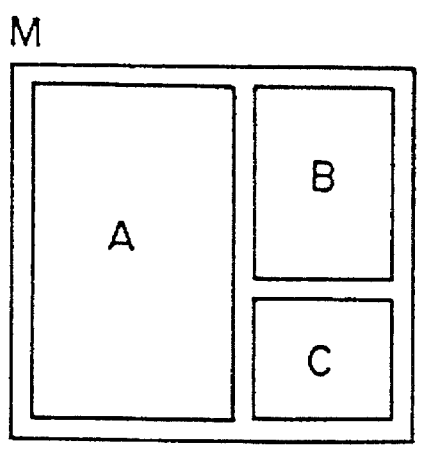

FIG. 38a shows a specific example of external specification information of the circuit to be designed M, while FIG. 39a to FIG. 39c show a specific example of the external specification information of each of the circuit elements. In these specific examples, the external specification information of the circuit to be designed M has selection information likewise the external specification information of each of the circuit elements. The external specification information is arranged in the following form as shown in FIG. 28:

(Terminal name, Function name, Role code, Non-connection terminal processing selection code, Plural terminal selection code)

The three codes are defined as shown in FIGS. 29 to 31.

Figure 41:
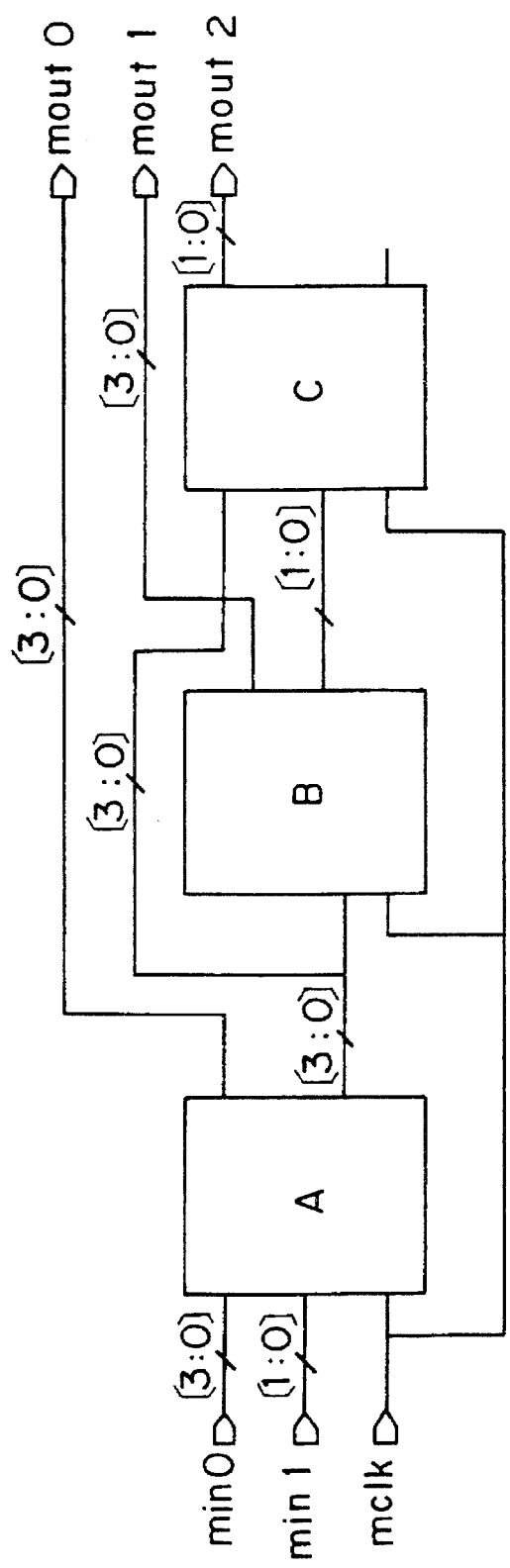
FIG. 41 is a wiring diagram representing the circuit generation result.

Based on the pieces of external specification information shown in FIG. 38a and FIG. 39a to FIG. 39c, a function information comparing processing is executed to obtain pairs of wiring candidates, thus generating wiring information, so that there are generated circuit data of a circuit which connects, to one another, the circuit elements which forms the circuit to be designed M. The result is shown in FIG. 40. The result in FIG. 40 is described in a hardware description language called Verilog-HDL. However, the result of generated circuit data may be described in other description language or a logic net list, or may be schematic data accompanied by wiring. FIG. 41 shows a wiring diagram representing the circuit generation result in FIG. 40.

According to the LSI automated design system in FIG. 25 thus discussed, merely by entering the external specification information of a circuit to be designed and the circuit arrangement thereof, there is achieved a reuse design with the use of circuit elements for which designing has been already made. It is therefore not required for the user or designer to give consideration to complicated wiring among the circuit elements. As an input interface for entering the circuit arrangement, there may be used an editor or the like by which a circuit layout (floor plan) can be displayed. Further, there may be achieved a versatile circuit library in which function information relating to input/output of each circuit element, is defined as external specification information. It is therefore possible to achieve a flexible reuse design even for a large-scale function module.

Further, according to the present design system, generated circuit data of the function level can be automatically converted into circuit data of the logic level or layout level by optimum design procedure. It is therefore possible to readily achieve a hierarchical design at the time of a reuse design, regardless of the level of individual circuit element data without consideration given to changes in design procedure dependent on a combination of circuit elements.

Figure 43:
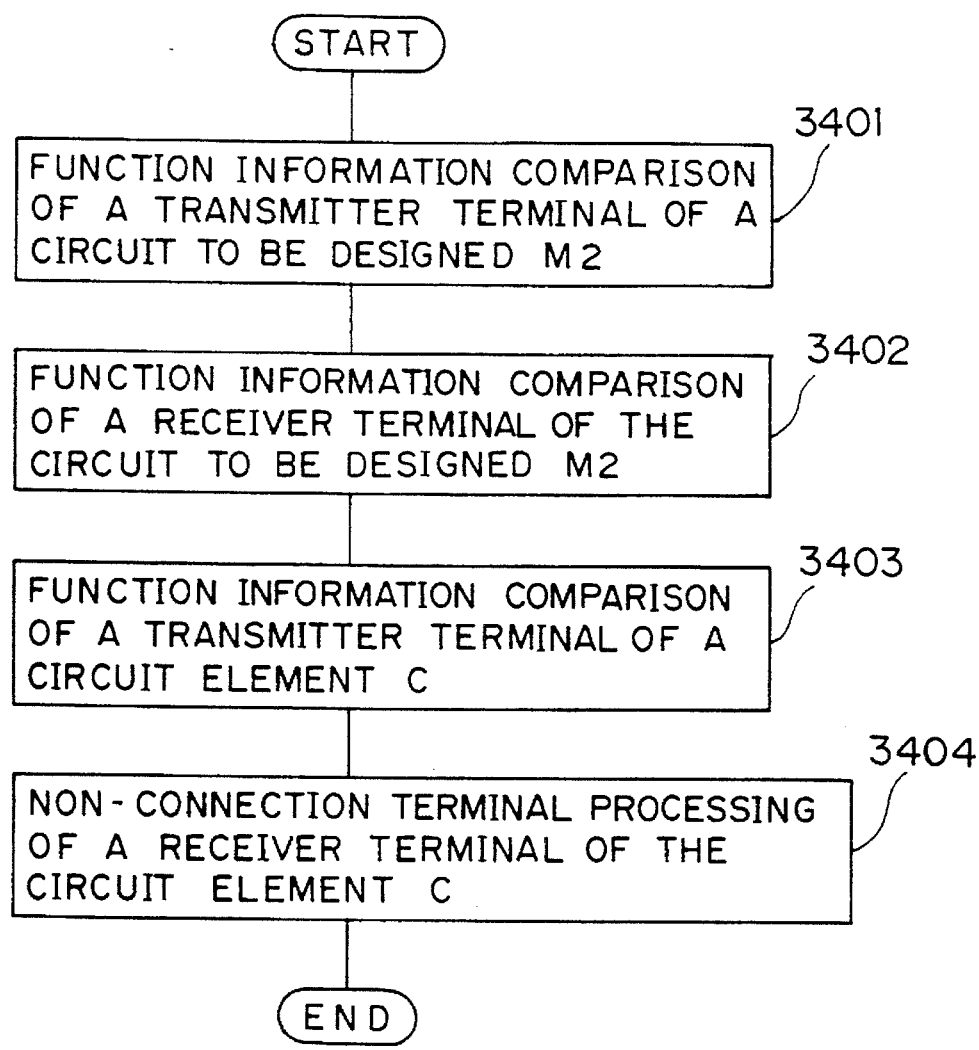
FIG. 43 is a flow chart of operations for executing the element synthesis in FIG. 42.

Further, it is possible to readily reuse circuit data generated by the present design system. FIG. 42 shows a case where, when there already exist circuit data M1 hierarchically designed with the use of two circuit elements {A, B}, there are to be generated circuit data of a circuit M2 containing a new circuit element C in addition to the circuit elements A, B. In such a case, as shown at steps 3401 to 3403 in FIG. 43, a function information comparing processing for obtaining pairs of wiring candidates, is executed firstly on a transmitter terminal of the circuit to be designed M2, secondly on a receiver terminal of the circuit to be designed M2 and thirdly on a transmitter terminal of the additional circuit element C. Thereafter, there are executed processings including a processing on a non-connection receiver terminal of the additional circuit element C, as shown at a step 3404.

Figure 44:
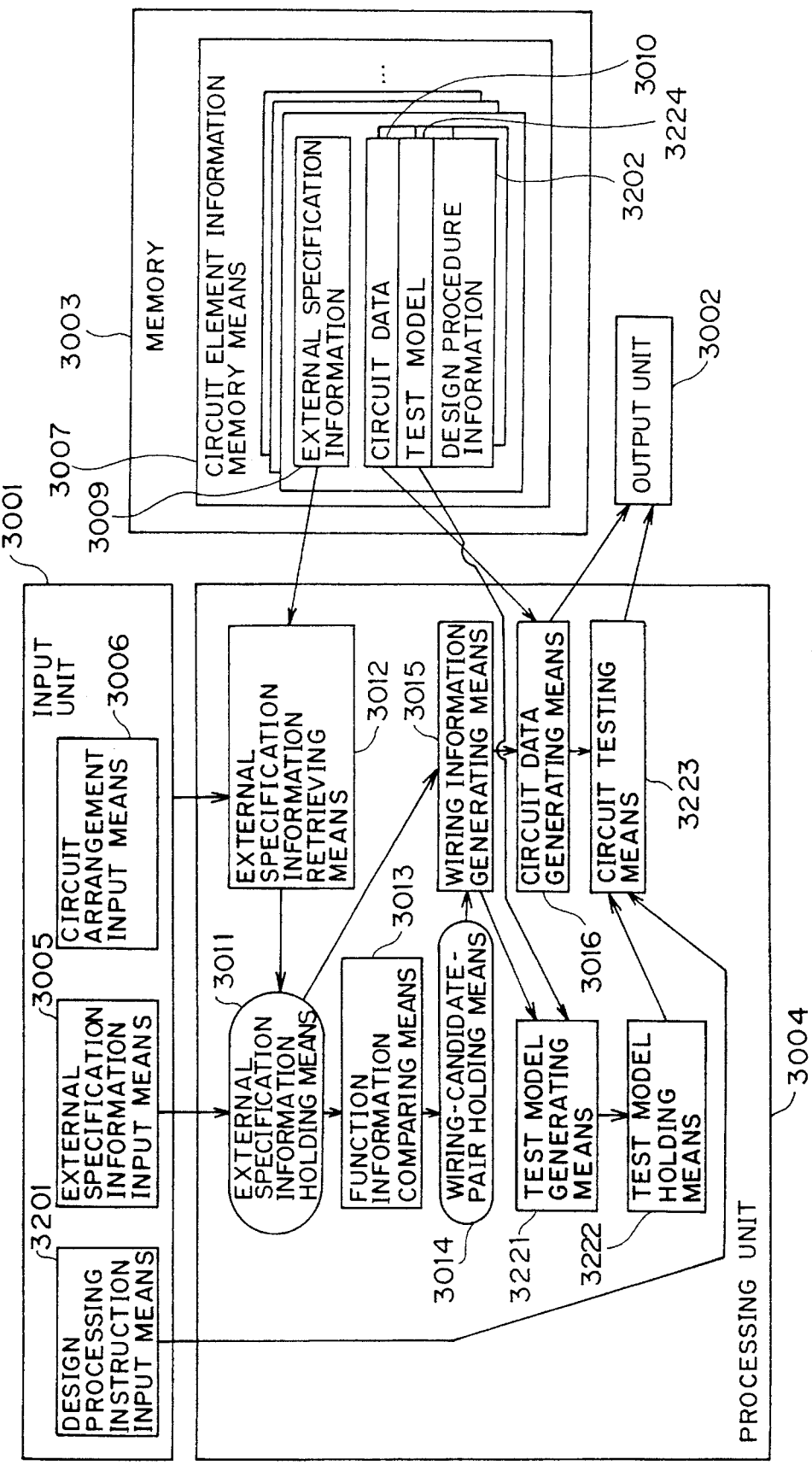
FIG. 44 is a view of the arrangement of an LSI automated design system according to still another embodiment of the present invention.

FIG. 44 is a view of the arrangement of an LSI automated design system according to still another embodiment of the present invention. This embodiment is arranged such that circuit data of a circuit to be designed which have been generated by the circuit data generating means 3016 in FIG. 25, are so entered as to be subjected to a circuit testing (verifying) processing.

In FIG. 44, circuit element information memory means 3007 of a memory 3003 contains test models 3224 for circuit elements. A processing unit 3004 contains test model generating means 3221, test model holding means 3222, and circuit testing (verifying) means 3223. Except for the foregoing, the arrangement in FIG. 44 is similar to that in FIG. 25.

Figures 45A, 45B:
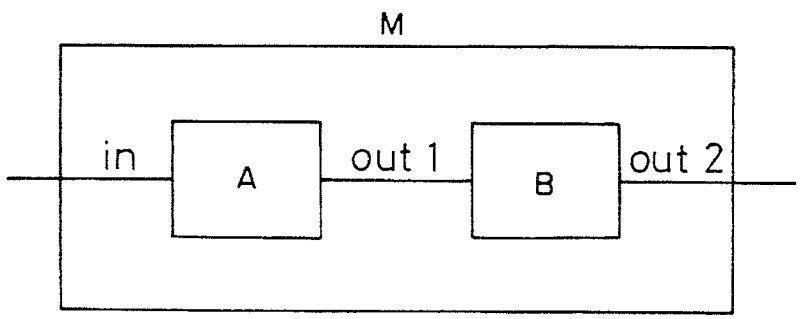

The test model generating means 3221 generates a test model for a circuit to be designed, with the use of test models for the component elements. The test model thus generated is stored in the test model holding means 3222. With the use of the test model for the circuit to be designed as stored in the test model holding means 3222, the circuit testing (verifying) means 3223 executes, according to design procedure information 3202, a circuit testing (verifying) processing on the circuit data of the circuit to be designed. FIG. 45a and FIG. 45b show specific examples of a circuit test.

The design-procedure determining rule memory means 3211 in FIG. 25 may be introduced in the memory 3003 in FIG. 44. In such a case, for example when a plurality of test precision data have been set as design procedure information about circuit testing (verifying) procedure for the circuit elements forming the circuit to be designed, there are adopted, as design-procedure determining rules 3212, rules including a rule of applying, out of the plurality of test precision data above-mentioned, the lowest precision data to a test of the circuit to be designed.

We claim:

1. An LSI automated design system comprising:
   an external specification information input means for entering external specification information of a circuit to be designed, said information including function information of each of the terminals of said circuit to be designed;
   a circuit arrangement input means for entering the element arrangement of said circuit to be designed;
   a circuit element information memory means for collectively managing and containing (i) external specification information of each of a plurality of circuit elements and (ii) circuit data of said plurality of circuit elements, said external specification information of said plurality of circuit elements including (a) function information of each of the terminals of said circuit elements and (b) selection information representing a wiring condition for each of said terminals, said external specification information and circuit data of said circuit element information memory means constituting previously designed circuit layouts that can be reused to create said circuit to be designed;
   an external specification information retrieving means for retrieving, according to said entered element arrangement, the external specification information of each circuit element required for said circuit design from said circuit element information memory means;
   an external specification information holding means for storing said entered external specification information from said external specification information input means and said external specification information of said circuit elements from said external specification information retrieving means;
   a wiring information generating means for generating, according to said selection information of said circuit elements from said external specification information holding means, internal wiring information for each of the circuit elements of said circuit to be designed based on a comparison of said function information of said entered external specification information of said circuit to be designed and said function information of said retrieved external specification information of each of said required circuit elements; and
   a circuit data generating means for generating circuit data of said circuit to be designed based on (i) the circuit data of said required circuit elements stored in said circuit element information memory means together with said retrieved external specification information of said required circuit elements and (ii) said pieces of generated wiring information.

2. An LSI automated design system according to claim 1, further comprising circuit data converting means for converting, using design procedure information stored in the circuit element information memory means for each of the circuit elements, the circuit data of the circuit to be designed as generated by the circuit data generating means, into circuit data of a level closer to the mounting level.

3. An LSI automated design system according to claim 2, further comprising:

a design-procedure determining rule memory means for storing design-procedure determining rules; and a design-procedure selecting and determining means for selecting the design procedure information of the circuit elements forming the circuit to be designed and for determining, based on said design procedure information thus selected, design procedure for a circuit which connects said circuit elements of said circuit to be designed, with the use of said design-procedure determining rules.

4. An LSI automated design system according to claim 1, further comprising;

a test model generating means for generating, with the use of test models for the circuit elements which are stored in the circuit element information memory means, a test model for the circuit data of the circuit to be designed which have been generated by the circuit data generating means; and a circuit testing (verifying) means for conducting, according to said test model generated by said test model generating means, a test on said generated circuit data of said circuit to be designed.

5. A circuit designing method for an LSI automated design system comprising the steps of:

entering external specification information of a circuit to be designed, said information including function information of each of the terminals of said circuit to be designed;

entering the element arrangement of said circuit to be designed;

retrieving, according to said entered element arrangement, the external specification information of each circuit element required for said circuit design from external specification information stored for a plurality of circuit elements, said external specification information stored for a plurality of circuit elements including (i) function information of each of the terminals of said plurality of circuit elements and (ii) selection information representing a wiring condition for each of said terminals, said stored external specification information and circuit data of said plurality circuit elements constituting previously designed circuit layouts that can be reused to create said circuit to be designed;

storing said entered external specification information from said external specification information input means and said external specification information of said circuit elements from said external specification information retrieving means;

generating, according to said selection information of said circuit elements, internal wiring information for each of the circuit elements of said circuit to be designed based on a comparison of said function information of said entered external specification information of said circuit to be designed and said function information of said retrieved external specification information of each of said required circuit elements; and generating circuit data of said circuit to be designed based on (i) the circuit data of said required circuit elements stored in a memory means together with said retrieved external specification information of said required circuit elements and (ii) said pieces of generated wiring information.

6. A circuit designing method according to claim 5, wherein the step of entering the element arrangement includes a step of entering an element arrangement including one circuit-element set formed by a combination of a plurality of circuit elements.

7. A circuit designing method according to claim 5, wherein the step of generating wiring information comprises:

a first step of selecting and determining (i) a matching terminal to which an output terminal of the circuit to be designed is to be connected out of output terminals of the circuit elements, and (ii) a matching terminal to which an input terminal of said circuit to be designed is to be connected out of input terminals of said circuit elements;

a second step of selecting and determining, after said first step, a matching terminal to which each of the remaining output terminals of said circuit elements is to be connected; and a third step of processing, after said second step, each of the remaining terminals of said circuit elements.

8. A circuit designing method according to claim 5, wherein the wiring information generating step has a step of selecting one of the following three processing methods when the circuit to be designed contains a non-connection terminal to which no matching terminal has been connected:

generating wiring information such that said non-connection terminal is left as non-connected, generating wiring information such that said non-connection terminal is unconditionally connected to the power source, and generating wiring information such that said non-connection terminal is unconditionally grounded, said selection being made according to non-connection terminal processing selection information which is set for each terminal and which is included in the selection information of the external specification information of each of the circuit elements.

9. A circuit designing method according to claim 5, wherein the wiring information generating step has a step of selecting one of the following three processing methods when the function information of an input terminal of one circuit element is identical to the function information of each of output terminals of a plurality of circuit elements:

generating wiring information such that said input terminal of said one circuit element is connected to all of said output terminals of said plurality of circuit elements, generating wiring information such that said input terminal of said one circuit element is connected to one of said output terminals of said plurality of circuit elements, and generating wiring information such that said input terminal is left as not-connected, said selection being made according to plural terminal selection information which is set for each input terminal and which is included in the selection information of the external specification information of each of the circuit elements.

* * * * *